(12) United States Patent
Kikuta

(10) Patent No.: US 6,377,416 B1
(45) Date of Patent: Apr. 23, 2002

(54) A/D WITH DIGITAL PLL

(75) Inventor: Kazuyoshi Kikuta, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/192,497

(22) Filed: Nov. 17, 1998

Related U.S. Application Data

(62) Division of application No. 08/691,411, filed on Aug. 2, 1996, now Pat. No. 5,870,591.

(30) Foreign Application Priority Data

Aug. 21, 1995 (JP) .............................................. 7-212206
Nov. 8, 1995 (JP) .............................................. 7-206223

(51) Int. Cl.$^7$ .............................................. G11B 5/596
(52) U.S. Cl. .................................. 360/77.02; 360/77.05
(58) Field of Search ........................... 360/77.02, 77.05, 360/18, 27, 46; 327/337, 551, 552, 558

(56) References Cited

U.S. PATENT DOCUMENTS

| | | | |
|---|---|---|---|
| 5,572,163 A | * 11/1996 | Kimura et al. ............... | 327/553 |
| 5,572,558 A | 11/1996 | Beherns | |
| 5,586,101 A | * 12/1996 | Gage et al. .................. | 369/124 |
| 5,625,632 A | 4/1997 | Ishida, et al. | |
| 5,642,244 A | * 6/1997 | Okada et al. .................. | 360/61 |
| 5,648,738 A | * 7/1997 | Welland et al. .............. | 327/307 |
| 5,668,678 A | 9/1997 | Reed, et al. | |
| 5,754,354 A | * 5/1998 | Tomita et al. ................. | 360/61 |
| 5,825,577 A | * 10/1998 | Miyatake et al. ............. | 360/75 |

* cited by examiner

*Primary Examiner*—Dennis M. Butler
(74) *Attorney, Agent, or Firm*—Staas & Halsey LLP

(57) ABSTRACT

A digital arithmetic operation circuit includes a plurality of arithmetic operation blocks, a control signal generator and a selector. The plurality of arithmetic operation blocks receive a plurality of digital input signals and perform different arithmetic operations on the received digital input signals, in parallel, to output operation result signals. The a control signal generator receives a plurality of digital input signals and generates a control signal based on the digital input signals. The selector selects one of the operation result signals, in response to the control signal, to output the selected operation result signal. After the control signal generator supplies the control signal to the selector, the selector outputs the selected operation result signal as soon as the selected operation result signal is supplied to the selector.

11 Claims, 37 Drawing Sheets

A/D WITH DIGITAL PLL

This application is a divisional of application Ser. No. 08/691,411, filed Aug. 2, 1996, now U.S. Pat. No. 5,870,591.

BACKGROUND OF THE INVENTION

1. Field of the Invention

The present invention relates generally to a semiconductor integrated circuit device and, more particularly, to a semiconductor integrated circuit device having a signal processor which processes signals read from a recording medium such as a magnetic disk. The signal processor includes a user data processing circuit having an A/D converter and a maximum likelihood decoder, and a servo data processing circuit which has an integrating circuit.

2. Description of the Related Art

There is a demand for a faster reading/writing speed for semiconductor integrated circuit devices, which process a digital signal associated with data read from a magnetic disk. Therefore, it is necessary to improve the operation speeds of a user data processing circuit and a servo data processing circuit which are used in such semiconductor integrated circuit devices.

A system for processing signals from a magnetic disk or other communication system decodes reception signals, using a maximum likelihood decoder, which performs maximum likelihood decoding, as one type of decoding means. In a communication system which transfers information in the form of a finite signal series, there are a plurality of transmission signal series which have probably been transmitted in association with one reception signal series. According to the maximum likelihood decoding, the reception side determines a transmission signal which is considered most appropriate based on some evaluation standards. A reception signal is associated with a transmission signal series in accordance with the decoding rules.

When a transmission signal which is not specified by the decoding rules is sent, a decoding error occurs. Given that Yi represents a reception signal series and X(Yi) represents a corresponding transmission signal series. When a transmission signal series X(Yi) has actually been transmitted and is received as a reception signal series Yi, no decoding error occurs. Given that the probability that such a event occurs is P(X(Yi), Yi), the probability $P_E$ that a decoding error occurs is expressed by the following equation:

$$P_E = \sum_i P\{X(Yi), Yi\} = 1 - \sum_i \{X(Yi)\}P\{Yi \mid X(Yi)\}$$

Assuming that the probabilities of occurrence of transmission signal series are all the same, P(X(Yi)) becomes constant in any decoding rule. The minimum probability $P_E$ is therefore acquired by selecting X(Yi) which maximizes P(YiX(Yi)) with respect to Yi as a transmission signal series. Maximum likelihood decoding is carried out in this manner. A maximum likelihood decoder which executes this maximum likelihood decoding includes a plurality of metric arithmetic operation circuits. Each metric arithmetic operation circuit performs an operation on a transmission signal series X(Yi) and, based on the arithmetic operation result, selects transmission data corresponding to the transmission signal series X(Yi) from expected values of the transmission data written in a pass memory.

FIG. 1 is a block diagram showing a conventional maximum likelihood decoder. The maximum likelihood decoder has first to fourth metric arithmetic operation circuits 1a to 1d each having two inputs to respectively receive two digital signals A1 and A2, B1 and B2, C1 and C2, or D1 and D2. The first to fourth metric arithmetic operation circuits 1a–1d perform addition or subtraction of the digital signal pairs A1 and A2 to D1 and D2, and output first to fourth operation result values respectively. The maximum likelihood decoder further has a selector 2 and a fifth arithmetic operation circuit 1e. The selector 2 receives a first control signal CL1 indicative of the value of the most significant bit (MSB) of the second operation result value, and a second control signal CL2 indicative of the value of the MSB of the third operation result value. The selector 2 further selects one of the second to fourth operation result values in accordance with the first and second control signals CL1 and CL2 and outputs the selected operation result value to the fifth arithmetic operation circuit 1e. The fifth arithmetic operation circuit 1e has two inputs to respectively receive the first operation result value and one of the second to fourth operation result values. The fifth arithmetic operation circuit 1e performs addition or subtraction of the first operation result value and the operation result value selected by the selector 2, and outputs a fifth operation result value.

However, it is difficult to improve the operation speed of a maximum likelihood decoder equipped with the above-described metric arithmetic operation circuits, for the following reason. The processing from the input of the digital signal pairs A1 and A2 through D1 and D2, to the output of the operation result value from the fifth arithmetic operation circuit 1e, requires the arithmetic operation time and the selector operation time in two stages. After the first and second control signals CL1 and CL2 are produced based on the second and third operation result values, the selector 2 selects one of the second to fourth operation result values according to those control signals CL1 and CL2. The fifth arithmetic operation circuit 1e then performs an operation on the first operation result value and one of the second to fourth operation result values.

If the operation speed of either the second or third arithmetic operation circuit 1b or 1c is slow, the time from the generation of the first and second control signals CL1 and CL2 to the supply thereof to the selector 2 is greater. This delays the selector operation and the arithmetic operation of the fifth arithmetic operation circuit 1e. Consequently, the operation speed of a maximum likelihood decoder having multistage metric arithmetic operation circuits becomes slower. This reduced operation speed affects the operation speed of the overall signal processing system which reads data from a magnetic disk and makes it difficult to improve the recording density of magnetic disks.

An operation test is conducted to check the product reliability of semiconductor integrated circuit devices, including maximum likelihood decoders such as that described above. The operation test for the maximum likelihood decoder supplies a serial signal from a testing device to a digital filter located at the preceding stage of the maximum likelihood decoder from a testing device. The maximum likelihood decoder receives the serial signal from the digital filter and decodes it. The testing device compares the decoded data with the serial signal to determine if the maximum likelihood decoder is operating properly.

In executing the operation test on a fast maximum likelihood decoder, the testing device should supply the serial signal at a high speed. That is, the testing device should also operate at a high speed. However, it is difficult to easily improve the operation speed of the testing device. In the operation test, generally, the internal circuit of a semiconductor integrated circuit device (LSI) operates in accordance with a scan clock signal supplied from the testing device, not a system clock signal. To date, however, the operation test of an LSI which operates in response to a system clock signal having a high frequency, cannot be conducted using a scan clock signal having a lower frequency than the system clock signal. In particular, for a fast LSI equipped with digital and analog circuits, as the ratio of the analog circuits to the digital circuits increases, a sufficient operation test cannot be accomplished with the slow testing device.

A signal processor which processes a read signal read from a magnetic disk includes a user data signal processing circuit, including the aforementioned maximum likelihood decoder, and a servo signal processing circuit. The user data signal processing circuit converts an analog signal, associated with user data included in the read signal, to a digital signal, and then performs a decoding operation on the digital signal and outputs data information to a disk controller. The disk controller extracts user data from the received data information. The servo signal processing circuit processes a servo signal associated with servo control and included in the read signal, and outputs servo information to the disk controller. Based on this servo information, the disk controller controls the drive head to position the head on the target track.

The servo signal processing circuit and user data signal processing circuit share an auto gain control amplifier (AGC) and a filter. The servo signal has a low frequency characteristic and the signal associated with user data has a high frequency characteristic. In this respect, the AGC has both low and high frequency characteristics and the ability to switch between the two. The filter has switchable first and second frequencies, the first one for cutting off a frequency higher than that of the servo signal and the second one for cutting off a frequency higher than that of the signal associated with user data. Under the servo operation, the frequency characteristic of the AGC is switched to the low frequency characteristic and the cutoff frequency of the filter is switched to the first frequency. In a read mode, the frequency characteristic of the AGC is switched to the high frequency characteristic and the cutoff frequency of the filter is switched to the second frequency. The switching of the frequency characteristic of the AGC and the switching of the cutoff frequency of the filter are executed in response to a control signal from the disk controller. However, it takes time to perform switching operation of the AGC and filter, which hinders an improvement to the signal processing speed of the hard disk drive system.

The user data signal processing circuit further includes an A/D converter, which is connected to the filter and converts a read signal that is treated as an analog signal to a digital signal having a plurality of bits. It is desirable that the A/D converter have a characteristic such that the value of the input analog signal and the value of the digital signal are positively proportional to each other. Due to a productional variation, however, some of manufactured A/D converters may have an offset voltage so that a digital value and an analog value are not positively proportional to each other. Using such an A/D converter having an offset voltage, it is difficult to perform highly accurate processing of a read signal supplied from the drive head. Therefore, the offset voltage is canceled either at the time of factory shipment of semiconductor integrated circuit devices, each of which include a signal processing circuit having an A/D converter, or at the time such signal processing circuit is operated. For instance, the offset of an A/D converter may be canceled immediately after the disk drive is powered on.

The long usage of a disk drive increases the temperature of the peripheral circuits of the A/D converter, thus resulting in a variation in the input/output characteristic of the A/D converter. The ratio of the change increases as the ambient temperature increases. This variation undesirably produces an offset voltage again, even though the offset canceling process has been performed once. Moreover, an A/D converter which is designed to output a digital signal having multi-bits (e.g., 6 bits) has a relatively large circuit area. This inevitably increases the circuit area of the associated semiconductor integrated circuit device and hinders improvements on the operation speed and conversion precision of the A/D converter.

SUMMARY OF THE INVENTION

Broadly speaking, the present invention relates to a semiconductor integrated circuit device which operates at a high speed.

The invention also relates to a semiconductor integrated circuit device which allows a fast operation test to be performed although a test clock signal has a relatively low frequency.

In addition, the invention relates to a signal processor which processes data signals at a high speed.

The invention further relates to a signal processor capable of canceling an offset voltage of an A/D converter under any circumstances.

The invention also relates to a semiconductor integrated circuit device which prevents a circuit area from increasing and ensures a faster operation speed.

A first embodiment of the invention pertains to a digital arithmetic operation circuit including a plurality of arithmetic operation blocks for receiving a plurality of digital input signals and for performing different arithmetic operations on the received digital input signals, in parallel, to output operation result signals, a control signal generator for receiving a plurality of digital input signals and for generating a control signal based on the digital input signals, and a selector, connected to the plurality of arithmetic operation blocks and the control signal generator, for selecting one of the operation result signals, in response to the control signal, to output the selected operation result signal. After the control signal generator supplies the control signal to the selector, the selector outputs the selected operation result signal as soon as the selected operation result signal is supplied to the selector.

The first embodiment of the invention also pertains to a maximum likelihood decoder including a plurality of arithmetic operation blocks for receiving a plurality of digital input signals and for performing maximum likelihood decoding operations on the received digital input signals, in parallel according to a carry save system, to output decoded signals, a control signal generator for receiving a plurality of digital input signals and for performing an arithmetic operation on the received digital input signals according to a carry look ahead system, to generate a control signal indicative of a most significant bit of an operation result, and a selector, connected to the plurality of arithmetic operation blocks and the control signal generator, for selecting one of the decoded signals in response to the control signal, to output the selected decoded signal.

The first embodiment of the invention further pertains to a semiconductor integrated circuit including an analog equalizer filter for receiving an analog signal and for adjusting a level of the analog signal to output an equalized filtered analog signal, an A/D converter, connected to the analog equalizer filter, for converting the equalized filtered analog signal to a digital signal, a digital filter, connected to the A/D converter, for receiving the digital signal and for removing an unnecessary digital components from the digital signal to output a filtered digital signal, a maximum likelihood decoder, connected to the digital filter, for receiving the filtered digital signal and for performing a maximum likelihood decoding operation on the received filtered digital signal to generate a serial decoded signal, a serial-parallel converter, connected to the maximum likelihood decoder, for converting the serial decoded signal to a parallel decoded signal, and a channel characteristic generator, operatively connected to the maximum likelihood decoder in a test mode, for receiving a test signal supplied from an external testing device and for generating a test version of the filtered digital signal from the test signal, wherein in the test mode, the maximum likelihood decoder receives the test filtered digital signal and performs maximum likelihood decoding thereon.

A second embodiment of the invention pertains to a semiconductor integrated circuit device including an input data holding circuit for temporarily holding an input data signal and for outputting the held input data signal in accordance with a system clock signal, an internal circuit block, connected to the input data holding circuit, for receiving the input data signal and for performing a predetermined data processing operation to output an output data signal in accordance with the system clock signal, an output data holding circuit, connected to the internal circuit block, for temporarily holding the output data signal and for outputting the held output data signal in accordance with the system clock signal, and an external interface circuit connected to the internal circuit block, the input data holding circuit and the output data holding circuit and responsive to a scan clock signal, for generating a test clock signal having a frequency higher than that of the scan clock signal and equal to or higher than that of the system clock signal. The input data holding circuit and the output data holding circuit are operable in accordance with the scan clock signal having a frequency lower than the system clock signal. The external interface circuit supplies the scan clock signal and a test data signal to the input data holding circuit in such a way that the test data signal, as the input data signal, is temporarily held and is output in accordance with the scan clock signal, supplies the test clock signal to the internal circuit block in such a way that the rest data signal is processed in accordance with the test clock signal, and supplies the scan clock signal to the output data holding circuit in such a way that a test result signal, as an output data signal, is temporarily held and is output in accordance with the scan clock signal.

A third embodiment of the invention pertains to a signal processor suitable for processing a user data signal, associated with data information read from a recording medium, and a servo data signal associated with servo information read from the recording medium. The signal processor includes a user data signal processing circuit for processing the user data signal and a servo data signal processing circuit for processing the servo data signal. The user data signal processing circuit includes a first amplifier for amplifying the user data signal to produce an amplified user data signal, and a first filter, connected to the first amplifier, for cutting off an unnecessary frequency component included in the amplified user data signal to produce a filtered amplified user data signal. The servo data signal processing circuit includes a second amplifier for amplifying the servo data signal to produce an amplified servo data signal, and a second filter, connected to the second amplifier, for cutting off an unnecessary frequency component included in the amplified servo data signal to produce a filtered amplified servo data signal.

The third embodiment of the invention also pertains to an integrating circuit for acquiring plural pieces of position data in order to obtain relative positions between tracks to which servo areas provided on a recording medium belong and a drive head moving over the recording medium, each servo area including a plurality of position areas where the position data are respectively recorded. The integrating circuit includes a rectifier for rectifying position data signals read from the position areas to produce rectified position data signals, a voltage-current converter, connected to the rectifier, for producing charge currents having current values proportional to voltage levels of the respective rectified position data signals, a main capacitor, connected to the voltage-current converter, for performing charging with the charge currents, a main charge switch connected between the voltage-current converter and the main capacitor, and operable in such a way as to permit each of the charge currents to be supplied to the main capacitor when each charge current is generated, a main discharge switch, connected to the main capacitor, for permitting charges, stored in the main capacitor, to be discharged after the main capacitor has performed a charging operation, a plurality of detection capacitors, connected to the voltage-current converter, for performing charging with charge voltages respectively associated with the position areas, in cooperation with the main capacitor, the charge voltages of the detection capacitors respectively indicating the plural pieces of position data, a plurality of subcharge switches respectively connected between the voltage-current converter and the detection capacitors and operable in such a way as to permit supply of the associated charge currents to the main capacitor when the charge currents are produced, and a plurality of subdischarge switches, respectively connected to the plurality of subcharge switches, for permitting charges stored in the detection capacitors to be discharged after execution of charging operations of the associated detection capacitors.

A fourth embodiment of the invention pertains to a circuit suitable for canceling an offset voltage of an A/D converter that converts an analog signal to a digital signal. The circuit includes a comparator for receiving the digital signal and for comparing a digital value of the digital signal with a predetermined offset allowance value to output a comparison result, an arithmetic operation unit, connected to the comparator, for accumulating a predetermined offset change amount and outputting an addition result based on the comparison result when the digital value differs from the predetermined offset allowance values, wherein the addition result is initially determined by adding the predetermined offset change amount and a predetermined initial value, and an offset voltage generator, connected to the arithmetic operation unit, for generating an offset cancel voltage in order to cancel the offset voltage in accordance with the addition result and for supplying the offset cancel voltage to the A/D converter.

The fourth embodiment of the invention also pertains to a circuit suitable for canceling an offset voltage of an A/D converter, the A/D converter samples an analog data signal including an analog sinusoidal signal in order to convert the analog data signal to a digital signal. The circuit includes a sampling control circuit for controlling the A/D converter in such a manner that first and third sampling intervals and second and fourth sampling intervals for the analog sinusoidal signal become 180 degrees when the analog sinusoidal signal is supplied to the A/D converter, whereby digital signals having first through fourth digital values are output from the A/D converter in a sampling order, an arithmetic operation unit for receiving one of a set of the first and third digital values and a set of the second and fourth digital values, and for computing an average value thereof to output the obtained average value as an offset voltage value for the A/D converter, and an offset voltage generator for receiving the offset voltage value, for generating an offset cancel voltage to cancel the offset voltage, and for supplying the offset cancel voltage to the A/D converter.

A fifth embodiment of the invention pertains to a semiconductor integrated circuit device including an analog filter for removing an unnecessary frequency component included in an analog signal to produce a filtered analog signal, and an A/D converter, connected to the analog filter, for performing over-sampling of the filtered analog signal according to a first frequency signal to convert the filtered analog signal to a digital signal.

The device of the fifth embodiment may include a first digital filter, connected to the A/D converter, for removing an unnecessary frequency component included in the digital signal in accordance with the first frequency signal to produce a first filtered digital signal, and a digital phase locked loop, connected to the A/D converter and the first digital filter, for generating the first frequency signal and for supplying the first frequency signal to the A/D converter and the first digital filter.

The device of the fifth embodiment may further include a first register, connected to the first digital filter and the digital phase locked loop, for intermittently sampling the first filtered digital signal in accordance with a second frequency signal to produce a first thinned digital signal. The digital phase locked loop may include a voltage controlled oscillator for generating the first frequency signal in response to a voltage signal, and a frequency divider for frequency-dividing the first frequency signal to produce the second frequency signal.

The device of the fifth embodiment may also include a second digital filter, connected to the first sampling register and the digital phase locked loop, for removing an unnecessary frequency component included in the first thinned digital signal in accordance with the second frequency signal to produce a second filtered digital signal.

The device of the fifth embodiment may further include a second register, connected to the second digital filter and the digital phase locked loop, for intermittently sampling the second filtered digital signal in accordance with a third frequency signal to produce a second thinned digital signal. The digital phase locked loop may further include a second frequency divider, connected to the first frequency divider, for frequency-dividing the second frequency signal to produce the third frequency signal.

Other aspects and advantages of the invention will become apparent from the following description, taken in conjunction with the accompanying drawings, illustrating the principles of the invention by way of example.

BRIEF DESCRIPTION OF THE DRAWINGS

The invention, together with objects and advantages thereof, may best be understood by reference to the following description of the presently preferred embodiments together with the accompanying drawings.

DETAILED DESCRIPTION OF THE PREFERRED EMBODIMENTS

First Embodiment

Figure 1:
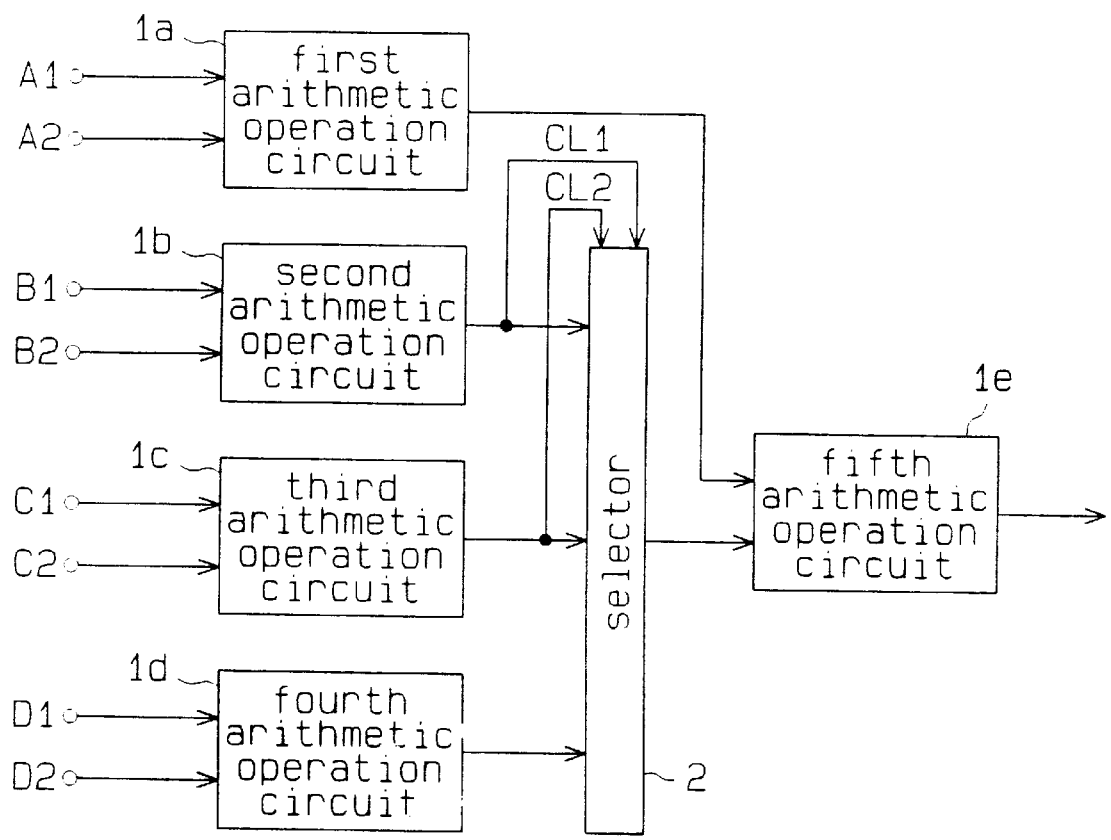
FIG. 1 is a block diagram showing a conventional maximum likelihood decoder.
Figure 2:
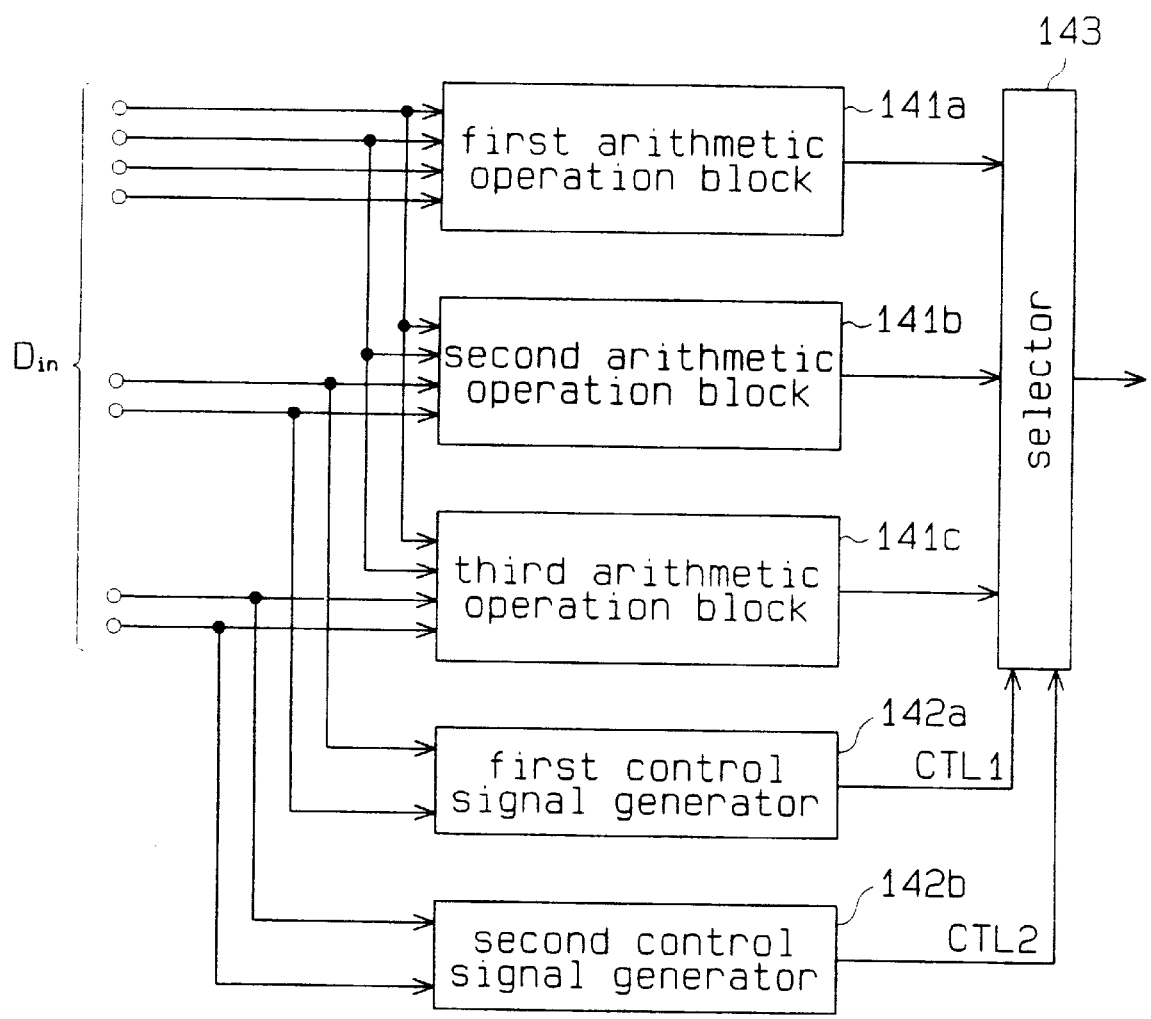
FIG. 2 is a block diagram showing a digital arithmetic operation circuit according to the first embodiment of the present invention.

FIG. 2 illustrates a multi-input digital arithmetic operation circuit according to the present invention. The digital arithmetic operation circuit has first through third arithmetic operation blocks 141a through 141c, first and second control signal generators 142a and 142b, and a selector 143. The first through third arithmetic operation blocks 141a–141c receive a digital input signal Din and perform different arithmetic operations from one another, to supply operation results to the selector 143. In response to the digital input signal Din, the first and second control signal generators 142a and 142b respectively produce first and second control signals CTL1 and CTL2 and supply the signals to the selector 143. The selector 143 selects one of the operation results from the first through third arithmetic operation blocks 141a–141c in accordance with the first and second control signals CTL1 and CTL2, and outputs the selected operation result. In this manner, an operation on the digital input signal Din and the generation of the first and second control signals CTL1 and CTL2 are executed in parallel. This parallel operation permits the selector 143 to selectively supply one of the operation results from the first to third arithmetic operation blocks 141a–141c immediately upon reception of the operation results.

Figure 3:
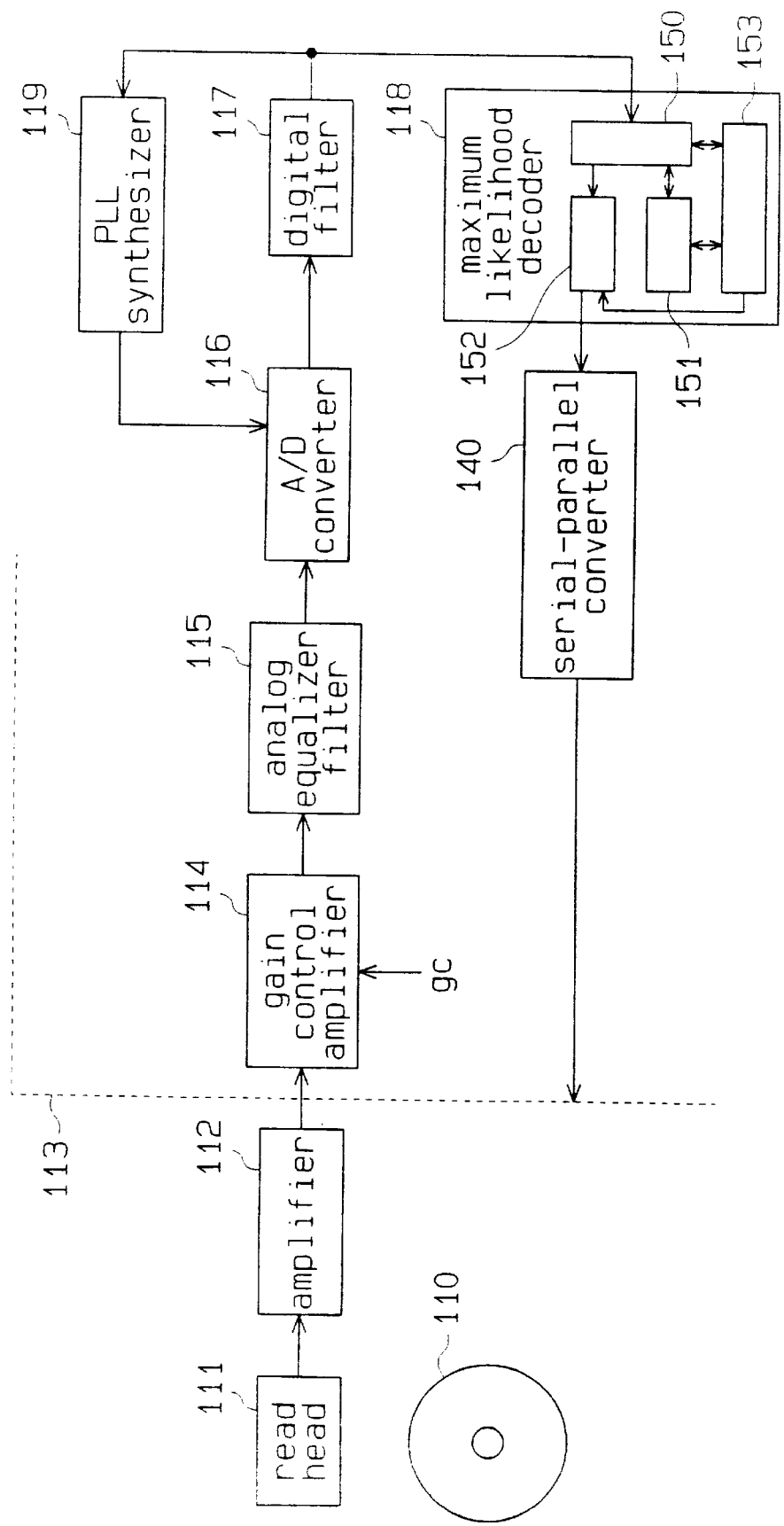
FIG. 3 is a block diagram depicting a data reading circuit in a magnetic drive.

A description of this invention adapted to a maximum likelihood decoder will be now described. FIG. 3 is a block diagram depicting a data reading circuit included in a magnetic disk drive. The magnetic disk drive has a read head 111, an amplifier 112 and a read channel IC 113 as a data reading circuit. The read channel IC 113 includes a gain control amplifier 114, an analog equalizer filter 115, an A/D converter 116, a digital filter 117, a maximum likelihood decoder 118, a PLL synthesizer 119 and a serial-parallel converter 140.

The read head 111 reads an analog data signal, written on a magnetic disk 110, and supplies it to the amplifier 112. The amplifier 112 amplifies the analog data signal and supplies the amplified analog data signal to the gain control amplifier 114. The gain control amplifier 114 controls the gain of the amplified analog data signal in response to a gain compensation signal gc supplied from an external control apparatus (not shown), and supplies the gain-compensated analog data signal having a predetermined amplitude to the analog equalizer filter 115. This filter 115 adjusts the signal level in such a way that the gain-compensated analog data signal has a predetermined frequency characteristic, and sends the filtered analog data signal to the A/D converter 116. The A/D converter 116 converts the filtered analog data signal to a digital signal, which is in turn supplied to the digital filter 117. The digital filter 117 removes the unnecessary digital component from the digital signal and sends the filtered digital signal to the maximum likelihood decoder 118. The maximum likelihood decoder 118 performs a decoding operation according to the maximum likelihood decoding algorithm to produce a decoded serial read data signal, and supplies this signal to the serial-parallel converter 140. The serial-parallel converter 140 converts the serial signal to a parallel signal and supplies the latter signal to an external processor (not shown) which is connected to the read channel IC 113. The digital filter 117 also supplies the filtered digital signal to the PLL synthesizer 119, which in turn produces a sampling frequency signal for the A/D converter 116 in accordance with the filtered digital signal and sends the sampling frequency signal to the A/D converter 116.

As shown in FIGS. 4 to 7, the maximum likelihood decoder 118 includes first to third metric arithmetic operation units 150 through 152 and a control signal generator 153. The first metric arithmetic operation unit 150, shown in FIG. 4, has first through third subtracting circuits 119a through 119c, first through fourth registers 120a through 120d, four first arithmetic operation blocks 121a through 121d, one second arithmetic operation block 122a, one third arithmetic operation block 123a, and first and second selectors 127a and 127b. These components of the first metric arithmetic operation unit 150 operate in response to clock signals. The second metric arithmetic operation unit 151, shown in FIG. 5, has fourth and fifth subtracting circuits 119d and 119e, fifth and sixth registers 120e and 120f, two first arithmetic operation blocks 121e and 121f, two second arithmetic operation blocks 122b and 122c, one fourth arithmetic operation block 124a, one fifth arithmetic operation block 125, and third and fourth selectors 127c and 127d. These components of the second metric arithmetic operation unit 151 also operate in response to clock signals. The third metric arithmetic operation unit 152, shown in FIG. 6, has a sixth subtracting circuit 119f, seventh through ninth registers 120g through 120i, two third arithmetic operation blocks 123b and 123c, one fourth arithmetic operation block 124b, fifth through seventh selectors 127e to 127g, and first through third adders 126a through 126c. These components of the third metric arithmetic operation unit 152 also operate in response to clock signals.

Each of the first arithmetic operation blocks 121a–121f has four input terminals for respectively receiving four signals (denoted by A, B, C and D), and an output terminal for supplying a signal (denoted by F) representing the operation result, and executes an operation of F=A−B−C+D. Each of the second arithmetic operation blocks 122a–122c has three input terminals for respectively receiving three signals (denoted by A, B and C), and an output terminal for supplying a signal (denoted by F) representing the operation result, and executes an operation of F=A−B−C. Each of the third arithmetic operation blocks 123a–123c has three input terminals for respectively receiving three signals (denoted by A, B and C), and an output terminal for supplying a signal (denoted by F) representing the operation result, and executes an operation of F=A−B+C. Each of the fourth arithmetic operation blocks 124a and 124b has four input terminals for respectively receiving four signals (denoted by A, B, C and D), and an output terminal for supplying a signal (denoted by F) representing the operation result, and executes an operation of F=A−B+C+D. The fifth arithmetic operation block 125 has four input terminals for respectively receiving four signals (denoted by A, B, C and D), and an output terminal for supplying a signal (denoted by F) representing the operation result, and executes an operation of F=A−B−C−D.

Each of the first through fifth arithmetic operation blocks 121a–121f through 125 is a multi-input arithmetic operation block according to a known carry save system. Each arithmetic operation block has an array of adders arranged in a plurality of stages, so that a carry generated in each adder at the first stage is supplied to an adder of a higher bit at the second stage, not a higher-bit adder at the first stage. The arithmetic operation block, which performs a multi-input addition using a plurality of two-input adders, sequentially supplies carries generated in the adders of individual bits to the higher-bit adders. Therefore, the arithmetic operation time from the beginning to the end of the arithmetic operation for all the bits coincides with the sum of the operation delay times of the individual adders. In an arithmetic operation block which utilizes the carry save system, the arithmetic operation time becomes shorter than the sum of the operation delay times of the individual adders, and can thus be shortened.

Figure 4:
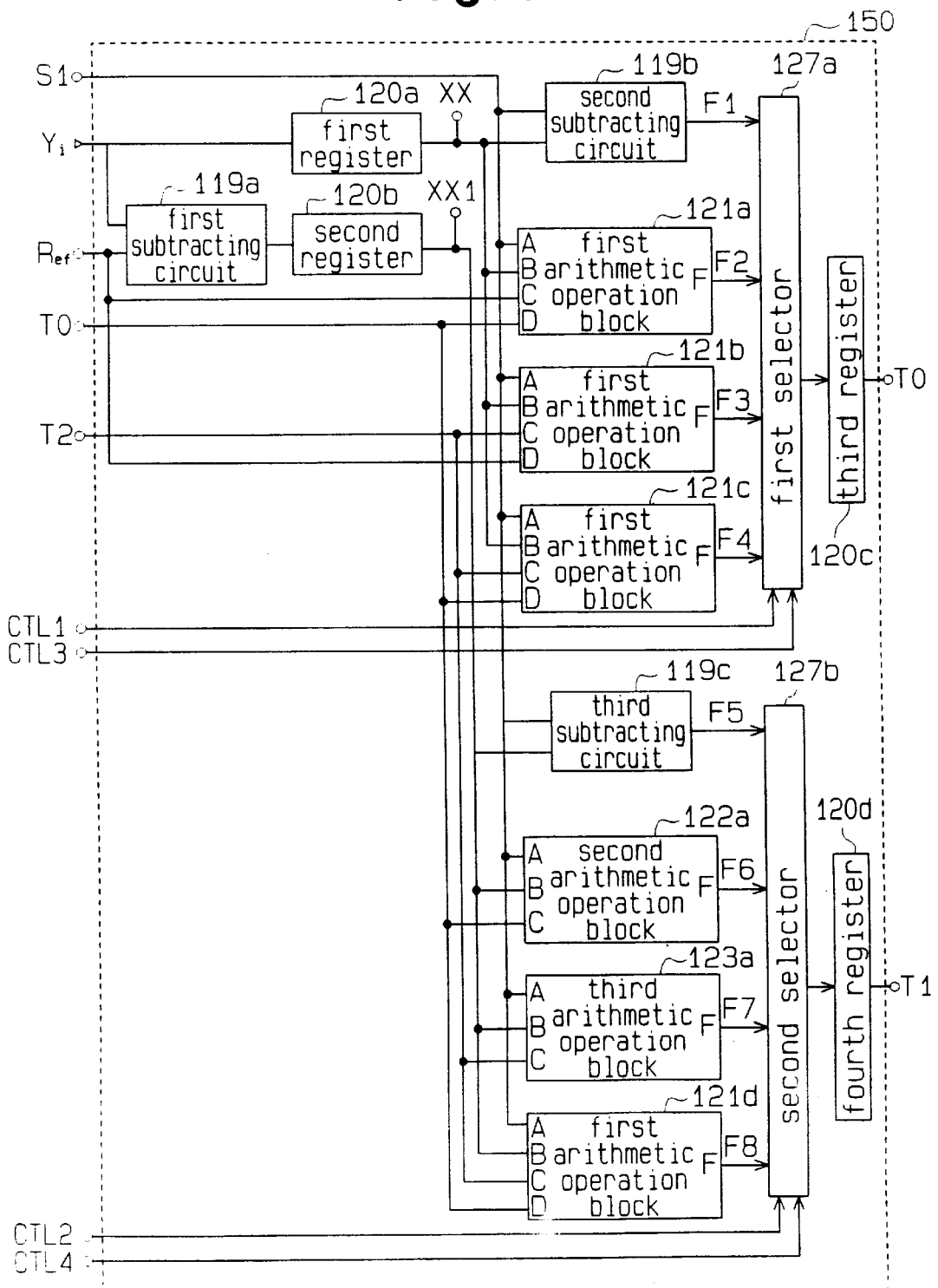
FIG. 4 is a block diagram illustrating a first metric arithmetic operation unit in a maximum likelihood decoder according to the first embodiment of this invention.

In the first metric arithmetic operation unit 150 illustrated in FIG. 4, the first register 120a temporarily stores a series of reception signals Yi supplied as the filtered digital signal from the digital filter 117, and supplies the signal series as a first register output signal to the second subtracting circuit 119b and the first arithmetic operation blocks 121a–121c. The first register 120a further supplies the first register output signal XX to the first subtracting circuit 119d of the second metric arithmetic operation unit 151. The first subtracting circuit 119a subtracts a reference signal Ref having a specific reference voltage from the reception signal series Yi, and supplies the subtraction result to the second register 120b. The second register 120b temporarily stores the subtraction result supplied from the subtracting circuit 119a, and supplies this subtraction result as a second register output signal to the third subtracting circuit 119c and the first through third arithmetic operation blocks 122a, 123a, 121d. The second register 120b also supplies the second register output signal XX1 to the first subtracting circuit 119d of the second metric arithmetic operation unit 151 and the third arithmetic operation block 123b of the third metric arithmetic operation unit 152.

The second subtracting circuit 119b subtracts the first register output signal (the reception signal series Yi) from the first serial decoded data signal S1, supplied from the eighth register 120h of the third metric arithmetic operation unit 152, and supplies a first operation result F1 to the first selector 127a. The first arithmetic operation block 121a receives the first decoded data signal S1 (A), the first register output signal (B), the reference signal Ref (C) and a first selected operation signal T0 (D) supplied from the third register 120c, and performs the aforementioned arithmetic operation in order to supply a second operation result F2 to the first selector 127a. The first arithmetic operation block 121b receives the first decoded data signal S1 (A), the first register output signal (B), a third selected operation signal T2 (C) supplied from the fifth register 120e of the second metric arithmetic operation unit 151, and the reference signal Ref (D), and performs the aforementioned arithmetic operation in order to supply a third operation result F3 to the first selector 127a. The first arithmetic operation block 121c receives the first decoded data signal S1 (A), the first register output signal (B), the third selected operation signal T2 (C), supplied from the fifth register 120e of the second metric arithmetic operation unit 151, and the first selected operation signal T0 (D), and performs the aforementioned arithmetic operation in order to supply a fourth operation result F4 to the first selector 127a. The first selector 127a selects one of the first through fourth operation results F1–F4 in response to the first and third control signals CTL1 and CTL3 supplied from the control signal generator 153, and supplies the selected operation result to the third register 120c. The third register 120c temporarily stores the selected operation result and supplies the operation result as the first selected operation signal T0 consisting of eight bits to the first arithmetic operation blocks 121a, 121c and 121d, the second arithmetic operation block 122a and the control signal generator 153.

The third subtracting circuit 119c subtracts the second register output signal from the first decoded data signal S1, and supplies a fifth operation result F5 to the second selector 127b. The second arithmetic operation block 122a receives the first decoded data signal S1 (A), the second register output signal (B) and the first selected operation signal T0 (C), and performs the aforementioned arithmetic operation in order to supply a sixth operation result F6 to the second selector 127b. The third arithmetic operation block 123a receives the first decoded data signal S1 (A), the second register output signal (B) and the third selected operation signal T2 (C), and performs the aforementioned arithmetic operation in order to supply a seventh operation result F7 to the second selector 127b. The first arithmetic operation block 121d receives the first decoded data signal S1 (A), the second register output signal (B), the third selected operation signal T2 (C) and the first selected operation signal T0 (D), and performs the aforementioned arithmetic operation in order to supply an eighth operation result F8 to the second selector 127b. The second selector 127b selects one of the fifth through eighth operation results F5–F8 in response to the 2-bit second and fourth control signals CTL2 and CTL4 supplied from the control signal generator 153, and supplies the selected operation result to the fourth register 120d. The fourth register 120d temporarily stores the selected operation result and supplies the operation result as the second selected operation signal T1, consisting of eight bits, to the third metric arithmetic operation unit 152 and the control signal generator 153.

Figure 5:
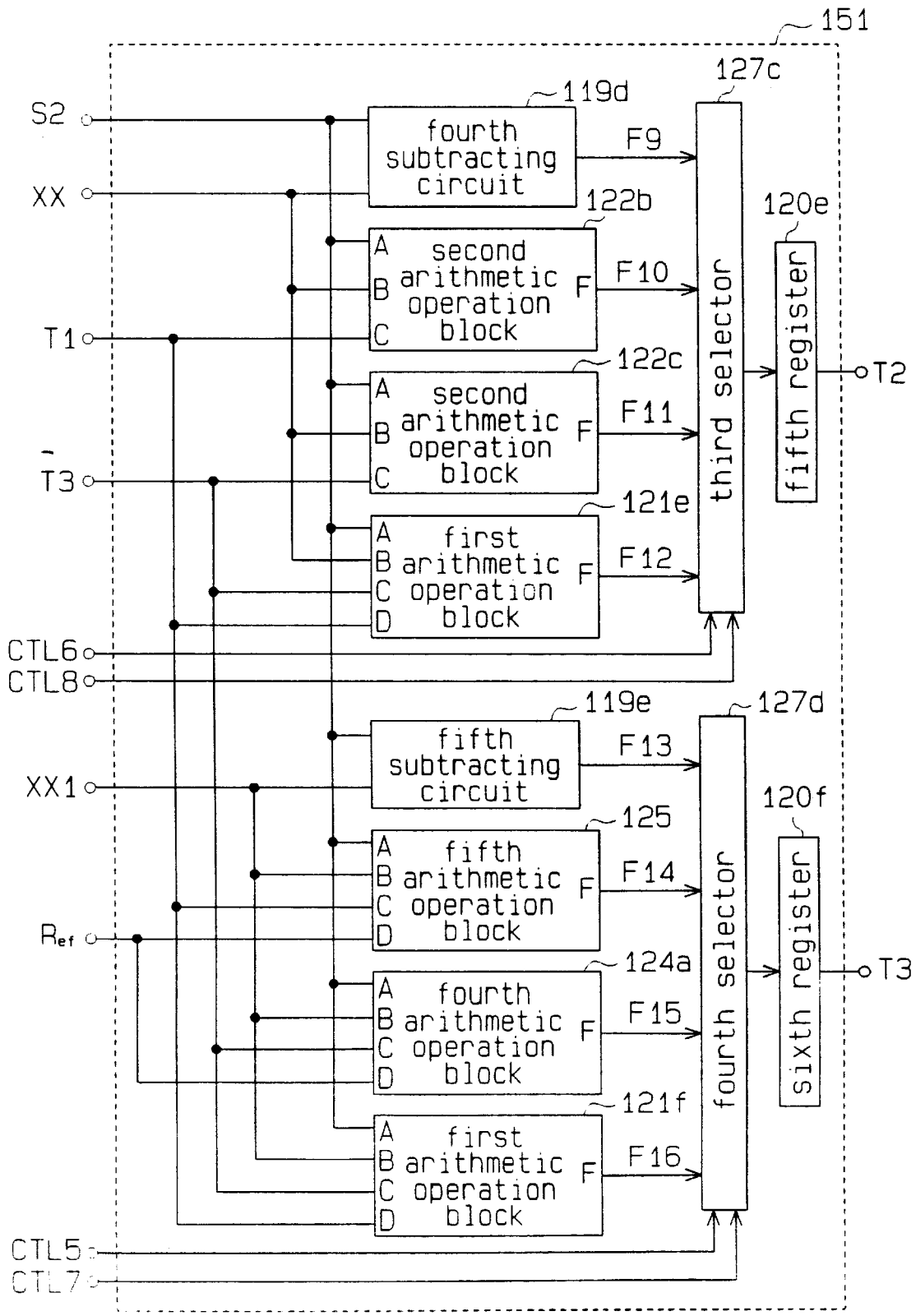
FIG. 5 is a block diagram showing a second metric arithmetic operation unit in the maximum likelihood decoder according to the first embodiment of this invention.

In the second metric arithmetic operation unit 151 shown in FIG. 5, the fourth subtracting circuit 119d subtracts the first register output signal XX from the second serial decoded data signal S2 supplied from the ninth register 120i of the third metric arithmetic operation unit 152, and supplies a ninth operation result F9 to the third selector 127c. The second arithmetic operation block 122b receives the second decoded data signal S2 (A), the first register output signal XX (B), and the second selected operation signal T1 (C) and performs the aforementioned arithmetic operation in order to supply a tenth operation result F10 to the third selector 127c. The second arithmetic operation block 122c receives the second decoded data signal S2 (A), the first register output signal XX (B) and a fourth selected operation signal T3 (C) supplied from the sixth register 120f, and performs the aforementioned arithmetic operation in order to supply an eleventh operation result F1 to the third selector 127c. The first arithmetic operation block 121e receives the second decoded data signal S2 (A), the first register output signal XX (B), the fourth selected operation signal T3 (C) and the second selected operation signal Ti (D), and performs the aforementioned arithmetic operation in order to supply a twelfth operation result F12 to the third selector 127c. The third selector 127c selects one of the ninth through twelfth operation results F9–F12 in response to sixth and eighth control signals CTL6 and CTL8 supplied from the control signal generator 153, and supplies the selected operation result to the fifth register 120e. The fifth register 120e temporarily stores the selected operation result and supplies the operation result as the third selected operation signal T2, consisting of eight bits, to the first arithmetic operation blocks 121b–121d, and the third arithmetic operation block 123a, each of which are included in the first metric arithmetic operation unit 150, and to the control signal generator 153.

The fifth subtracting circuit 119e subtracts the second register output signal XX1 from the second decoded data signal S2, and supplies a thirteenth operation result F13 to the fourth selector 127d. The fifth arithmetic operation block 125 receives the second decoded data signal S2 (A), the second register output signal XX1 (B), the second selected operation signal T1 (C) and the reference signal Ref (D), and performs the aforementioned arithmetic operation in order to supply a fourteenth operation result F14 to the fourth selector 127d. The fourth arithmetic operation block 124a receives the second decoded data signal S2 (A), the second register output signal XX1 (B), the fourth selected operation signal T3 (C) and the reference signal Ref (D), and performs the aforementioned arithmetic operation in order to supply a fifteenth operation result F15 to the fourth selector 127d. The first arithmetic operation block 121f receives the second decoded data signal S2 (A), the second register output signal XX1 (B), the fourth selected operation signal T3 (C) and the second selected operation signal T1 (D), and performs the aforementioned arithmetic operation in order to supply a sixteenth operation result F16 to the fourth selector 127d. The fourth selector 127d selects one of the thirteenth through sixteenth operation results F13–F16 in response to fifth and seventh control signals CTL5 and CTL7 supplied from the control signal generator 153, and supplies the selected operation result to the sixth register 120f. The sixth register 120f temporarily stores the selected operation result and supplies the operation result as the fourth selected operation signal T3 to the first arithmetic operation blocks 121e and 121f, the second arithmetic operation block 122c, the fourth arithmetic operation block 124a and the control signal generator 153.

Figure 6:
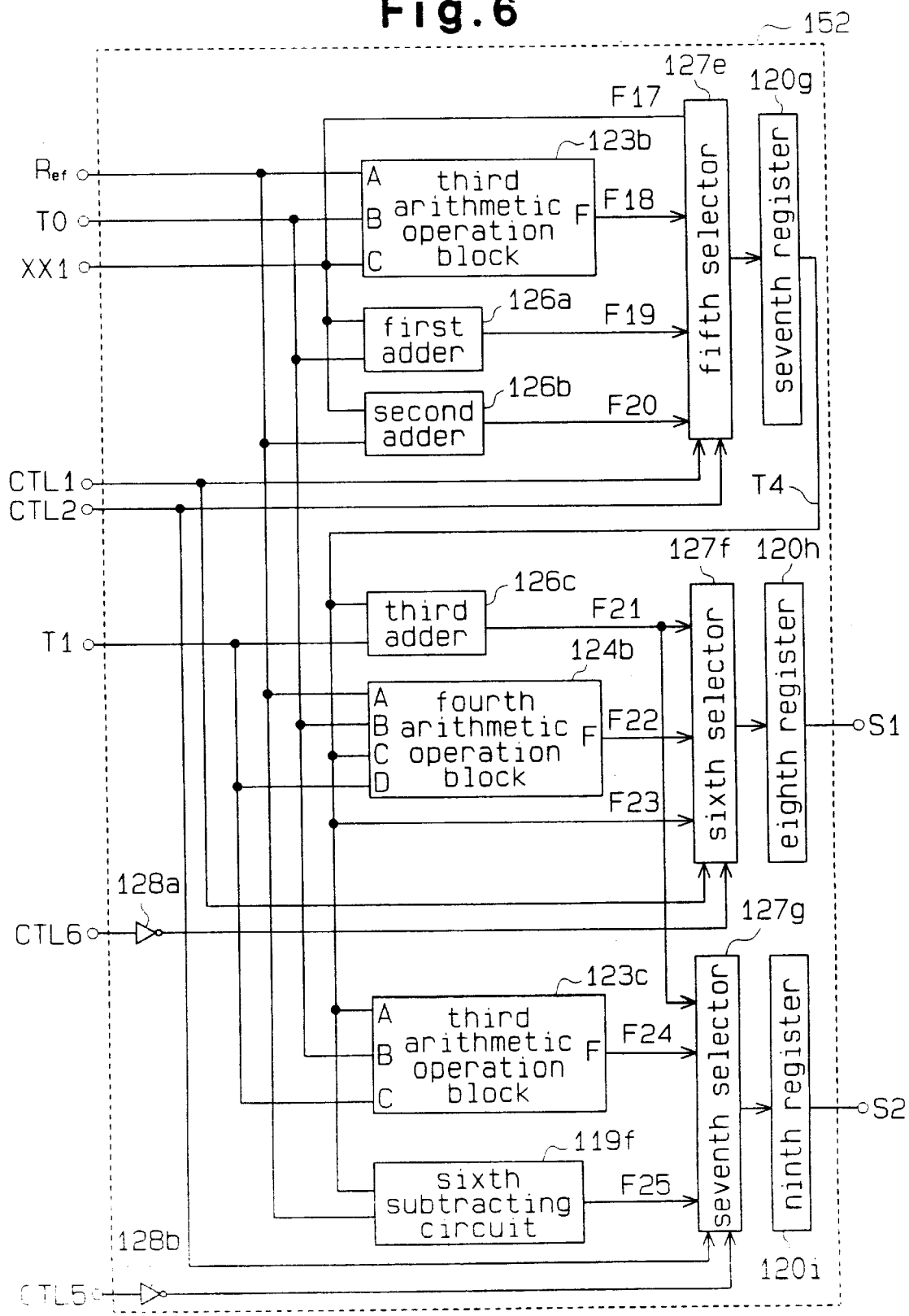
FIG. 6 is a block diagram showing a third metric arithmetic operation unit in the maximum likelihood decoder according to the first embodiment of this invention.

In the third metric arithmetic operation unit 152 shown in FIG. 6, the third arithmetic operation block 123b receives the reference signal Ref (A), the first selected operation signal T0 (B), and the second register output signal XX1 (C), and performs the aforementioned arithmetic operation in order to supply an eighteenth result F18 to the fifth selector 127e. The first adder 126a adds the second register output signal XX1 and the first selected operation signal T0, and sends a nineteenth operation result F19 to the fifth selector 127e. The second adder 126b adds the second register output signal XX1 and the reference signal Ref, and sends a twentieth operation result F20 to the fifth selector 127e. The fifth selector 127e also receives the second register output signal XX1 as an operation result F17. The fifth selector 127e selects one of the seventeenth through twentieth operation results F17–F20 in response to the first and second control signals CTL1 and CTL2 supplied from the control signal generator 153, and supplies the selected operation result to the seventh register 120g. The seventh register 120g temporarily stores the selected operation result and supplies the operation result as the fifth selected operation signal T4 to the third adder 126c, the third and fourth arithmetic operation blocks 123c and 124b and the sixth subtracting circuit 119f. The seventh register 120g also supplies the fifth selected operation signal T4 as a twenty-third operation result F23 to the sixth selector 127f.

The third adder 126c adds the fifth selected operation output signal T4 and the second selected operation signal T1, and supplies a twenty-first operation result F21 to the sixth and seventh selectors 127f and 127e. The fourth arithmetic operation block 124b receives the reference signal Ref (A), the first selected operation signal T0 (B), the fifth selected operation signal T4 (C) and the second selected operation signal T1 (D), and performs the aforementioned arithmetic operation in order to supply a twenty-second operation result F22 to the sixth selector 127f. The sixth selector 127f selects one of the twenty-first through twenty-third operation results F21–F23 in response to the first control signal CTL1 supplied from the control signal generator 153 and the inverted seventh control signal CTL6 supplied via the inverter 128a, and supplies the selected operation result to the eighth register 120h. The eighth register 120h temporarily stores the selected operation result and supplies this operation result as the first serial decoded data signal S1, consisting of eight bits, to the first metric arithmetic operation unit 150 and the serial-parallel converter 140.

The third arithmetic operation block 123c receives the fifth selected operation signal T4 (A), the first selected operation signal T0 (B) and the second selected operation signal T1 (C), and performs the aforementioned arithmetic operation in order to supply a twenty-fourth operation result F24 to the seventh selector 127g. The sixth subtracting circuit 119f subtracts the reference signal Ref from the fifth selected operation signal and supplies a twenty-fifth operation result F25 to the seventh selector 127g. The seventh selector 127g selects one of the twenty-first, twenty-fourth and twenty-fifth operation results F21, F24 and F25 in response to the second control signal CTL2 supplied from the control signal generator 153 and the inverted fifth control signal CTL5 supplied via the inverter 128b, and supplies the selected operation result to the ninth register 120i. The ninth register 120i temporarily stores the selected operation result and supplies this operation result as the second serial decoded data signal S2 to the second metric arithmetic operation unit 151 and the serial-parallel converter 140.

Figure 7:
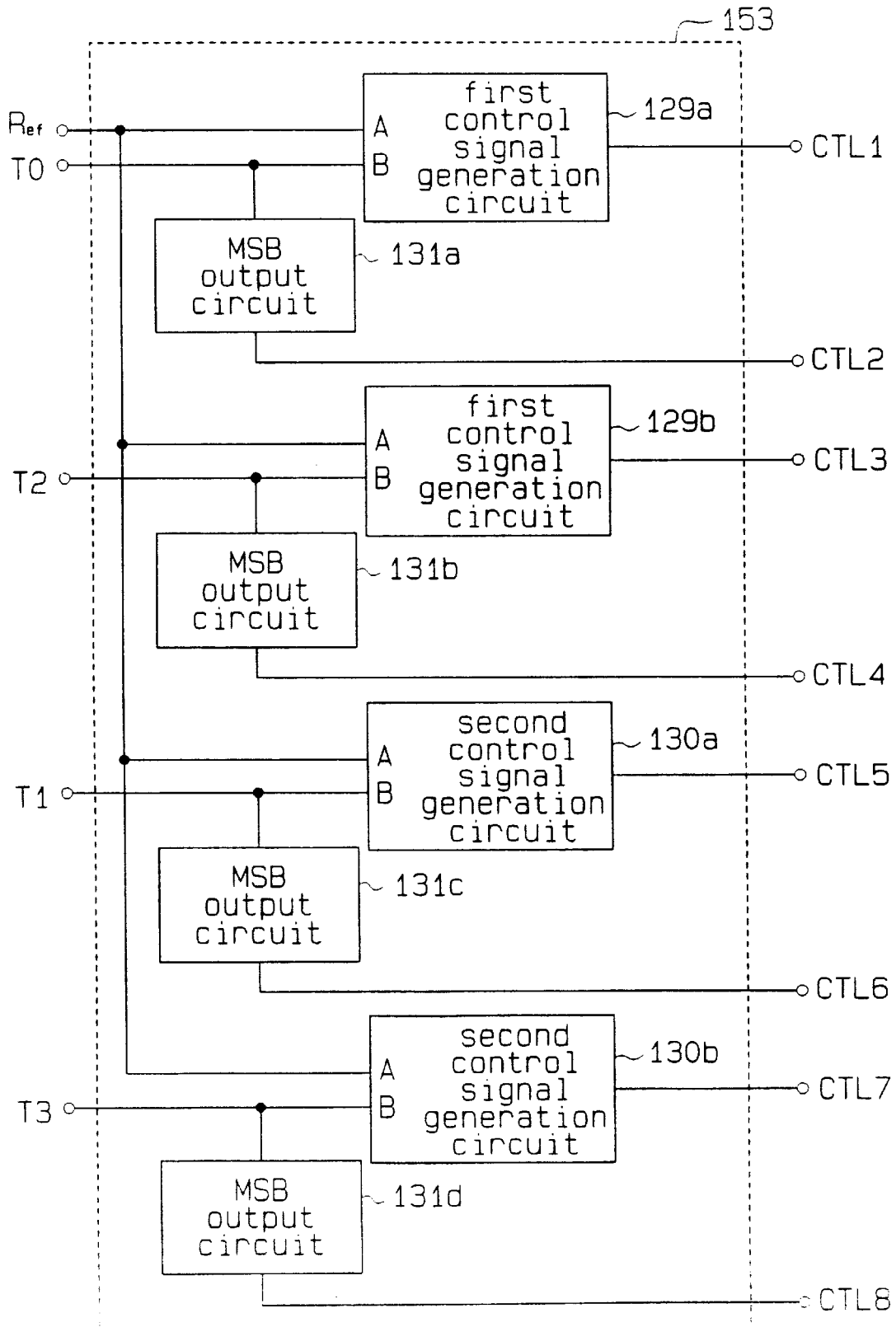
FIG. 7 is a block diagram depicting a control signal generator in the maximum likelihood decoder according to the first embodiment of this invention.

FIG. 7 illustrates the control signal generator 153 for generating the first through eighth control signals CTL1–CTL8. The control signal generator 153 has two first control signal generation circuits 129a and 129b, two second control signal generation circuits 130a and 130b, and four most significant bit (MSB) output circuits 131a to 131d. The first and second control signal generation circuits 129a, 129b, 130a and 130b are arithmetic operation circuits which accord to the carry look-ahead system, and each has a plurality of adders. Each control signal generation circuit receives 8-bit signals A and B, performs an operation A−B, and supplies the MSB signal as a control signal to one of the associated metric arithmetic operation units 150–152. The carry look-ahead system, which is a known system, directly computes the value of the MSB from the input signals A and B, and need not compute the value of the MSB based on a carry from lower bits in the computation of multiple bits. This computation allows the value of the MSB to be acquired quickly regardless of the result of the operation of lower bits.

The first control signal generation circuit 129a receives the reference signal Ref (A) and the first selected operation signal T0 (B), and outputs the MSB of the operation result as the first control signal CTL1. The MSB output circuit 131a outputs the MSB of the first selected operation signal T0 as the second control signal CTL2. The first control signal generation-circuit 129b receives the reference signal Ref (A) and the third selected operation signal T2 (B), and outputs the MSB of the operation result as the third control signal CTL3. The MSB output circuit 131b outputs the MSB of the third selected operation signal T2 as the fourth control signal CTL4. The second control signal generation circuit 130a receives the reference signal Ref(A) and the second selected operation signal T1(B), and outputs the MSB of the operation result as the fifth control signal CTL5. The MSB output circuit 131c outputs the MSB in the second selected operation signal T1 as the sixth control signal CTL6. The second control signal generation circuit 130b receives the reference signal Ref(A) and the fourth selected operation signal T3(B), and outputs the MSB of the operation result as the seventh signal CTL7. The MSB output circuit 131d outputs the MSB of the fourth selected operation signal T3 as the eighth control signal CTL8.

Figure 8:
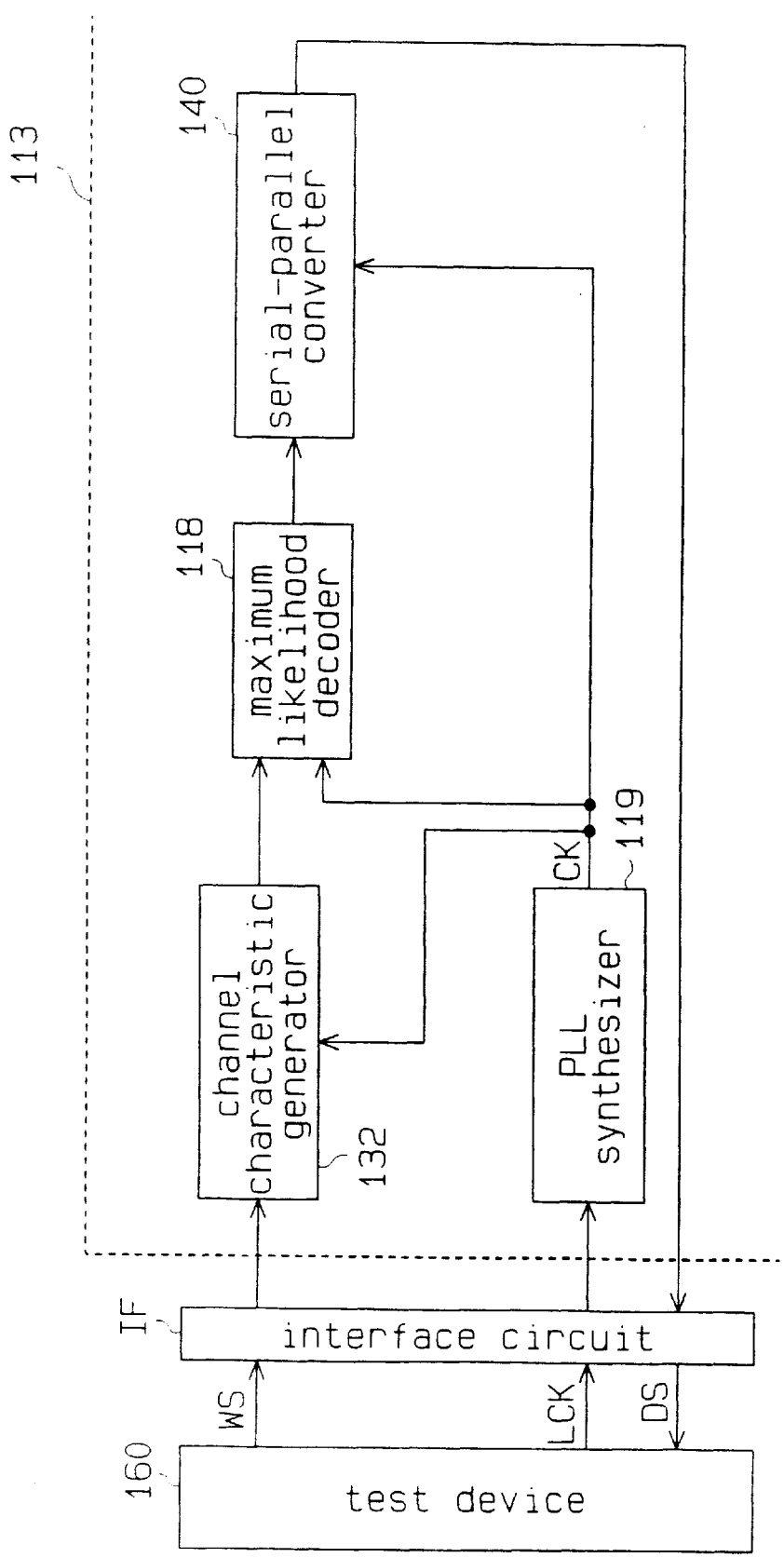
FIG. 8 is a block diagram illustrating a data reading circuit including a test circuit for the maximum likelihood decoder.

In the above-described maximum likelihood decoder 118, the individual arithmetic operation blocks in the first through third metric arithmetic operation units 150–152 perform arithmetic operations in parallel and supply the operation results to the associated selectors. Because each arithmetic operation block is a multi-input arithmetic operation circuit which follows the carry save system, signal processing at a relatively fast operation speed is possible. The first and second control signal generation circuits 129a, 129b, 130a and 130b produce the first through eighth control signals CTL1–CTL8, and supply those signals to the associated first through eighth selectors 127a–127g. At this point, each control signal is produced in a relatively short period of time by the arithmetic operation circuit which incorporates the carry look-ahead system. This structure permits each control signal to be supplied to the associated selector more quickly than the operation result supplied from each arithmetic operation block to the associated selector. The instant each selector receives the operation results from the individual arithmetic operation blocks, the selector selectively outputs one of the operation results in response to the supplied control signal. In other words, the individual arithmetic operation blocks in each metric arithmetic operation unit are connected in parallel, not in series, and supply the operation results in parallel. Each selector selects the arithmetic operation block associated with the operation result to be supplied in response to the control signal, and the instant the selector receives the operation result from the selected arithmetic operation block, it supplies the received operation result. This signal processing permits the operation result from the selected arithmetic operation block in each metric arithmetic operation unit to be promptly supplied irrespective of the arithmetic operation block whose operation speed is the slowest. Therefore, it is possible to improve the operation speed of the maximum likelihood decoder 118 which has a plurality of metric arithmetic operation units. In addition, the signal processing speed of the read channel IC 113 which employs this maximum likelihood decoder 118 can be increased. A circuit for conducting an operation test on the maximum likelihood decoder 118 will be described now with reference to FIG. 8. The read channel IC 113 further has a channel characteristic generator (hereinafter referred simply as "characteristic generator") 132 and PLL synthesizer 119. In the operation test mode of the maximum likelihood decoder 118, the characteristic generator 132 receives a parallel data test signal WS, equivalent to a data signal to be written on a magnetic disk, which is supplied via an interface circuit IF from a test device 160. In the operation test mode, the characteristic generator 132 produces a digital test signal in accordance with the parallel data test signal WS, and supplies the digital test signal to the maximum likelihood decoder 118. The read channel IC 113 has a selector (not shown) which switches from the filtered digital signal supplied by the digital filter 117 (not shown), to the digital test signal supplied by the characteristic generator 132 in response to the test mode signal supplied by the test device 160 in the operation test mode.

Figure 9:
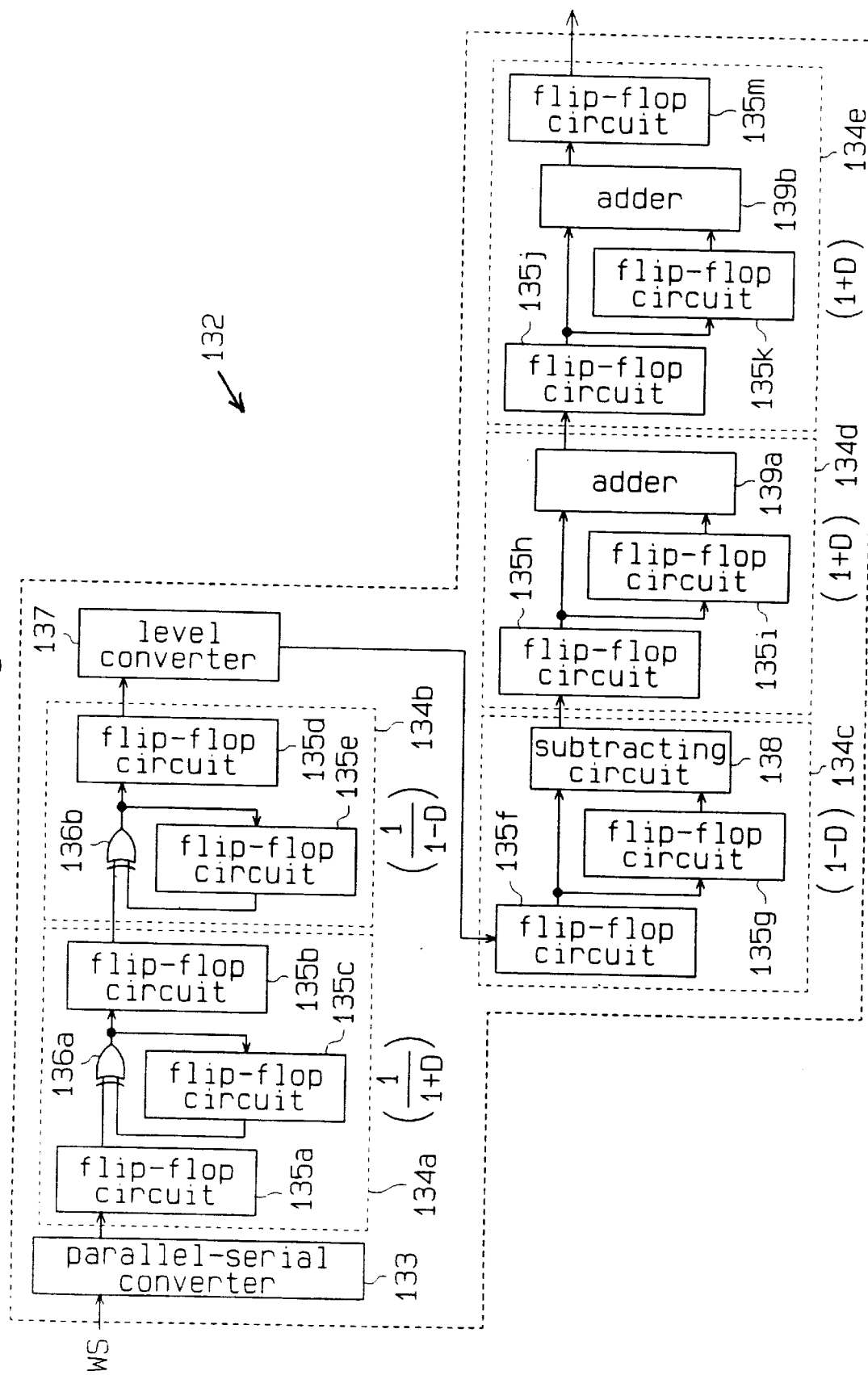
FIG. 9 is a circuit diagram showing a transfer path characteristic generator as a test circuit.

FIG. 9 presents a block diagram showing the characteristic generator 132. The characteristic generator 132 has a parallel-serial converter 133, first through fifth characteristic generation circuits 134a through 134e and a level converter 137. The parallel-serial converter 133 receives the parallel data test signal WS supplied as a write data signal from the test device 160 and converts the received parallel data test signal to a serial data signal. This serial data signal is supplied to the first characteristic generation circuit 134a. The first and second characteristic generation circuits 134a and 134b produce signals having the channel characteristic of the writing circuit. The third characteristic generation circuit 134c produces a signal having the characteristic of the data reading circuit, used for reading data from the magnetic disk by using the read head 111. The fourth characteristic generation circuit 134d produces a signal having the channel characteristic of the analog filter 115. The fifth characteristic generation circuit 134e produces a signal having the channel characteristic of the digital filter 117.

The first characteristic generation circuit 134a has three flip-flop circuits 135a–135c, and one EOR circuit 136a, and is designed to perform an operation of 1/(1+D) where "1" indicates the value of each bit in the serial data and "D" indicates the value of a predetermined delay time. The second characteristic generation circuit 134b has two flip-flop circuits 135d and 135e, and one EOR circuit 136b, and is designed to perform an operation of 1/(1−D) on the serial data supplied from the first characteristic generation circuit 134a. The second characteristic generation circuit 134b supplies the serial data signal, acquired by an arithmetic operation, to the level converter 137. The level converter 137 converts the L or H level of each bit in the serial data from the second characteristic generation circuit 134b to a predetermined L or H level, and supplies the level-converted serial data signal to the third characteristic generation circuit 134c.

The third characteristic generation circuit 134c has two flip-flop circuits 135f and 135g, and one subtracting circuit 138, and is designed to perform an operation of (1−D) with respect to the level-converted serial data signal. The fourth characteristic generation circuit 134d has two flip-flop circuits 135h and 135i, and one adder 139a, and is designed to perform an operation of (1+D) on the serial data supplied from the third characteristic generation circuit 134d. The fifth characteristic generation circuit 134e has three flip-flop circuits 135j, 135k and 135m, and one adder 139b, and is designed to perform an operation of (1+D) with respect to the serial data supplied from the fourth characteristic generation circuit 134d.

Again referring to FIG. 8, the maximum likelihood decoder 118 receives the serial data signal from the fifth characteristic generation circuit 134e, performs the above-discussed signal processing and supplies the serial decoded data signal to the serial-parallel converter 140. The serial-parallel converter 140 converts the serial decoded data signal to a parallel decoded data signal DS, and supplies the data signal DS to the test device 160 via the interface circuit IF. In the operation test mode, the PLL synthesizer 119 receives a first clock signal LCK of a low frequency supplied from the test device 160, and produces a second clock signal CK having a higher frequency than that of the first clock signal LCK. The characteristic generator 132, the maximum likelihood decoder 118 and the serial-parallel converter 140 receive the second clock signal CK from the PLL synthesizer 119 and operates quickly in accordance with the second clock signal CK. In the operation test mode, the selector (not illustrated) switches the supply of filtered digital signal from the digital filter 117 (not shown) to the PLL synthesizer 119, to the supply of the second clock signal CK in accordance with the test signal from the test device 160.

The read channel IC 113, which includes the characteristic generator 132 (test circuit), receives the test mode signal, parallel write data test signal WS and first clock signal LCK, supplied from the test device 160, and the characteristic generator 132 produces a serial digital test signal for the maximum likelihood decoder 118. The maximum likelihood decoder 118 executes a decoding process at a high speed in accordance with the second clock signal CK. The serial-parallel converter 140 converts the serial decoded data signal from the maximum likelihood decoder 118 to the parallel decoded data signal DS, and supplies this data signal DS to the test device 160. The test device 160 determines if the write data signal WS matches with the decoded data signal DS, and determines that the maximum likelihood decoder 118 is properly operating when both data signals coincide with each other. As is apparent from the above, the test device 160 supplies the first clock signal LCK of a low frequency and the parallel write data signal WS according to the first clock signal LCK. The maximum likelihood decoder 118 performs a fast decoding operation in accordance with the second clock signal CK of a higher frequency than that of the first clock signal LCK, and the test device 160 receives the decoding result as the parallel decoded data signal DS. This architecture allows the test device 160 to compare the write data signals WS supplied in parallel, with the decoded data signals DS received in parallel, at a low speed in accordance with the first clock signal LCK of a low frequency. That is, the test device 160 which operates at a slow speed can perform the operation test on the maximum likelihood decoder 118 which has the improved operation speed. In other words, it is unnecessary to change the operation speed of the test device 160 to a high speed from a low speed in order to conduct the operation test on the maximum likelihood decoder 118 which has the improved operation speed.

Second Embodiment

Figure 10:
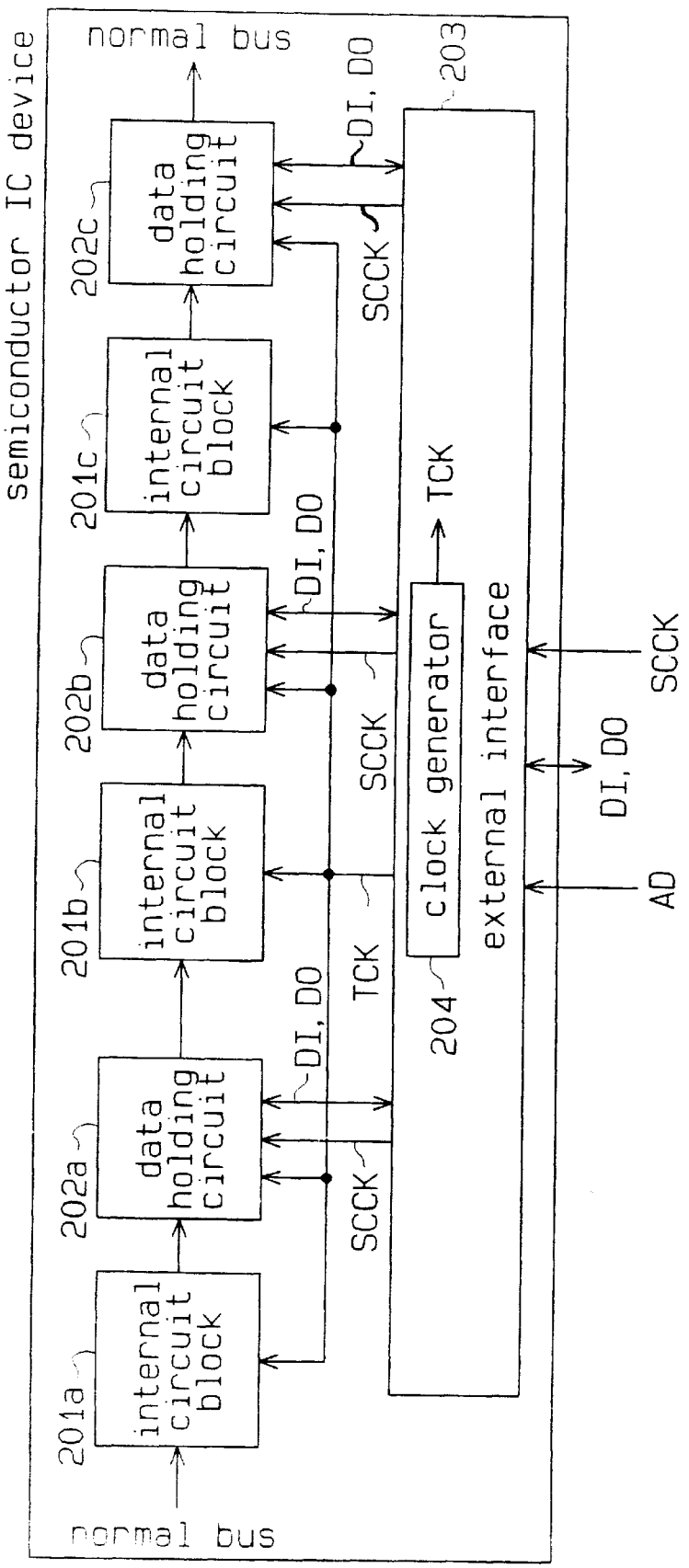
FIG. 10 is a block diagram showing a general semiconductor IC device which covers first to sixth examples of the second embodiment of the invention.

A general semiconductor IC device which covers the first through sixth examples of the second embodiment will be now described. As shown in FIG. 10, the semiconductor IC device has a plurality of internal circuit blocks 201a–201c, a plurality of data holding circuits 202a–202c and an external interface 203. Each internal circuit block 201a–201c receives a digital input data signal and outputs a digital output data signal in accordance with a clock signal. Each data holding circuit 202a–202c, which is located after each of the internal circuit blocks 201a–201c, is accessible through the external interface 203. In response to the clock signal, each data holding circuit 202a–202c temporarily retains the digital output data signal from the associated internal circuit block 201a–201c and supplies the signal to the internal circuit block 201a–201c at the subsequent stage. The external interface 203 accesses each data holding circuit 202a–202c in accordance with a scan clock signal SCCK supplied from an external device (not shown), and outputs a test data signal DI, supplied from the external device (not shown), in such a way that this test data signal DI is retained in each data holding circuit 202a–202c. The external interface 203 has a clock generator 204 which generates a test clock signal TCK having a higher frequency than that of the scan clock signal SCCK, and supplies the clock signal TCK to each internal circuit block 201a–201c. In accordance with the test clock signal TCK, each internal circuit block 201a–201c supplies the digital output data signal to the associated data holding circuit 202a–202c. The external interface 203 accesses each data holding circuit 202a–202c in accordance with the scan clock signal SCCK to receive the digital output data signal DO retained in each data holding circuit 202a–202c, and supplies this signal to the external device (not shown). In other words, each data holding circuit 202a–202c holds the test data signal DI in accordance with an access by the external interface 203, further in accordance with the scan clock signal SCCK which has a relatively low frequency. Each internal circuit block 201a–201c operates in accordance with the test clock signal TCK having a higher frequency than the scan clock signal SCCK. In short, the semiconductor IC device embodying this invention can perform a fast operation test although the scan clock signal has a relatively low frequency.

FIRST EXAMPLE

Figure 11:
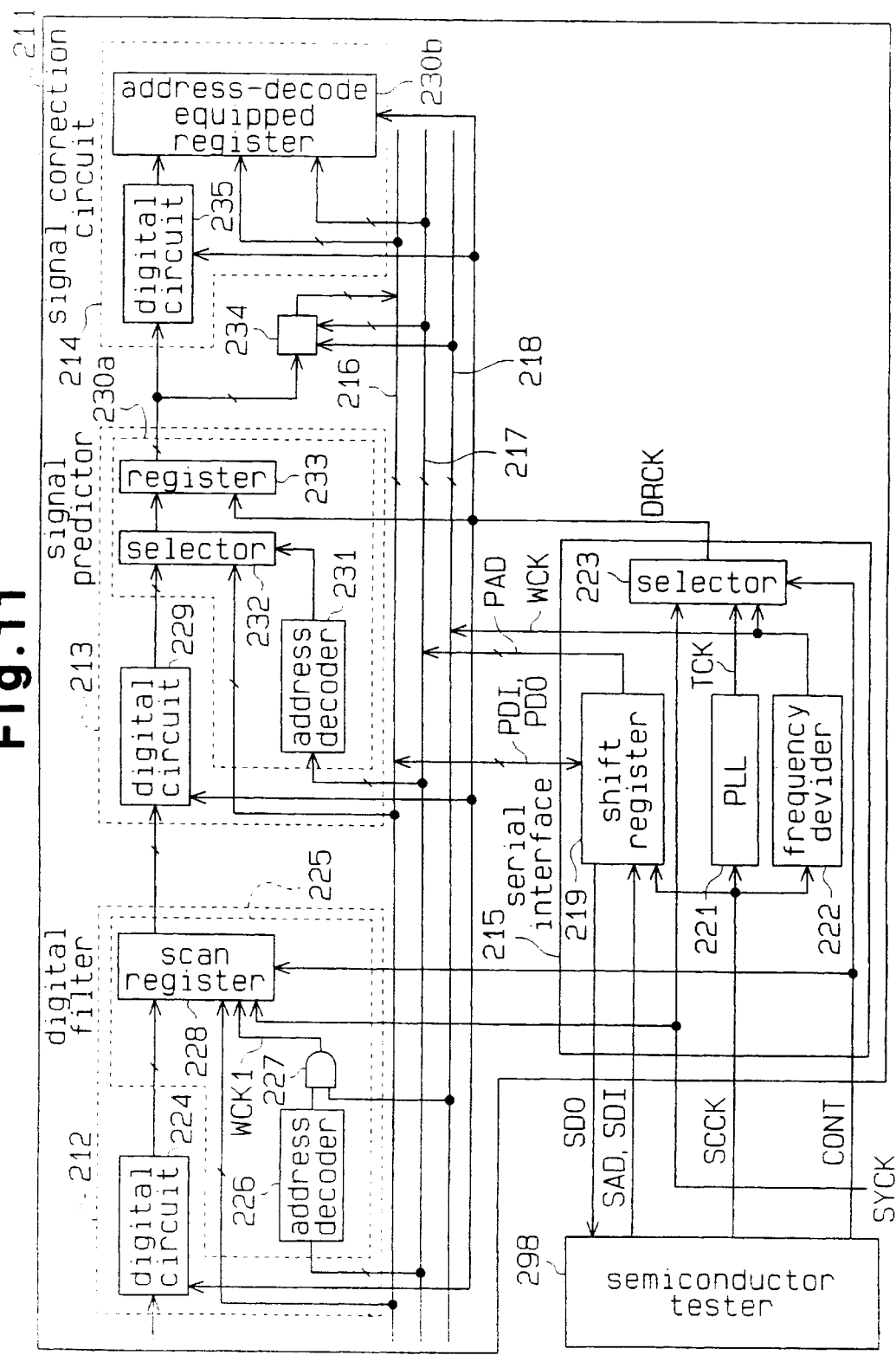
FIG. 11 is a block diagram showing a semiconductor IC device according to the first example.

As shown in FIG. 11, a semiconductor IC device (hereinafter called "LSI") 211 according to the first example has a digital filter 212, a signal predictor 213, a signal correction circuit 214, a bus driver 234 and a serial interface 215 as an external interface. The LSI 211 further includes a data bus 216, an address bus 217 and a control bus 218.

The serial interface 215 has a shift register 219, a PLL frequency synthesizer 221 as a clock generator, a frequency divider 222, and a selector 223. Synchronized with a scan clock signal SCCK supplied from an external semiconductor tester 298, the shift register 219 receives a scan address signal SAD and a test data signal SDI from the external semiconductor tester 298, while sequentially shifting those signals. When the total number of bits of the received address signal SAD and test data signal SDI reaches a predetermined value (e.g., 16 bits), the shift register 219 supplies a parallel address signal PAD to the address bus 217 and supplies a parallel test data signal PDI to the data bus 216. The shift register 219 receives a parallel output data signal PDO on the data bus 216 synchronized with the scan clock signal SCCK supplied from an external semiconductor tester 298, and converts the parallel output data signal PDO to a serial output data signal SDO to be supplied to the semiconductor tester 298.

The PLL frequency synthesizer 221 receives the scan clock signal SCCK and generates a test clock signal TCK whose frequency is some multiplication of the frequency of the scan clock signal SCCK. In the first example, the PLL frequency synthesizer 221 supplies to the selector 223 the test clock signal TCK whose frequency is higher than those of the scan clock signal SCCK and equal to or higher than a system clock signal SYCK. The selector 223 receives the test clock signal TCK from the PLL synthesizer 221 and also the system clock signal SYCK supplied from an external control device (not shown). The frequency divider 222 generates a first write clock WCK which is acquired by frequency-dividing the frequency of the scan clock signal SCCK by a predetermined frequency-dividing ratio, and supplies this clock WCK to the control bus 218 and selector 223. The frequency-dividing ratio is set to a reciprocal of a predetermined value previously set by the shift register 219. If the predetermined value set by the shift register 219 is 16 bits (8 bits (address signal)+8 bits (test data signal)), for example, the frequency-dividing ratio becomes 1/16. The selector 223 selects either the system clock signal SYCK, the test clock signal TCK or the first write clock signal WCK in accordance with a control signal CONT supplied from the semiconductor tester 298, and supplies the selected signal as an operation clock signal DRCK to the digital filter 212, the signal predictor 213 and the signal correction circuit 214.

The digital filter 212 has a digital circuit 224 as an internal circuit block and an address-decode equipped register 225 as an input data holding circuit. The digital circuit 224 receives a digital input data (normal data) signal, and operates to supply the digital output data to the address-decode equipped register 225 in accordance with the operation clock signal DRCK supplied from the serial interface 215. The address-decode equipped register 225 has an address decoder 226, an AND gate 227 and a scan register 228. The address decoder 226 receives an address signal PAD supplied via the address bus 217 from the shift register 219, and decodes the address signal PAD. In response to a high-level decoded output signal from the address decoder 226 the AND gate 227 supplies a second write clock signal WCK1, synchronous with the first write clock signal WCK supplied via the control bus 218, to the scan register 228.

The scan register 228 receives the normal clock signal SYCK, the second write clock signal WCK1, the digital output data signal from the digital circuit 224, the test data signal PDI supplied via the data bus 216, and the control signal CONT. The scan register 228 selects either the normal system clock signal SYCK or the second write clock signal WCK1 in accordance with the control signal CONT. The scan register 228 further selects either the digital output data signal or the test data signal PDI in accordance with the control signal CONT. More specifically, the scan register 228 selects the second write clock signal WCK1 and the test data signal PDI in the test mode of the LSI 211, and selects the normal system clock signal SYCK and the digital output data signal in the normal operation mode. Therefore, in the test mode initiated by the semiconductor tester 298, the scan register 228 retains the test data signal PDI synchronized with the second write clock signal WCK1. In the normal operation mode, the scan register 228 retains the digital output data signal synchronized with the normal system clock signal SYCK.

The signal predictor 213 has a digital circuit 229 as an internal circuit block and an address-decode equipped register 230 a as an input/output data holding circuit. The digital circuit 229 receives a digital input data signal from the scan register 228, and operates to supply a digital output data signal to the address-decode equipped register 230 a in accordance with the operation clock signal DRCK. The address-decode equipped register 230 a has an address decoder 231, a selector 232 and a register 233. The address decoder 231 receives the address signal PAD and decodes the address signal PAD to generate a select signal. The selector 232 receives the digital output data signal from the digital circuit 229, the test data signal PDI supplied via the data bus 216, and the select signal from the address decoder 231. The selector selects either the digital output data signal or the test data signal PDI in response to the select signal. More specifically, the selector 232 selects the test data signal PDI in response to a high-level select signal and selects the digital output data signal in response to a low-level select signal. The register 233 temporarily retains the digital output data signal from the selector 232 in response to the operation clock signal DRCK, and supplies the retained digital output data signal to the signal correction circuit 214 and the bus driver 234.

The bus driver 234 receives the address signal PAD and the first write clock signal WCK, and supplies the digital output data signal from the register 233 to the data bus 216 in accordance with those signals in the test mode. This function permits an external access from the semiconductor tester to the address-decode equipped register 230a.

The signal correction circuit 214 has a digital circuit 235 as an internal circuit block and an address-decode equipped register 230b. This address-decode equipped register 230b has the same structure as the address-decode equipped register 230a of the signal predictor 213. The digital circuit 235 receives the digital input data signal supplied from the register 233 and operates to supply the digital output data signal to the address-decode equipped register 230b in accordance with the operation clock signal DRCK.

Holding Test Data Signal According to Slow Clock Signal

In the test mode of the LSI 211, the frequency divider 222 supplies to the selector 223 and on the control bus 218, the first write clock signal WCK which is acquired by frequency-dividing the scan clock signal SCCK. The PLL frequency synthesizer 221 supplies the test clock signal TCK, having a frequency higher than the scan clock signal SCCK, to the selector 223. The selector 223 selects the first write clock signal WCK from among the system clock signal SYCK, the test clock signal TCK and the first write clock signal WCK in accordance with the control signal CONT, and outputs the selected clock signal WCK as the operation clock signal DRCK. The shift register 219 supplies the converted parallel address signal PAD and parallel test data signal PDI onto the address bus 217 and the data bus 216, respectively. When the address decoder 226 decodes the address signal PAD and supplies a high-level output signal to the AND gate 227, the AND gate 227 supplies the second write clock signal WCK1, synchronous with the first write clock signal WCK, to the scan register 228. The scan register 228 selects the second write clock signal WCK1 and test data signal PDI in accordance with the control signal CONT and temporarily holds the test data signal PDI in accordance with the second write clock signal WCK1. In this manner, the address-decode equipped register 225 holds the test data signal PDI in accordance with the second write clock signal WCK1 whose frequency is lower than that of the scan clock signal SCCK.

Holding Digital Output Data Signal According to Fast Clock Signal

After the data signal is retained in the address-decode equipped register 225, the selector 223 selects the test clock signal TCK in accordance with the control signal CONT and outputs this signal as the operation clock signal DRCK. The digital circuit 229 receives a digital input data signal from the scan register 228, and outputs the digital output data signal at a high operation speed close to the real operation speed, in accordance with the operation clock signal DRCK. When the address decoder 231 decodes the address signal PAD and sends out a low-level output signal, the selector 232 of the address-decode equipped register 230 a selects the digital output data signal from the digital circuit 229, and supplies the selected signal to the register 233. The register 233 retains the digital output data signal at a high operation speed close to the real operation speed, in accordance with the operation clock signal DRCK. This allows the semiconductor tester 298, which supplies the scan clock signal SCCK having a low frequency, to operate at a high speed close to the real operation speed of the LSI 211. In other words, it is unnecessary to develop a semiconductor tester which supplies the scan clock signal SCCK having a high frequency, thus contributing to the cost reduction involved in testing the LSI 211.

Supply of Digital Output Data Signal According to Scan Clock Signal

The bus driver 234 is enabled by the address signal PAD and the first write clock signal WCK, to supply the digital output data signal PDO, retained in the register 233, onto the data bus 216. The shift register 219 receives the parallel digital output data signal PDO, supplied on the data bus 216 and synchronized with the scan clock signal SCCK, converts the parallel digital output data signal PDO to a serial digital output data signal SDO, and supplies the signal SDO to the semiconductor tester 298 at a low speed. Conducting the operation test on the LSI 211 with the test clock signal TCK whose frequency is higher than that of the normal system clock signal SYCK permits the semiconductor tester 298 to have some allowance in the results of the test on the LSI 211.

SECOND EXAMPLE

Figure 12:
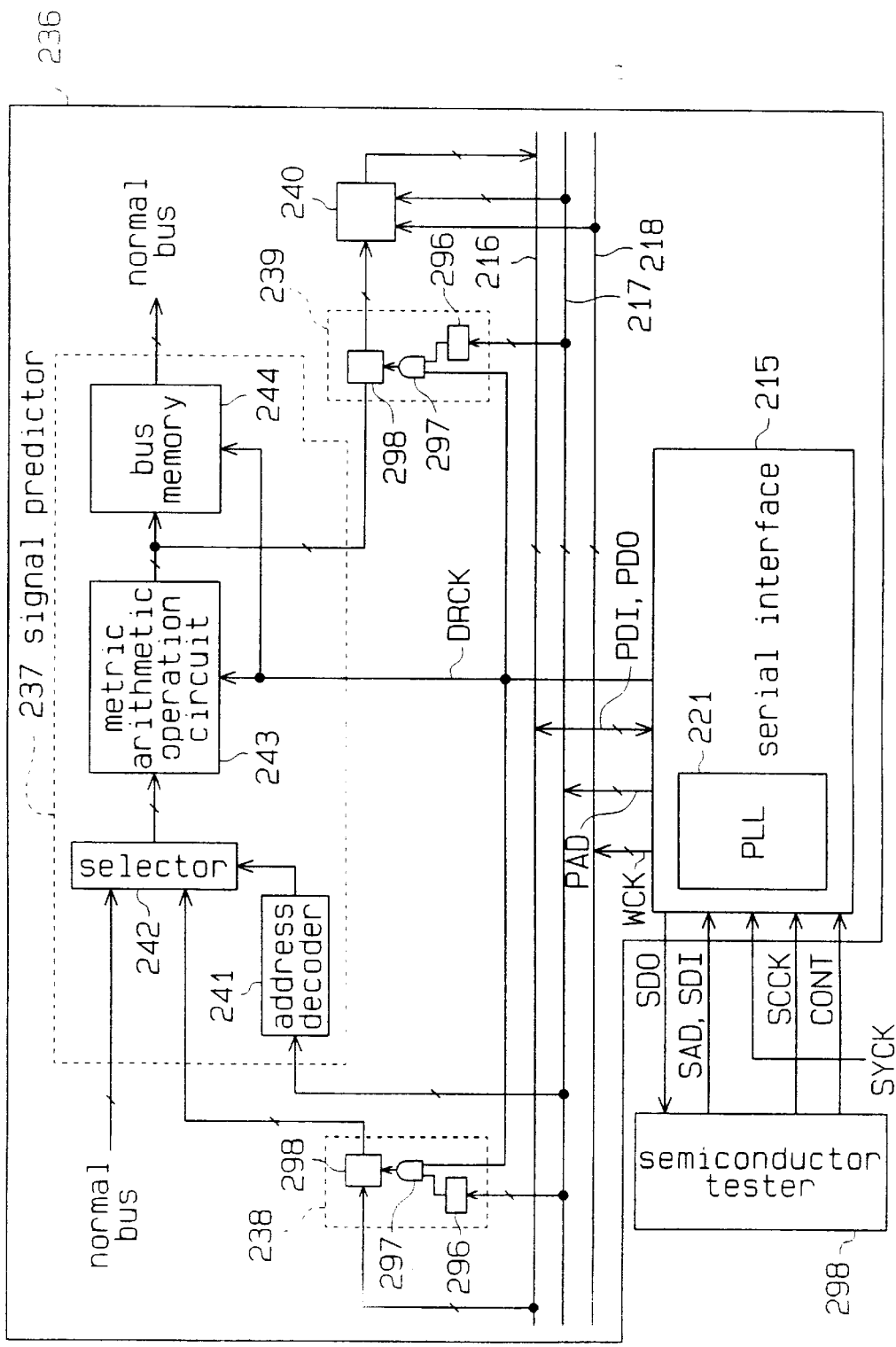
FIG. 12 is a block diagram showing a semiconductor IC device according to the second example.

The second example of this invention will be described with reference to FIG. 12. For the convenience of description and to avoid redundancy, like or same reference numerals are given to those components which are the same as the corresponding components of the first example. An LSI 236 of the second example comprises a signal predictor 237 as an internal circuit block, the serial interface 215, a first address-decode equipped register 238 as input data holding means, a second address-decode equipped register 239 as output data holding means, and a bus driver 240.

The first address-decode equipped register 238 has an address decoder 296, an AND gate 297 and a register 298. The address decoder 296 receives the address signal PAD, via the address bus 217, to be decoded. The AND gate 297 supplies the operation clock signal DRCK to the register 298 in response to the high-level output signal of the address decoder 296. The register 298 retains the test data signal PDI, supplied via the data bus 216, in accordance with the operation clock signal DRCK, and supplies the retained test data signal PDI to a selector 242.

The signal predictor 237 has an address decoder 241, the selector 242, a metric arithmetic operation circuit 243 and a bus memory 244. The address decoder 241 decodes the address signal PAD, supplied via the address bus 217, to generate a select signal. To cope with the metric arithmetic operation circuit 243 and bus memory 244, which have large circuit areas, the second address-decode equipped register 239 is connected to the metric arithmetic operation circuit 243. The selector 242 receives a normal data signal from an internal circuit block (not shown) and receives the test data signal PDI from the register 298. The selector 242 selects the test data signal PDI in response to the high-level select signal from the address decoder 241, and selects normal data in response to the low-level select signal from the address decoder 241. The metric arithmetic operation circuit 243 performs an arithmetic operation on the output data signal from the selector 242 to produce a control data signal in accordance with the operation clock signal DRCK, supplied from the serial interface 215. The bus memory 244 receives the control data signal from the metric arithmetic operation circuit 243, and sequentially stores the control data signal in accordance with the operation clock signal DRCK.

The second address-decode equipped register 239 has the same structure as the first address-decode equipped register 238. The register 298 retains the output data signal from the metric arithmetic operation circuit 243 in accordance with the operation clock signal DRCK supplied from the AND gate 297, and supplies the retained output data signal to the bus driver 240. The bus driver 240 supplies the output data signal from the register 298 onto the data bus 216 in accordance with the address signal PAD and the write clock signal WCK.

In the test mode of the LSI 236, the serial interface 215 receives the scan clock signal SCCK, the serial address signal SAD and the serial test data signal SDI from the semiconductor tester 298, and supplies the write clock signal WCK on the control bus 218, the address signal PAD on the address bus 217 and the test data signal PDI on the data bus 216. The serial interface 215 further outputs the write clock signal WCK as the operation clock signal DRCK in accordance with the control signal CONT.

When the address decoder 296 decodes the address signal PAD and supplies the high-output signal to the AND gate 297, the AND gate 297 supplies the operation clock signal DRCK (or the write clock signal WCK) to the register 298. As a result, the register 298 retains the test data signal PDI, synchronous with the write clock signal WCK, and outputs the retained data signal. In this manner, the address-decode equipped register 238 retains the test data signal PDI in accordance with the write clock signal WCK having a frequency lower than that of the scan clock signal SCCK.

When the address decoder 241 decodes the address signal PAD and supplies the high-output signal to the selector 242, the selector 242 selects the test data signal PDI from the register 298 and supplies this signal to the metric arithmetic operation circuit 243. At that point, the serial interface 215 outputs the test clock signal TCK as the operation clock signal DRCK in accordance with the control signal CONT. Therefore, the metric arithmetic operation circuit 243 and the bus memory 244 perform operations at high speeds close to the real operation speed synchronized with the operation clock signal DRCK (i.e., the test clock signal TCK). When the address-decode equipped register 239 is accessed with the address signal PAD during this fast operation, the register 239 holds the output data signal from the metric arithmetic operation circuit 243 at a high speed close to the real operation speed synchronized with the operation clock signal DRCK. As mentioned above, the address-decode equipped register 239 which has a small circuit area and is used in the test mode can be connected between the metric arithmetic operation circuit 243 and the bus memory 244, which have large circuit areas.

Next, the bus driver 240 is enabled by the address signal PAD and the write clock signal WCK to supply the output data signal PDO, retained in the address-decode equipped register 239, onto the data bus 216. The serial interface 215 receives the output data signal PDO on the data bus 216 synchronous with the scan clock signal SCCK, and converts it to a serial output data signal SDO to be supplied to the semiconductor tester 298.

THIRD EXAMPLE

Figure 13:
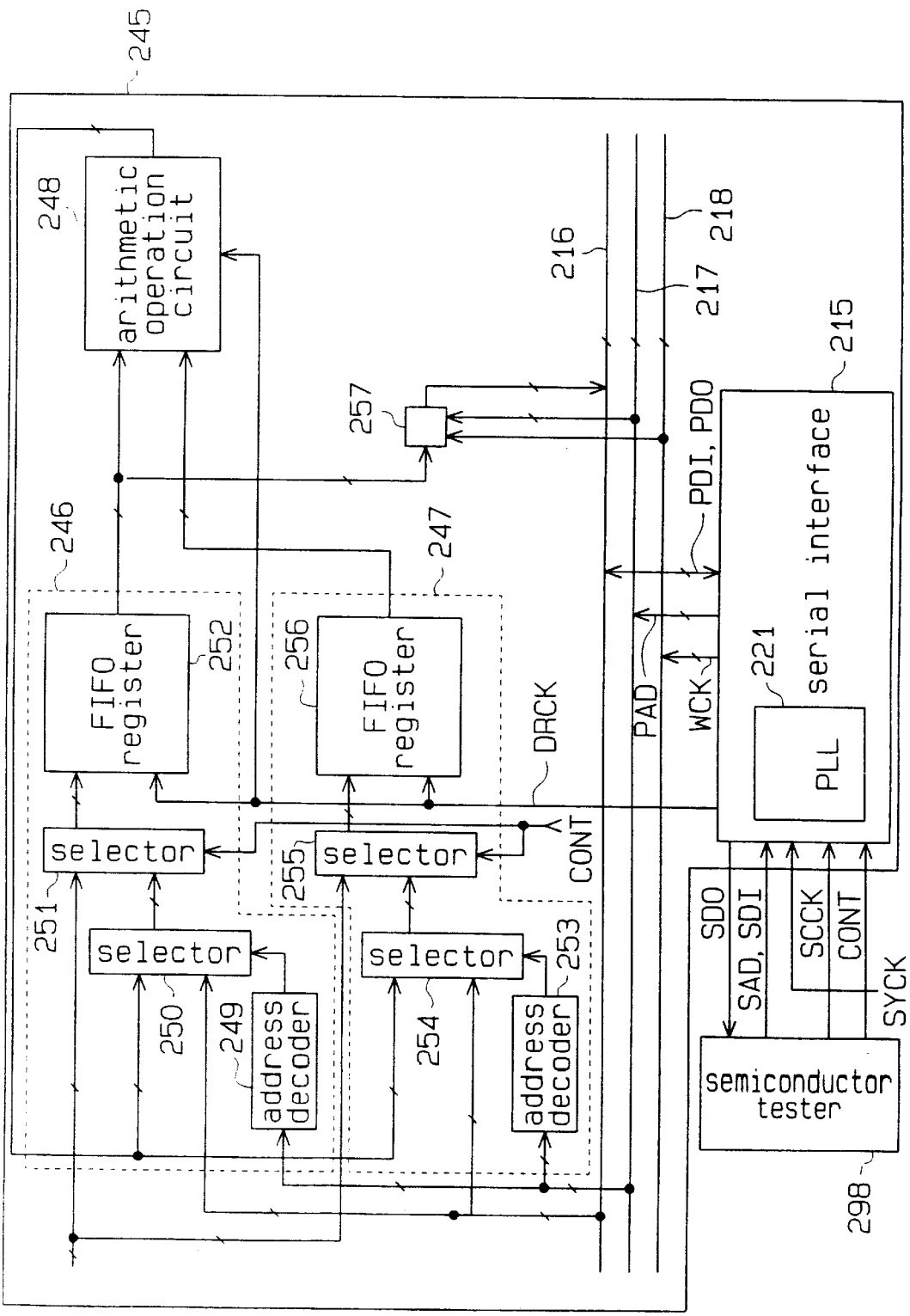
FIG. 13 is a block diagram showing a semiconductor IC device according to the third example.

The third example of this invention will be described with reference to FIG. 13. For the convenience of description and to avoid redundancy, like or same reference numerals are given to those components which are the same as the corresponding components of the first example. An LSI 245 of the third example comprises an arithmetic operation circuit 248 as an internal circuit block, the serial interface 215, first and second address-decode equipped registers 246 and 247 as input/output data holding circuits, and a bus driver 257. The first address-decode equipped register 246 has a first address decoder 249, first and second selectors 250 and 251, and a first-in-first-out (FIFO) register 252. The first address decoder 249 decodes the address signal PAD, supplied via the address bus 217, and supplies a select signal to the first selector 250. The first selector 250 receives the test data signal PDI, supplied via the data bus 216, and the output data signal, supplied from the arithmetic operation circuit 248. Further, the first selector 250 selects the output data signal from the arithmetic operation circuit 248 in response to the high-level select signal from the address decoder 249, and selects the test data signal PDI in response to the low-level select signal.

The second selector 251 receives the normal data signal from the internal circuit block (not shown) and the output data signal from the first selector 250. Further, the second selector 251 selects the output data signal in accordance with the control signal CONT in the test mode and selects the normal data signal in accordance with the control signal CONT in the normal operation mode. The first FIFO register 252 holds the output data signal, supplied from the second selector 251 synchronous with the operation clock signal DRCK, and sequentially supplies the output data signal to the arithmetic operation circuit 248.

The second address-decode equipped register 247, like the first address-decode equipped register 246, has a second address decoder 253, third and fourth selectors 254 and 255 and a second FIFO register 256. The arithmetic operation circuit 248 receives the output data signals from the first and second FIFO registers 252 and 256, performs an arithmetic operation (e.g., multiplication) on both output data signals in accordance with the operation clock signal DRCK, and outputs a data signal indicative of the operation result. The bus driver 257 supplies the output data signal from the FIFO register 252 to the data bus 216 in response to the address signal PAD and the write clock signal WCK.

In the test mode of the LSI 245, the serial interface 215 selects the write clock signal WCK in accordance with the control signal CONT and outputs this signal WCK as the operation clock signal DRCK. When the first address decoder 249 supplies the high-level output signal to the first selector 250, the first selector 250 selects the test data signal PDI and supplies it to the second selector 251. The second selector 251 selects the test data signal PDI in accordance with the control signal CONT and supplies the signal PDI to the first FIFO register 252. The first FIFO register 252 holds the test data signal PDI synchronized with the operation clock signal DRCK (i.e., the write clock signal WCK).

When the second address decoder 253 supplies the high-level output signal to the third selector 254 in accordance with a changed address signal PAD, the third selector 254 selects the test data signal PDI and sends it to the fourth selector 255. The fourth selector 255 selects the test data signal PDI, supplied from the third selector 254, in accordance with the control signal CONT, and supplies the signal PDI to the second FIFO register 256. The second FIFO register 256 retains the test data signal PDI synchronized with the operation clock signal DRCK (i.e., the write clock signal WCK).

The serial interface 215 selects the test clock signal TCK in accordance with the control signal CONT and outputs the test clock signal TCK as the operation clock signal DRCK. The first and second FIFO registers 252 and 256 supply the test data signal to the arithmetic operation circuit 248 at a high speed close to the real operation speed synchronized with the operation clock signal DRCK. This allows the first and second FIFO registers 252 and 256 to supply the retained test data signals to the arithmetic operation circuit 248 at a high speed close to the real operation speed. The arithmetic operation circuit 248 receives the test data signals from the first and second FIFO registers 252 and 256, executes multiplication on both test data signals at a high speed close to the real operation speed synchronized with the operation clock signal DRCK, and outputs the operation result. In other words, the arithmetic operation circuit 248 can be permitted to operate at the high real operation speed in the test mode.

When the first address decoder 249 supplies the low-level output signal to the first selector 250 in accordance with a changed address signal PAD, the first selector 250 selects the operation result from the arithmetic operation circuit 248 and supplies it to the second selector 251. The second selector 251 selects the operation result in accordance with the control signal CONT, and supplies the operation result to the first FIFO register 252. The first FIFO register 252 retains the operation result at an operation speed close to the real operation speed synchronized with the operation clock signal DRCK (i.e., the test clock signal TCK).

When the second address decoder 253 supplies the high-level output signal to the third selector 254 in accordance with a changed address signal PAD, the third selector 254 selects the test data signal PDI and sends it to the fourth selector 255. The fourth selector 255 selects the test data signal PDI in accordance with the control signal CONT, and supplies it to the second FIFO register 256. The second FIFO register 256 retains the test data signal PDI synchronized with the operation clock signal DRCK (i.e., the write clock signal WCK).

The serial interface 215 selects the write clock signal WCK in accordance with the control signal CONT and outputs it as the operation clock signal DRCK. The bus driver 257 is enabled by the address signal PAD and the write clock signal WCK to supply the output data signal PDO (operation result), retained in the first FIFO register 252, onto the data bus 216. The serial interface 215 receives the parallel output data signal PDO synchronized with the scan clock signal SCCK, and converts it to a serial output data signal SDO to be supplied to the semiconductor tester 298.

FOURTH EXAMPLE

Figure 14:
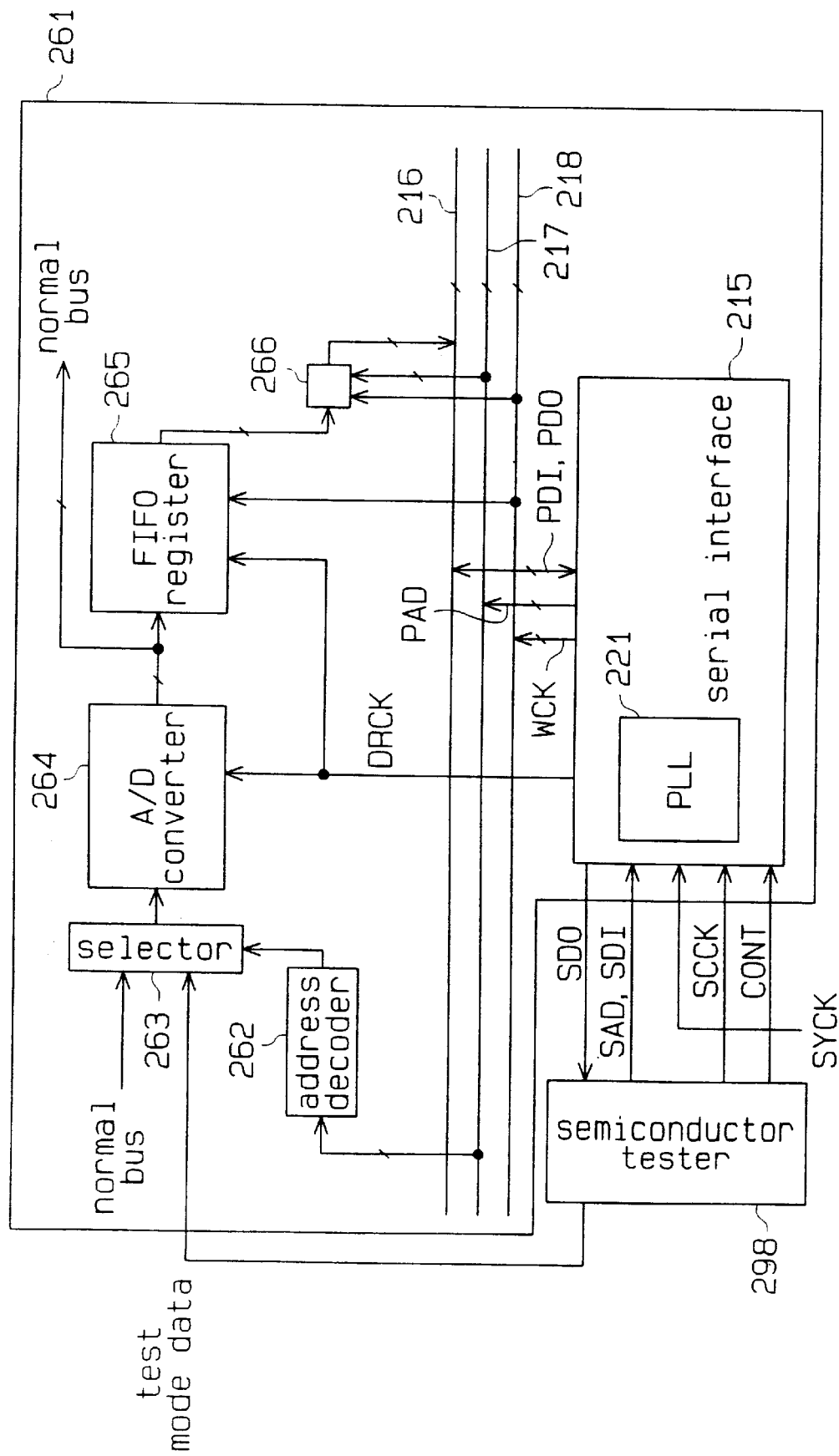
FIG. 14 is a block diagram showing a semiconductor IC device according to the fourth example.

The fourth example of this invention will be described with reference to FIG. 14. For the convenience of description and to avoid redundancy, like or same reference numerals are given to those components which are the same as the corresponding components of the first example. An LSI 261 of the fourth example comprises the serial interface 215, an address decoder 262, a selector 263, an A/D converter 264 as an internal circuit block, a FIFO register 265 as an output data holding circuit, and a bus driver 266.

The address decoder 262 decodes the address signal PAD, supplied via the address bus 217, and supplies a select signal to the selector 263. The selector 263 receives the analog normal data signal, supplied from the internal circuit block (not shown) via a normal bus, and the analog test data signal, supplied from the semiconductor tester 298. The selector 263 selects the test data signal in response to the high-level select signal from the address decoder 262 and selects the normal data signal in response to the low-level select signal from the address decoder 262. The A/D converter 264 converts the analog data signal from the selector 263 to a digital data signal in accordance with the operation clock signal DRCK from the serial interface 215. The FIFO register 265 retains the digital output data signal from the A/D converter 264 synchronized with the operation clock signal DRCK, and supplies the digital output data signals to the bus driver 266 in the retained order. The bus driver 266 is enabled by the address signal PAD and the write clock signal WCK to supply the digital output data signal from the FIFO register 265 onto the data bus 216.

When the address decoder 262 decodes the address signal PAD and supplies the high-level output signal to the selector 263 in the test mode of the LSI 261, the selector 263 selects the analog test data signal and sends it to the A/D converter 264. The serial interface 215 selects the test clock signal TCK in accordance with the control signal CONT, and outputs this signal TCK as the operation clock signal DRCK. The A/D converter 264 converts the analog data signal to a digital data signal at an operation speed close to the real operation speed, synchronized with the operation clock signal DRCK, and supplies the digital data signal to the FIFO register 265. The FIFO register 265 retains the digital output data signal at an operation speed close to the real operation speed synchronized with the operation clock signal DRCK (i.e., the test clock signal TCK). In this manner, the test on the A/D converter 264 can be performed at a high operation speed close to the real operation speed in accordance with the test clock signal TCK.

When the control signal CONT changes, the serial interface 215 selects the write clock signal WCK, in accordance with the changed control signal CONT, and outputs it as the operation clock signal DRCK. The FIFO register 265 supplies the retained digital output data signal to the bus driver 266 at a low speed synchronized with the operation clock signal DRCK (i.e., the write clock signal WCK). The bus driver 266 is enabled by the address signal PAD and the write clock signal WCK to supply the digital output data signal PDO onto the data bus 216. The serial interface 215 receives the parallel digital output data signal PDO synchronized with the scan clock signal SCCK, and converts it to a serial digital output data signal SDO to be supplied to the semiconductor tester 298.

FIFTH EXAMPLE

Figure 15:
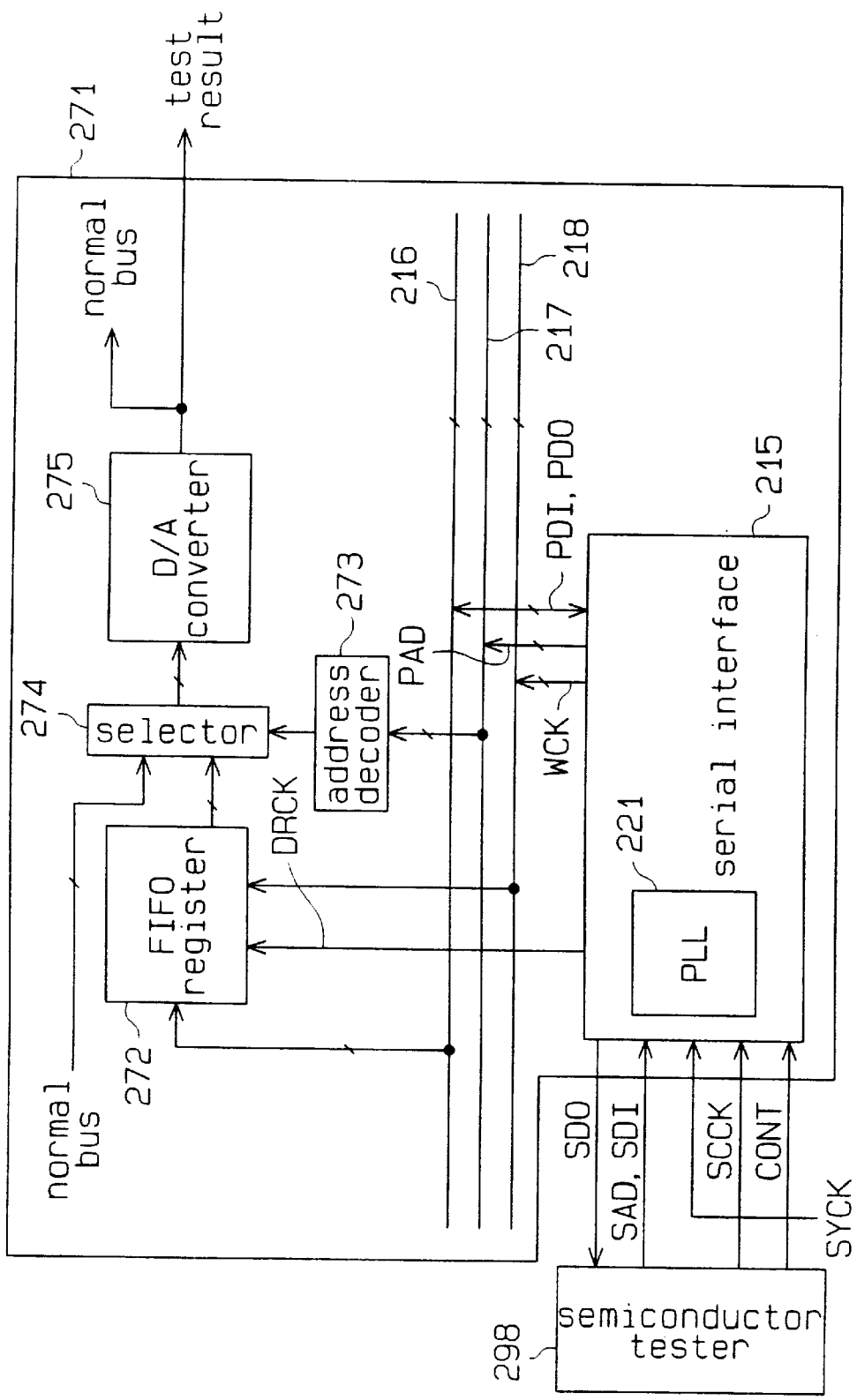
FIG. 15 is a block diagram showing a semiconductor IC device according to the fifth example.

The fifth example of this invention will be described with reference to FIG. 15. For the convenience of description and to avoid redundancy, like or same reference numerals are given to those components which are the same as the corresponding components of the first example. An LSI 271 of the fifth example comprises an FIFO register 272 as an input data holding circuit, an address decoder 273, a selector 274, a D/A converter 275 as an internal circuit block, and the serial interface 215. The FIFO register 272 retains the test data signal PDI, supplied on the data bus 216 from the serial interface 215, synchronized with the operation clock signal DRCK, and supplies the test data signal PDI to the selector 274 in the retained order. The address decoder 273 decodes the address signal PAD, supplied via the address bus 217, and supplies a select signal to the selector 274. The selector 274 receives the digital normal data signal, supplied from the internal circuit block (not shown), and the test data signal, supplied from the FIFO register 272. The selector 274 selects the test data signal in response to the high-level select signal and selects the normal data signal in response to the low-level select signal. The D/A converter 275 converts the digital output data signal from the selector 274 to an analog output data signal.

In the test mode of the LSI 261, the serial interface 215 selects the write clock signal WCK in accordance with the control signal CONT, and outputs this signal TCK as the operation clock signal DRCK. The FIFO register 272 sequentially retains the test data signal PDI, supplied on the data bus 216, at a low speed synchronized with the operation clock signal DRCK. When the control signal CONT changes, the serial interface 215 selects the test clock signal TCK, in accordance with the changed control signal CONT, and outputs it as the operation clock signal DRCK. The FIFO register 272 sequentially supplies the retained test data signals to the selector 274 at a high speed close to the real operation speed, synchronized with the operation clock signal DRCK (i.e., the test clock signal TCK).

When the address decoder 273 supplies the high-level output signal to the selector 274 in accordance with the changed address signal PAD, the selector 274 selects the test data signal from the FIFO register 272 and supplies it to the D/A converter 275. The D/A converter 275 converts the digital data signal to an analog data signal synchronized with the operation clock signal DRCK and supplies the analog data signal to the semiconductor tester 298. According to the fifth example, in the test mode, the test data signal can be held by the slow operation of the FIFO register 272 and the analog-to-digital conversion can be accomplished by the fast operation of the D/A converter 275.

SIXTH EXAMPLE

Figure 16:
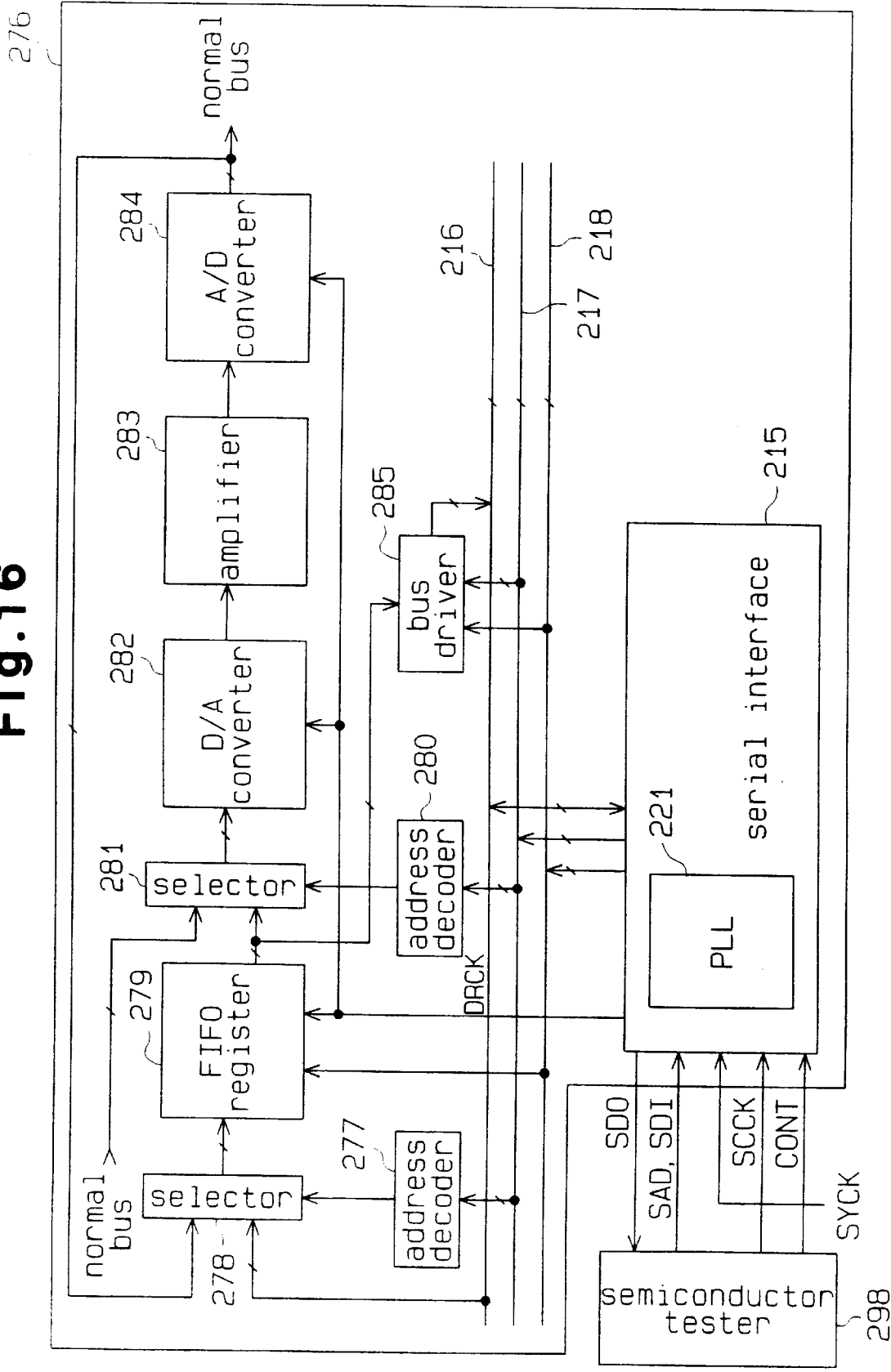
FIG. 16 is a block diagram showing a semiconductor IC device according to the sixth example.

The sixth example of this invention will be described with reference to FIG. 16. For the convenience of description and to avoid redundancy, like or same reference numerals are given to those components which are the same as the corresponding components of the first example. An LSI 276 of the sixth example comprises the serial interface 215, first and second address decoders 277 and 280, first and second selectors 278 and 281, a FIFO register 279 as an input/output data holding circuit, a D/A converter 282, an amplifier 283 as an internal circuit block, an A/D converter 284 and a bus driver 285.

The first address decoder 277 decodes the address signal PAD, supplied via the address bus 217, and supplies a first select signal to the first selector 278. The first selector 278 also receives a digital output data signal from the A/D converter 284, and a digital test data signal PDI on the data bus 216. The first selector 278 selects the test data signal in accordance with a high level first select signal, and selects the digital output data signal in accordance with the low level first select signal. Synchronized with the operation clock signal DRCK from the serial interface 215, the FIFO register 279 sequentially retains the digital output data signals from the first selector 278 and supplies the digital output data signals to the second selector 281 in the retained order.

The second address decoder 280 decodes the address signal PAD, supplied via the address bus 217, and supplies a second select signal to the second selector 281. The second selector 281 receives a digital normal data signal from the internal circuit block (not shown), and a digital output data signal from the FIFO register 279. The second selector 281 selects the digital output data signal in response to a high level second select signal, and selects the digital normal data signal in response to the low level second select signal. The D/A converter 282 converts the digital output data signal from the second selector 281 to an analog data signal, and supplies it to the amplifier 283. The amplifier 283 amplifies the received analog data signal and supplies the amplified analog data signal to the A/D converter 284. In accordance with the operation clock signal DRCK, the A/D converter 284 receives the amplified analog data signal from the amplifier 283 and converts it to a digital data signal. The digital data signal is provided to the first selector 278 and the normal bus. The bus driver 285 is enabled by the address signal PAD and the write clock signal WCK to supply the digital output data signal from the FIFO register 279 onto the data bus 216.

In the test mode of the LSI 276, the first address decoder 277 supplies the high-level first select signal to the first selector 278 in accordance with the address signal PAD. The first selector 278 selects the digital test data signal and sends it to the FIFO register 279. The serial interface 215 selects the write clock signal WCK in accordance with the control signal CONT, and supplies this signal WCK as the operation clock signal DRCK to the FIFO register 279. The FIFO register 279 sequentially retains the test data signal PDI from the first selector 278 at a low speed synchronized with the operation clock signal DRCK.

The serial interface 215 selects the test clock signal TCK in accordance with the changed control signal CONT and outputs it as the operation clock signal DRCK. The FIFO register 279 supplies the retained test data signals PDI to the second selector 281 one by one at a high speed close to the real operation speed, synchronized with the operation clock signal DRCK (i.e., the test clock signal TCK). When the second address decoder 280 supplies the high-level second select signal to the second selector 281 in accordance with the changed address signal PAD, the second selector 281 selects the test data signal from the FIFO register 279 and supplies it to the D/A converter 282.

The D/A converter 282 converts the supplied digital test data signal to an analog test data signal and supplies the converted signal to the amplifier 283 synchronized with the operation clock signal DRCK. At that point, the D/A converter 282 performs the analog-digital conversion at a high speed close to the real operation speed. The amplifier 283 amplifies the analog data signal and supplies the amplified signal to the A/D converter 284. Synchronized with the operation clock signal DRCK (i.e., the test clock signal TCK), the A/D converter 284 converts the analog data signal to a digital signal at a high speed close to the real operation speed and outputs the digital data signal. The first address decoder 277 supplies the low-level first select signal to the first selector 278 in accordance with the changed address signal PAD. The first selector 278 selects the digital output data signal from the A/D converter 284, and supplies it to the FIFO register 279. The FIFO register 279 sequentially holds the supplied digital output data signal at a high speed close to the real operation speed synchronized with the operation clock signal DRCK (i.e., the test clock signal TCK).

Then, the serial interface 215 selects the write clock signal WCK in accordance with the changed control signal CONT and outputs the signal WCK as the operation clock signal DRCK. The FIFO register 279 sequentially supplies the retained test data signals to the second selector 281 at a low speed synchronized with the operation clock signal DRCK (i.e., the write clock signal WCK). The bus driver 285 is enabled by the address signal PAD and the write clock signal WCK to supply the parallel output data signal PDO, retained in the FIFO register 279, onto the data bus 216. Synchronized with the scan clock signal SCCK, the serial interface 215 receives the parallel output data signal PDO and converts this signal PDO to a serial output data signal SDO to be supplied to the semiconductor tester 298. In short, according to the sixth example, in the test mode the FIFO register 279 can hold the test data signal at a low speed, the D/A converter 282 can perform the analog digital conversion at a high speed close to the real operation speed and the amplifier 283 can provide the signal amplification at a high speed.

SEVENTH EXAMPLE

Figure 17:
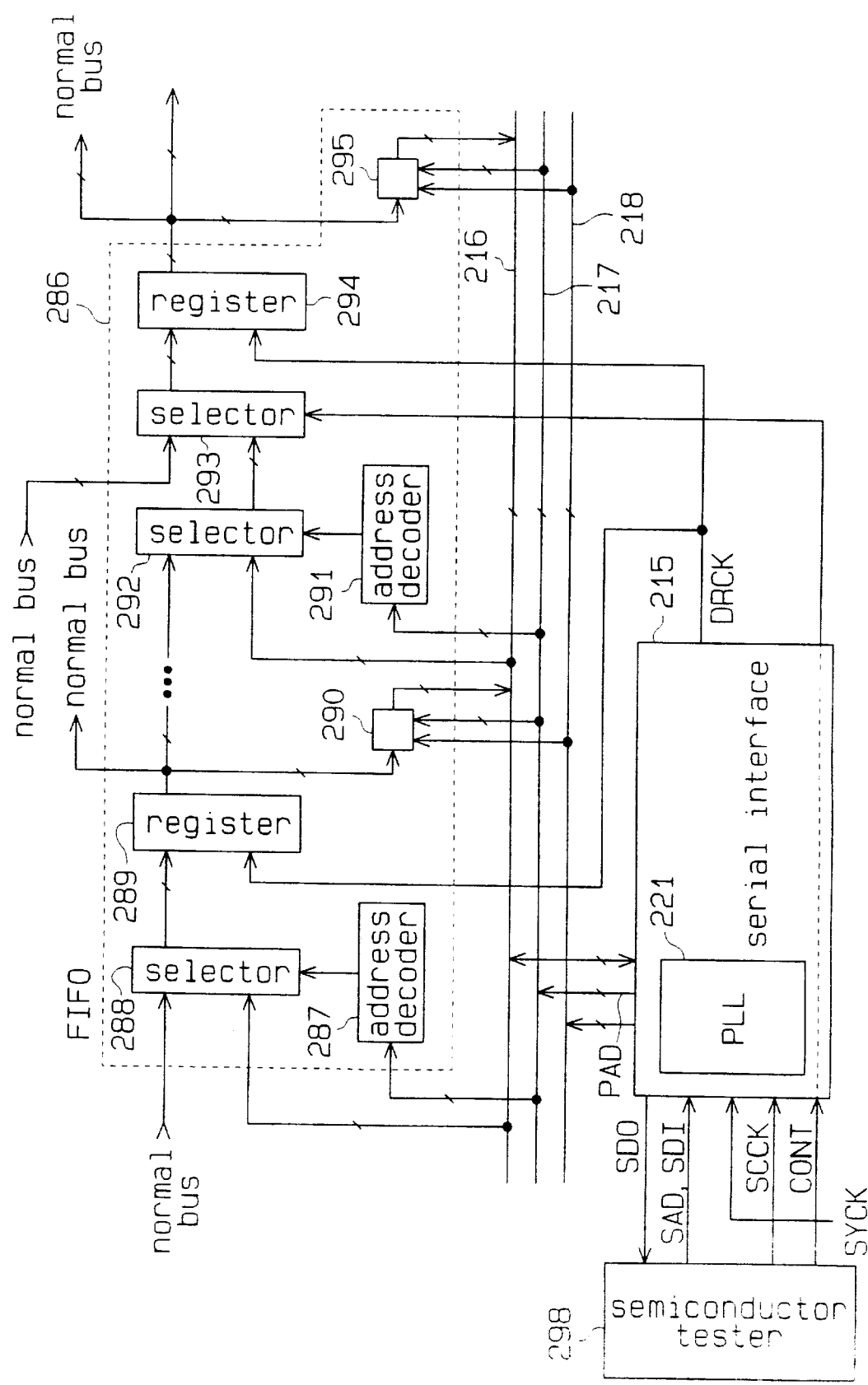
FIG. 17 is a block diagram showing a semiconductor IC device according to the seventh example.

The seventh example of this invention will be described with reference to FIG. 17. FIG. 17 illustrates an LSI which includes a FIFO register 286 usable as the FIFO registers 265, 272 and 279 of FIGS. 14, 15, and 16, respectively. The FIFO register 286 consists of a plurality of address decoders including first and second address decoders 287 and 291, a plurality of registers including first and second registers 289 and 294, a plurality of selectors including first through third selectors 288, 292 and 293, and a plurality of bus drivers including first and second bus drivers 290 and 295. The FIFO register 286 in the seventh example can allow the first and second selectors 288 and 292 to select the test data signal PDI by changing the address signal PAD from the serial interface 215. This function permits the alteration of the operation range of the FIFO register 286 as needed. Further, the FIFO register 286 consists of circuit elements on the LSI, thus helping to keep the LSI from becoming larger.

The first and second address decoders 287 and 291 decode the address signal PAD, supplied via the address bus 217, and respectively supply first and second control signals to the associated first and second selectors 288 and 292. The first selector 288 receives a normal data signal from the internal circuit block (not shown) and the test data signal PDI on the data bus 216. The first selector 288 selects the test data signal in response to a high level first select signal, and selects the normal data signal in response to the low level first select signal. The first register 289 holds the output data signal from the first selector 288 synchronized with the operation clock signal DRCK from the serial interface 215.

The second selector 292 receives an output data signal from a register (not shown) which has the same structure as the first register 289 and the test data signal PDI on the data bus 216. The second selector 292 selects the test data signal in response to a high level second select signal, and selects the output data signal from the register in response to the low level second select signal. The first bus driver 290 is enabled by the address signal PAD and the write clock signal WCK to supply the output data signal from the first register 289 onto the data bus 216.

The third selector 293 receives the normal data signal from the internal circuit block (not shown) and the output data signal from the second selector 292. In accordance with the control signal CONT supplied from the serial interface 215, the third selector 293 selects the output data signal in the test mode, and selects the normal data signal in the normal operation mode. The second register 294 holds the output data signal from the third selector 293 synchronized with the operation clock signal DRCK. The second bus driver 295 is enabled by the address signal PAD and the write clock signal WCK to supply the output data signal from the register 294 onto the data bus 216.

The serial interface 215 in the first through seventh examples may be used as a network interface in a network such as a LAN (Local Area Network). This feature permits any computer connected to the network to perform an LSI test.

Third Embodiment

Figure 18:
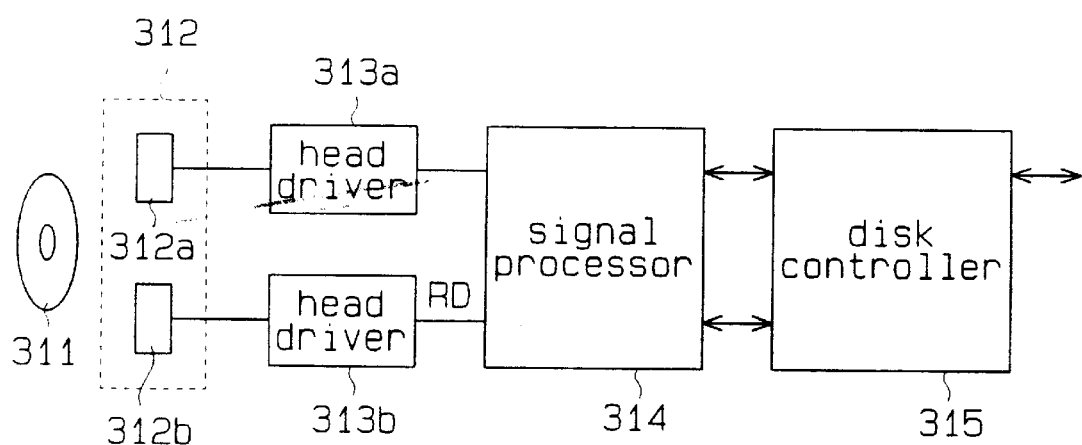
FIG. 18 is a block diagram showing the basic structure of a magnetic disk apparatus.

The third embodiment of the present invention will be now described with reference to FIGS. 18 through 25. FIG. 18 presents a block diagram showing a magnetic disk apparatus. The magnetic disk apparatus comprises a motor (not shown) for rotating a magnetic disk 311 as a recording medium, a drive head 312, first and second head drivers 313a and 313b, a signal processor 314 and a disk controller 315. The drive head 312 has a thin-film head 312a for data writing and an MR head 312b for data reading, which are movable in the radial direction of the magnetic disk 311. The thin-film head 312a writes write data, supplied from the signal processor 314 via the first head driver 313a, onto the magnetic disk 311. The MR head 312b reads data recorded on the magnetic disk 311, and supplies a read signal RD to the signal processor 314 via the second head driver 313b. The signal processor 314 processes the read signal RD and sends the processed read signal to the disk controller 315 as an external device. The signal processor 314 further processes the write data signal supplied from the disk controller 315, and supplies the processed write data signal to the thin-film head 312a via the first head driver 313a.

Figure 19:
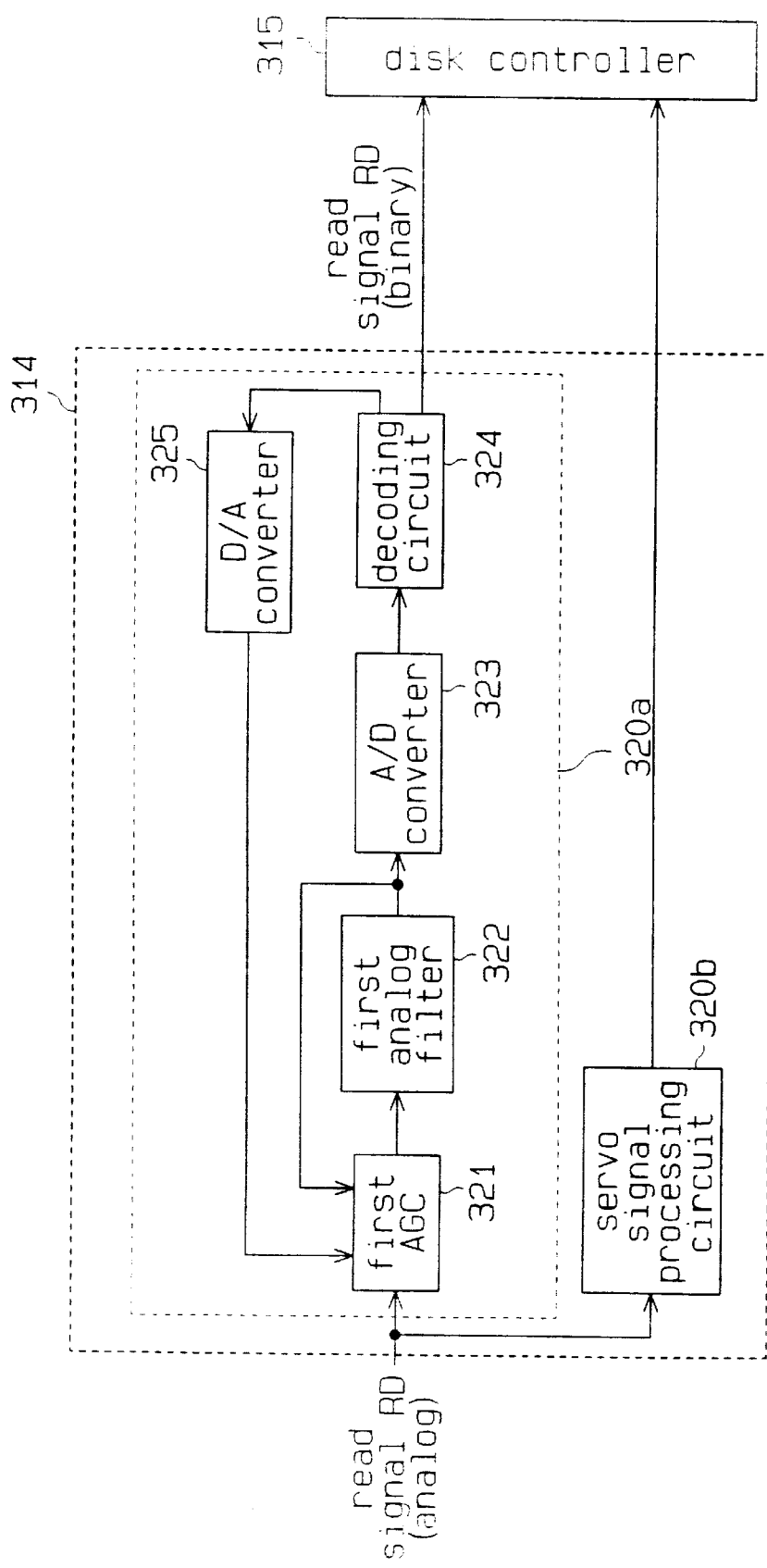
FIG. 19 is a block diagram illustrating a signal processor according to the third embodiment of this invention.
Figure 25:
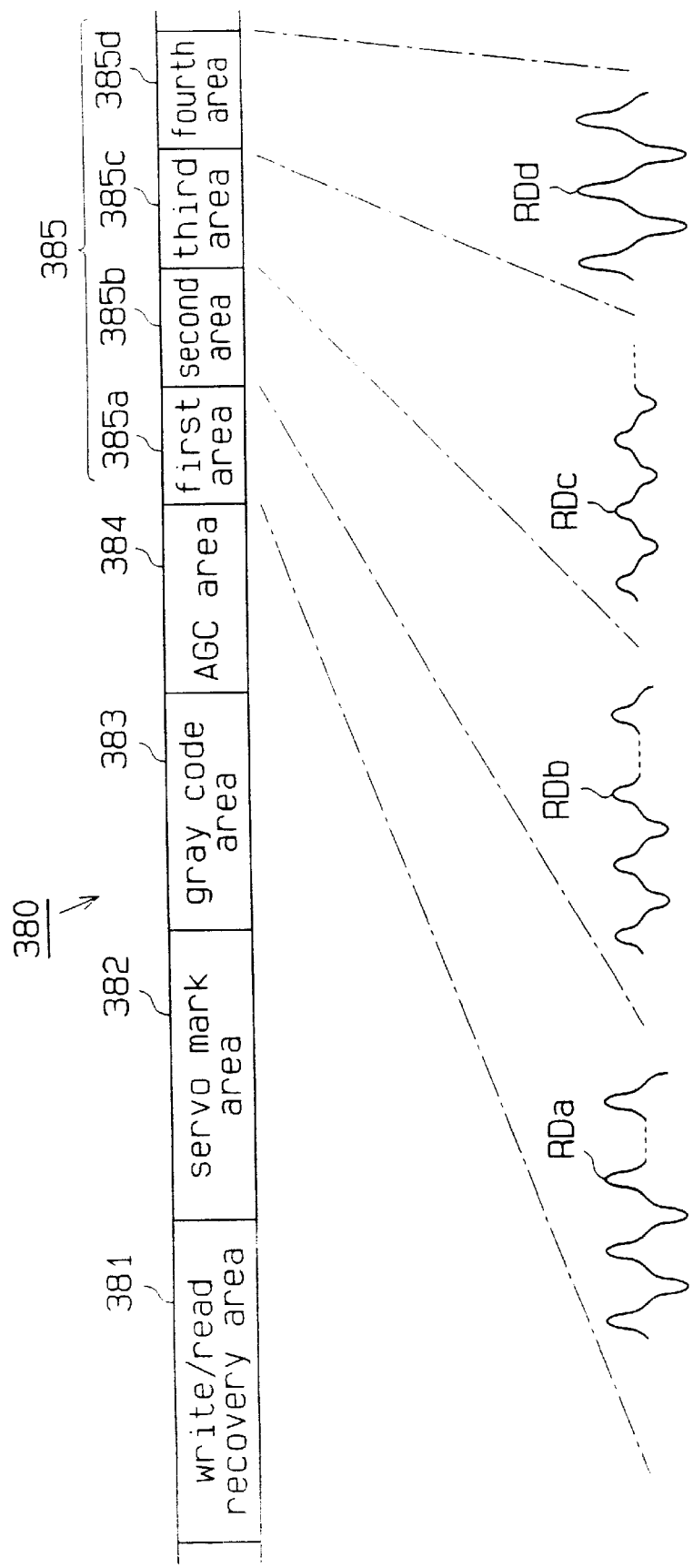
FIG. 25 is a diagram illustrating the format of a servo area defined on a magnetic disk.

FIG. 19 presents a block diagram illustrating the signal processor 314. The signal processor 314 includes a signal processing circuit (hereinafter called "data circuit") 320a and a servo signal processing circuit (hereinafter called "servo circuit") 320b. The data circuit 320a processes the read signal RD so that the disk controller 315 can extract a user data signal from the read signal RD. The servo circuit 320b processes a servo signal included in the read signal so that the disk controller 315 can perform the track servo of the magnetic disk 311. User data is recorded in a plurality of data areas-defined on the magnetic disk 311, and the read signal RD which is associated with the user data has a high frequency characteristic. Servo data is recorded in a plurality of servo areas defined on the magnetic disk 311, and the read signal RD which is associated with the servo data has a low frequency characteristic. As shown in FIG. 25, each servo area 380 includes a write/read recovery area 381, a servo mark area 382, a Gray code area 383, an AGC area 384 and a position area 385, which consists of first through fourth areas 385a through 385d.

As shown in FIG. 19, the data circuit 320a includes a first auto gain control amplifier (AGC) 321, a first analog filter 322, an A/D converter 323, a decoding circuit 324 and a D/A converter 325. The first AGC 321 receives an analog read signal RD from the MR head 312b (see FIG. 18 ), and amplifies the read signal RD so as to enhance the high frequency characteristic of that signal RD. That is, the first AGC 321 has a frequency characteristic suitable for amplifying the high frequency area signal. The first AGC 321 also controls the signal amplification factor according to a level control signal, supplied from the decoding circuit 324 via the D/A converter 325, and a first filtered read signal supplied from the first analog filter 322. The first analog filter 322 cuts off the unnecessary frequency component (which is higher than the frequency band of the user data signal) included in the amplified analog read signal RD. Therefore, the combination of the first AGC 321 and the first analog filter 322 is suitable for acquiring the user data signal which has a high frequency characteristic and a high signal precision. The A/D converter 323 converts the first analog filtered read signal to a digital signal and supplies the digital signal to the decoding circuit 324. The decoding circuit 324 produces a binary read signal RD according to the digital signal and detects the level and phase of the produced read signal RD. The binary read signal RD is supplied to the disk controller 315, which extracts a user data signal from the received binary read signal RD.

Figure 20:
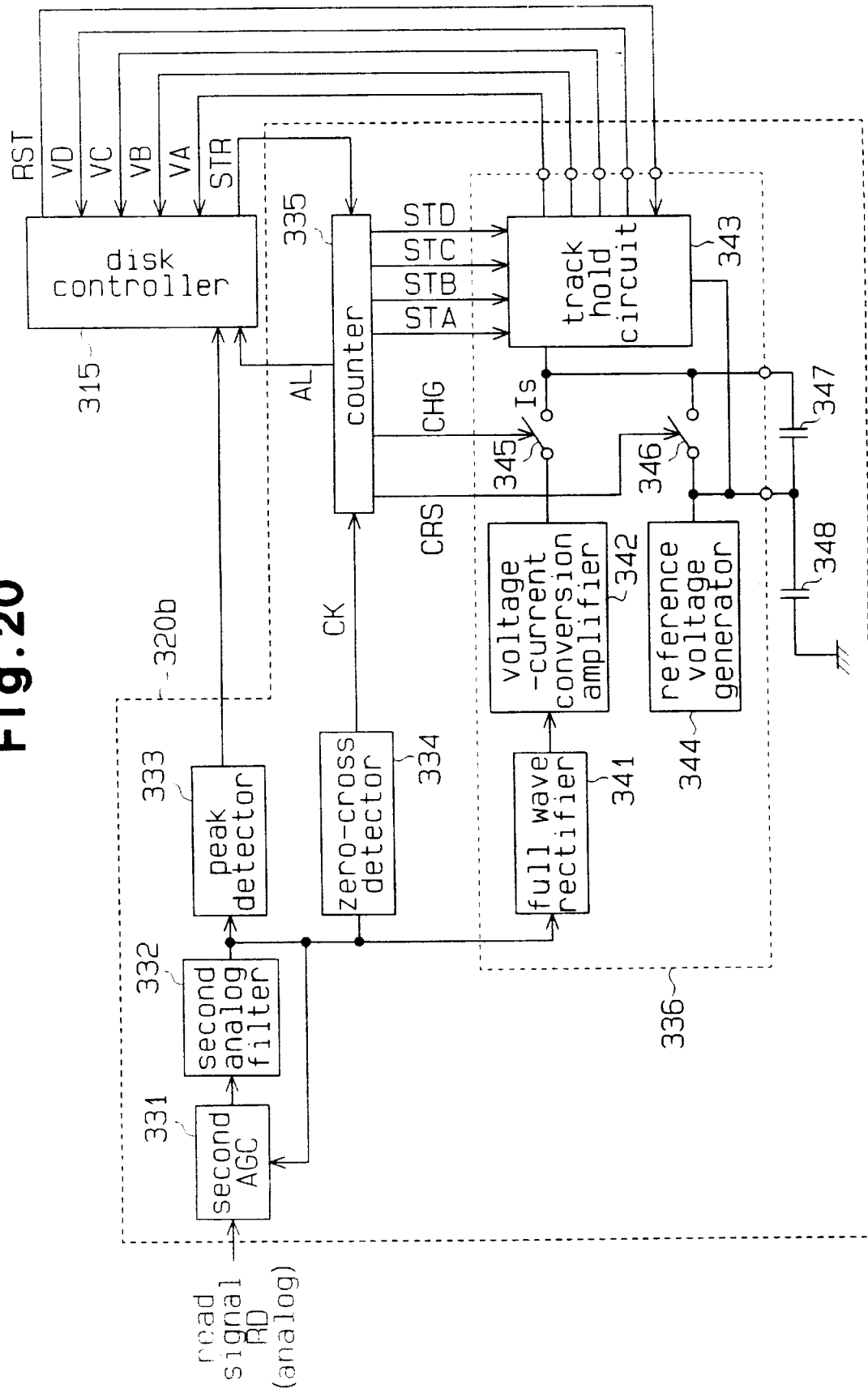
FIG. 20 is a block diagram showing a servo signal processor according to the third embodiment of this invention.

FIG. 20 shows the block circuit of the servo circuit 320b. The servo circuit 320 b includes a second AGC 331, a second analog filter 332, a peak detector 333, a zero-cross detector 334, a counter 335 as a first control circuit, and an integration circuit 336 as a second control circuit. The second AGC 331 receives the read signal RD from the MR head 312b, and amplifies an analog servo signal so as to enhance the low frequency characteristic of that signal RD. That is, the second AGC 331 has a frequency characteristic suitable for amplifying the low frequency area signal. The second AGC 331 also controls the signal amplification factor according to the level of a second filtered read signal supplied from the second analog filter 332. The second analog filter 332 cuts off the unnecessary frequency component (which is higher than the frequency band of the servo signal) included in the amplified analog read signal RD. Therefore, the combination of the second AGC 331 and the second analog filter 332 is suitable for acquiring the servo signal which has a low frequency characteristic and a high signal precision. The first and second analog filters 322 and 332 may have a boost characteristic for enhancing a specific frequency component for waveform equalization.

According to this third embodiment, as discussed above, the data circuit 320 a has the first AGC 321 and first analog filter 322 which are suitable for acquiring a user data signal. The servo circuit 320b has the second AGC 331 and second analog filter 332 which are suitable for acquiring a servo signal. The data circuit and the servo circuit in the conventional signal processor share a single AGC and a single analog filter, so that the frequency characteristic of the AGC and the cutoff frequency of the analog filter are changed in accordance with the servo operation or the user data processing operation. Because both the data circuit and the servo circuit in the signal processor of this third embodiment each have an AGC and an analog filter, it is unnecessary to alter the frequency characteristic and the cutoff frequency. This feature can reduce the time needed to otherwise alter the frequency characteristic and the cutoff frequency, thus improving the data signal processing speed. This feature also reduces the load on the controller which controls the AGC and analog filter.

The peak detector 333 receives the servo signal from the second analog filter 332 and detects the peak value of the level of the Gray code signal included in that servo signal. The Gray code, which is recorded in the Gray code area 383 of the servo area 380, represents the number of a track on the magnetic disk 311. The peak detector 333 supplies the result of the peak detection of the Gray code to the disk controller 315. Based on the detection result, the disk controller 315 identifies the number of the track on the magnetic disk 311 where the drive head 312 is currently passing. The peak detector 333 also detects the peak value of a servo mark signal included in the servo signal. The servo mark, which is recorded in the servo mark area 382, represents the beginning of a sector. The peak detector 333 supplies the result of the peak detection of the servo mark signal to the disk controller 315. In accordance with the detection result, the disk controller 315 computes the read timings of the first through fourth position data signals recorded in the first through fourth areas 385a–385d, and supplies the computation result as a servo strobe signal STR to the counter 335. This servo strobe signal STR is used for determination of the timing to start the integration of the first through fourth position data signals by the integration circuit 336. The first through fourth position data signals indicate information about the position of the drive head 312 relative to a track. The disk controller 315 accesses the target track on the magnetic disk 311 based on the integrated values of the first through fourth position data signals.

Figure 22:
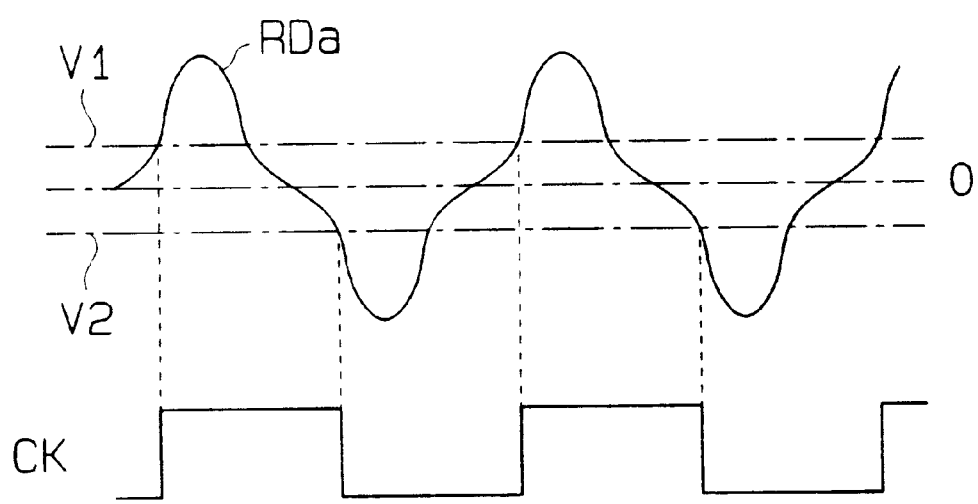
FIG. 22 is a waveform chart used for explaining the operation of a zero-cross detector in the servo signal processor.

The zero-cross detector 334 receives the analog servo signal RD from the second analog filter 332, and periodically produces a clock signal CK in accordance with the first through fourth position data signals RDa–RDd (see FIG. 25) in that servo signal. The produced clock signal CK is supplied to the counter 335. FIG. 22 illustrates the generation of the clock signal CK by the zero-cross detector 334 in accordance with the first position data signal RDa associated with the first area 385a. This clock signal CK has a pulse which rises when the voltage level of the first position data signal RDa becomes equal to or greater than a first reference voltage V1, and falls when that voltage level becomes equal to or smaller than a second reference voltage V2. The first through fourth position data signals RDa-RDd show different amplitude values and integrated values in accordance with the position of the MR head 312b relative to the track.

Figure 23:
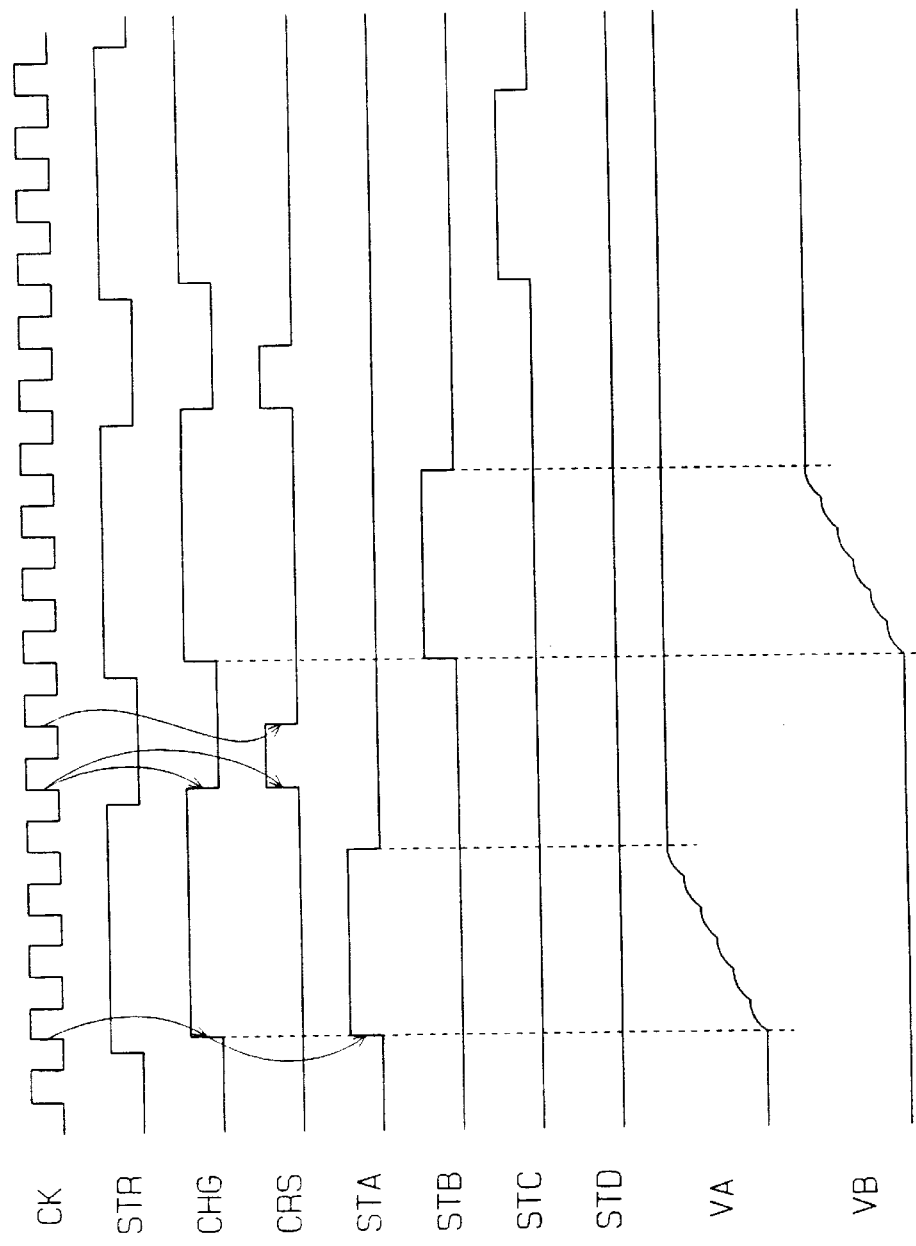
FIG. 23 is a time chart used for explaining the operation of an integration circuit in the servo signal processor.

As further shown in FIG. 20, the counter 335 receives the clock signal CK from the zero-cross detector 334 and the servo strobe signal STR from the disk controller 315. In this third embodiment, the clock signals CK for six periods correspond to each of the first through fourth position data signals, as shown in FIG. 23. The disk controller 315 outputs the servo strobe signal STR whose pulse rises immediately before the second period of each clock signal and falls immediately before the sixth period. While the high-level servo strobe signal STR is being supplied, the counter 335 produces a main charge control signal CHG which rises and falls synchronized with the clock signal CK, and supplies this control signal CHG to the integration circuit 336. In other words, the main charge control signal CHG is obtained by sampling the servo strobe signal STR in accordance with both rising and falling edges of the clock signal CK, and is synchronous with the clock signal CK in a half period thereof. In response to the low-level servo strobe signal STR, the counter 335 further produces a main discharge control signal CRS, which is synchronous with the rising of the clock signal CK and corresponds to one period of the clock signal CK, and supplies the control signal CRS to the integration circuit 336.

The counter 335 has an integration number counter and an area designation counter (neither shown). The integration number counter sets its first count value N to a predetermined value ("3" in this case) in response to the rising of the servo strobe signal STR, and decrements the first count value N in synch with the rising of the clock signal CK. The first count value N may be changed to any proper value other than "3". The area designation counter sets its second count value M to a predetermined value ("4" association with the first through fourth areas 385a–385d in this case) in response to the servo strobe signal STR which is associated with the read timing of the first area 385a in the servo area 380. The area designation counter decrements the second count value M in response to the servo strobe signal STR which is associated with the read timings of the second through fourth areas 385b–385d. The counter 335 selectively produces one of first through fourth charge control signals STA through STD according to the second count value M and supplies it to a track hold circuit 343 (which will be discussed later) in the integration circuit 336, until the first count value N becomes 0. More specifically, when the second count value M is "4", the counter 335 produces the first charge control signal STA, which corresponds to the first area 385a and has a pulse width for three periods of the clock signal CK. When the second count value M is "3", the counter 335 produces the second charge control signal STB, which corresponds to the second area 385b and has a pulse width for three periods of the clock signal CK. When the second count value M is "2", the counter 335 produces the third charge control signal STC, which corresponds to the third area 385c and has a pulse width for three periods of the clock signal CK. When the second count value M is "1", the counter 335 produces the fourth charge control signal STD, which corresponds to the fourth area 385d and has a pulse width for three periods of the clock signal CK.

The counter 335 further checks whether the first count value N is "0" or any one of "1" through "3" in response to the falling of the servo strobe signal STR. When the first count value N is "0", the counter 335 determines that the clock signal CK (i.e., the servo signal RD) is properly output.

When the first count value N is any one of "1"through "3", on the other hand, the counter 335 determines that the clock signal CK (or the servo signal RD) is not properly output and an abnormality has occurred. When the latter is the case, the counter 335 stops supplying the first through fourth charge control signals and supplies an abnormal signal AL to the disk controller 315.

The integration circuit 336 includes a full wave rectifier 341, a voltage-current conversion amplifier 342, the aforementioned track hold circuit 343, a reference voltage generator 344, an analog switch for main charging (hereinafter called "main charge switch) 345, and an analog switch for main discharging (hereinafter called "main discharge switch) 346. The full wave rectifier 341 may be replaced with a half wave rectifier. Externally connected to the integration circuit 336 are a main capacitor 347 and a capacitor 348 for the reference voltage, which has a larger capacitance than the main capacitor 347. The main capacitor 347 performs charging while the main charge switch 345 is switched on, and the reference-voltage capacitor 348 stores charges discharged from the main capacitor 347 while the main charge switch 345 is switched off and the main discharge switch 346 is switched on.

The full wave rectifier 341 receives the filtered servo signal RD from the second analog filter 332, and performs the full-wave rectification of the first through fourth position data signals RDa through RDd in that servo signal. The rectified first through fourth position data signals RDa–RDd have voltage levels which have been determined by the positional relationship between the MR head 312b and the track at the time those signals were read.

The voltage-current conversion amplifier 342 receives the full-wave rectified first through fourth position data signals RDa–RDd and produces charge currents IS which have current values proportional to the voltage levels of the respective position data signals. The current value of each charge current IS is determined by the positional relationship between the MR head 312b and the track at the time the associated signal was read. The main capacitor 347 has a positive electrode connected to the voltage-current conversion amplifier 342 via the main charge switch 345 and a negative electrode connected to the ground via the reference-voltage capacitor 348. The main charge switch 345 is switched on in response to the high-level main charge control signal CHG from the counter 335, and is switched off in response to the low-level main charge control signal CHG. While the main charge switch 345 is on, the main capacitor 347 performs charging according to the charge current IS supplied from the voltage-current conversion amplifier 342. The amount of charge in the main capacitor 347 or the charge voltage is proportional to the current value of the charge current IS.

The node between the main capacitor 347 and the reference-voltage capacitor 348 is connected to the reference voltage generator 344. The main discharge switch 346 is connected to the node between the reference voltage generator 344 and the positive electrode of the main capacitor 347. The main discharge switch 346 is switched on in response to the high-level main discharge control signal CRS from the counter 335 the instant that the main charge switch 345 is switched off. The main discharge switch 346 is switched off in response to the low-level main discharge control signal CRS before the main charge switch 345 is switched on. While the main discharge switch 346 is on, the positive electrode of the main capacitor 347 is connected to the positive electrode of the reference-voltage capacitor 348, so that the capacitor 348 stores the charges discharged from the main capacitor 347. As a result, the charge voltage of the reference-voltage capacitor 348 becomes equal to the reference voltage.

The voltage-current conversion amplifier 342 supplies the charge current IS to the track hold circuit 343 through the main charge switch 345.

Figure 21:
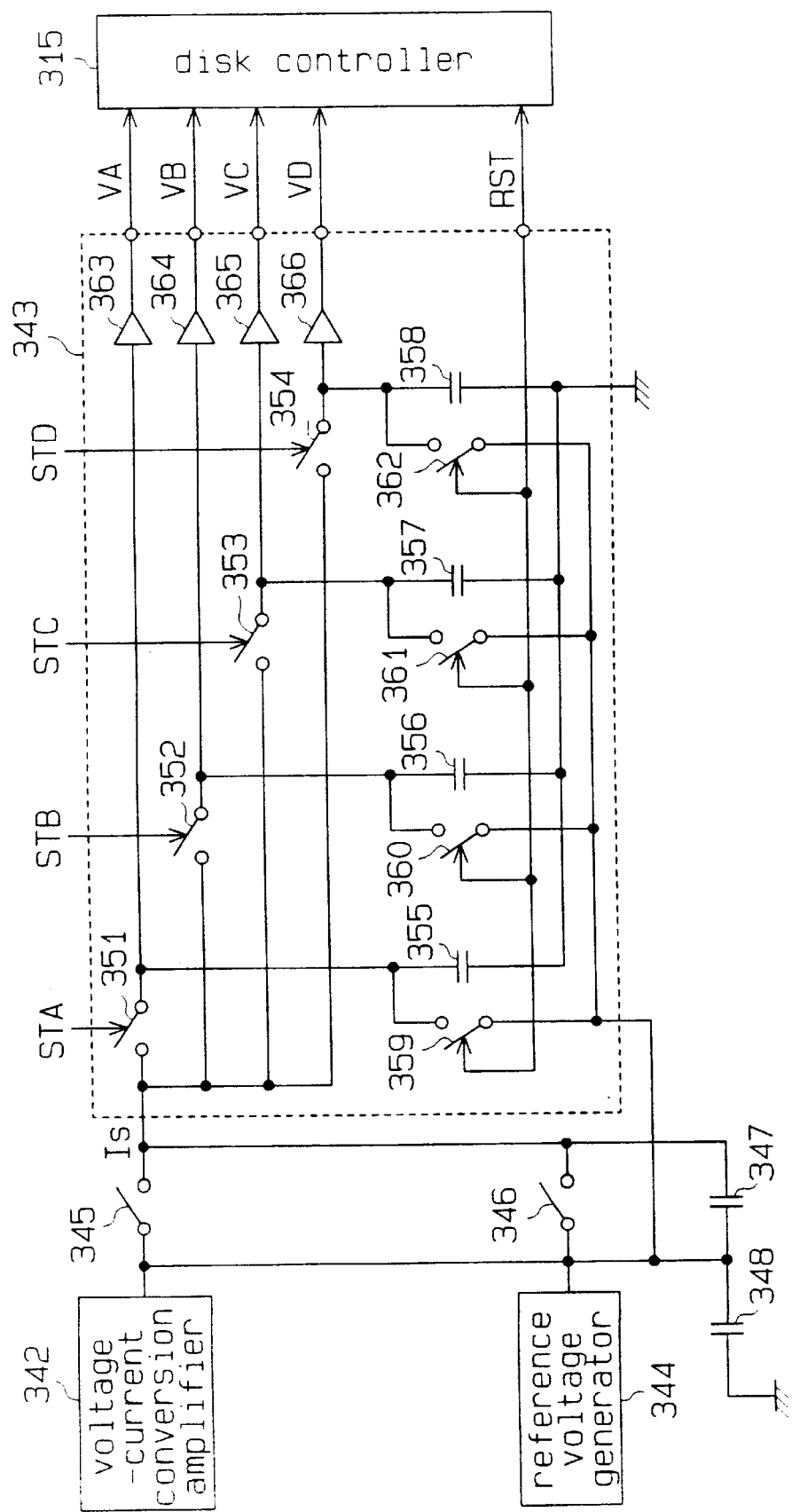
FIG. 21 is a block diagram showing a track hold circuit in the servo signal processor.

As shown in FIG. 21, the track hold circuit 343 includes first through fourth subcharging analog switches (hereinafter called "first through fourth charge switches") 351–354, first through fourth capacitors 355–358, first through fourth subdischarging analog switches (hereinafter called "first through fourth discharge switches") 359–362 and first through fourth voltage follower circuits 363–366.

The first through fourth charge switches 351–354 are switched on for only three periods of the clock signal CK in response to the associated high-level first through fourth charge control signals STA–STD sequentially supplied from the counter 335, and are switched off in response to the associated low-level first through fourth charge control signals STA–STD. The counter 335 supplies the first through fourth charge control signals STA–STD respectively to the first through fourth charge switches 351–354 at the same time the main charge control signal CHG is output. The first through fourth capacitors 355–358 have positive electrodes respectively connected to the first through fourth charge switches 351–354, and negative electrodes connected to the ground. Therefore, the first through fourth capacitors 355–358 are connected in parallel to the main capacitor 347. In this third embodiment, the first through fourth capacitors 355–358 have the same capacitance which is one-fortieth of the capacitance of the main capacitor 347. This design shortens the discharge times of the first through fourth capacitors 355–358, thus contributing to the improvement of the servo signal processing speed.

While the first charge switch 351 is being switched on in response to the high-level first charge control signal STA, the first capacitor 355 together with the main capacitor 347 performs charging with the charge current IS. At that time, the charge current IS corresponds to the first position data signal RDa of the first area 385 a. The first voltage follower circuit 363 supplies the charge voltage signal VA (see FIG. 23) of the first capacitor 355 to the disk controller 315. While the second charge switch 352 is being switched on in response to the high-level second charge control signal STB, the second capacitor 356 together with the main capacitor 347 performs charging with the charge current IS. The charge current IS at that time corresponds to the second position data signal RDb of the second area 385b. The second voltage follower circuit 364 supplies the charge voltage signal VB of the second capacitor 356 to the disk controller 315. While the third charge switch 353 is being switched on in response to the high-level third charge control signal STC, the third capacitor 357 together with the main capacitor 347 performs charging with the charge current IS. At that time, the charge current IS corresponds to the third position data signal RDc of the third area 385c. The third voltage follower circuit 365 supplies the charge voltage signal VC of the third capacitor 357 to the disk controller 315. While the fourth charge switch 354 is being switched on in response to the high-level fourth charge control signal STD, the fourth capacitor 358 together with the main capacitor 347 performs charging with the charge current IS. The charge current IS at that time corresponds to the fourth position data signal RDd of the fourth area 385d. The fourth voltage follower circuit 366 supplies the charge voltage signal VD of the fourth capacitor 358 to the disk controller 315.

The first discharge switch 359 is connected between the positive electrode of the first capacitor 355 and the positive electrode of the reference-voltage capacitor 348. The second discharge switch 360 is connected between the positive electrode of the second capacitor 356 and the positive electrode of the reference-voltage capacitor 348. The third discharge switch 361 is connected between the positive electrode of the third capacitor 357 and the positive electrode of the reference-voltage capacitor 348. The fourth discharge switch 362 is connected between the positive electrode of the fourth capacitor 358 and the positive electrode of the reference-voltage capacitor 348. The first through fourth discharge switches 359–362 are switched on in response to a high-level reset signal RST from the disk controller 315, and are switched off in response to the low-level reset signal RST. The reset signal RST falls immediately before the main charge control signal CHG, associated with the first area 385a, rises, and rises at the same time the main discharge control signal CRS, associated with the fourth area 385d, falls. Therefore, the first through fourth discharge switches 359–362 are switched on after the charge voltage signals VA–VD of the first through fourth capacitors 355–358 are all supplied to the disk controller 315. In this manner, the first through fourth capacitors 355–358 discharge so as to perform charging with new charge currents IS associated with the next first through fourth areas 385–385d.

In the servo circuit 320b shown in FIG. 20, the second analog filter 332 receives the read signal from the second AGC 331, which has a low frequency characteristic, and cuts off the unnecessary frequency component from the read signal so as to acquire the servo signal. The full wave rectifier 341 performs full wave rectification on the first position data signal RDa included in the filtered servo signal, and supplies the rectified first position data signal RDa to the voltage-current conversion amplifier 342. At the same time, the zero-cross detector 334 produces the clock signal CK in accordance with the first position data signal RDa and supplies it to the counter 335. The counter 335 receives the first servo strobe signal STR from the disk controller 315 and supplies the high-level main charge control signal CHG, synchronous with the clock signal CK, to the main charge switch 345. The main charge switch 345 is switched on in response to the high-level main charge control signal CHG to allow the charge current IS to flow to the main capacitor 347 from the voltage-current conversion amplifier 342. Consequently, the main capacitor 347 charges.

The integration number counter in the counter 335 sets the first count value N to "3" in response to the servo strobe signal STR, and the area designation counter sets the second count value M to "4". Based on both values N and M, the counter 335 supplies the high-level first charge control signal STA to the first charge switch 351 of the hold circuit 343. Again referring to FIG. 21, the first charge switch 351 is switched on in response to the high-level first charge control signal STA to permit the charge current IS to flow to the first capacitor 355 from the voltage-current conversion amplifier 342. As a result, the first capacitor 355 performs charging for three periods of the clock signal CK. That is, the first position data signal RDa associated with the first area 385a is integrated.

When the charging for three periods of the clock signal CK is completed and the first count value N becomes "0", the counter 335 outputs the low-level first charge control signal STA to set off the first charge switch 351. At that time, the first capacitor 355 is retaining the charge voltage VA equivalent to the integrated value of the first position data signal RDa. Next, the counter 335 outputs the low-level servo strobe signal STR to set off the main charge switch 345, and then outputs the high-level main discharge control signal CRS (see FIG. 20) to switch on the main discharge switch 346. Consequently, the charging of the main capacitor 347 is stopped and the discharging is initiated. This discharging operation continues until the main capacitor 347 arrives at the initial charge state.

When the second position data signal RDb associated with the second area 385b is output from the second analog filter 332, the full wave rectifier 341 performs full wave rectification to supply the position data signal RDb to the voltage-current conversion amplifier 342. The zero-cross detector 334 produces the clock signal CK in accordance with the second position data signal RDb and supplies it to the counter 335.

The counter 335 supplies the high-level main charge control signal CHG to the main charge switch 345, again in response to the high-level second servo strobe signal STR supplied from the disk controller 315. Consequently, the main charge switch 345 is switched on and the main capacitor 347 performs charging with the charge current IS supplied from the voltage-current conversion amplifier 342. The integration number counter in the counter 335 resets the first count value N to "3" in response to the high-level servo strobe signal STR, and the area designation counter decrements the second count value M to "3" from "4". Based on both values N and M, the counter 335 supplies the high-level second charge control signal STB to the second charge switch 352. As a result, the second charge switch 352 is switched on and the second capacitor 356 together with the main capacitor 347 performs charging with the charge current IS, supplied from the voltage-current conversion amplifier 342, for three periods of the clock signal CK. That is, the second position data signal RDb associated with the second area 385b is integrated.

When the charging is completed and the first count value N becomes "0", the counter 335 outputs the low-level second charge control signal STB to switch off the second charge switch 352. At that time, the second capacitor 356 is retaining the charge voltage VB equivalent to the integrated value of the second position data signal RDb.

Thereafter, the third capacitor 357 likewise retains the charge voltage VC equivalent to the integrated value of the third position data signal RDc associated with the third area 385c. The fourth capacitor 358 retains the charge voltage VD equivalent to the integrated value of the fourth position data signal RDd associated with the fourth area 385d. When the charge voltages (integrated values) VA-VD are respectively retained in the first through fourth capacitors 355–358, the first through fourth voltage follower circuits 363–366 supply the charge voltages VA-VD to the disk controller 315.

According to this third embodiment, as apparent from the above, the first through fourth capacitors 355–358 perform charging with the charge current IS in parallel with the charging by the main capacitor 347. This permits the detection of the integrated values in a short period of time. In other words, the integrated value of the first position data signal RDa can be acquired quickly before the second position data signal Rdb is supplied following the first position data signal RDa. It is therefore possible to avoid a delay in the detection of the integrated value and speed up the signal processing. Further, the shortening of the detection time permits the amounts of data recorded in the first through fourth areas 385a–385d to be reduced, with the result that the amount of the magnetic disk 311 occupied by the servo area 380 can be reduced while increasing the amount occupied by the user data area. The conventional integration circuit temporarily transfers the charges in the main capacitor to another capacitor to execute recharging. This conventional recharging is troublesome because the charging operation should be performed twice.

Next, the disk controller 315 outputs the high-level reset signal RST to set the first through fourth charge switches 359–362. To effect the integration of the next position area 385, the first through fourth capacitors 355–358 execute discharging and return to the initial states (uncharged states). The disk controller 315 determines the positional relations between the drive head 312 and the track based on the individual charge voltages VA-VD, and carries out the servo operation for the tracking operation based on the result of the determination.

Figure 24:
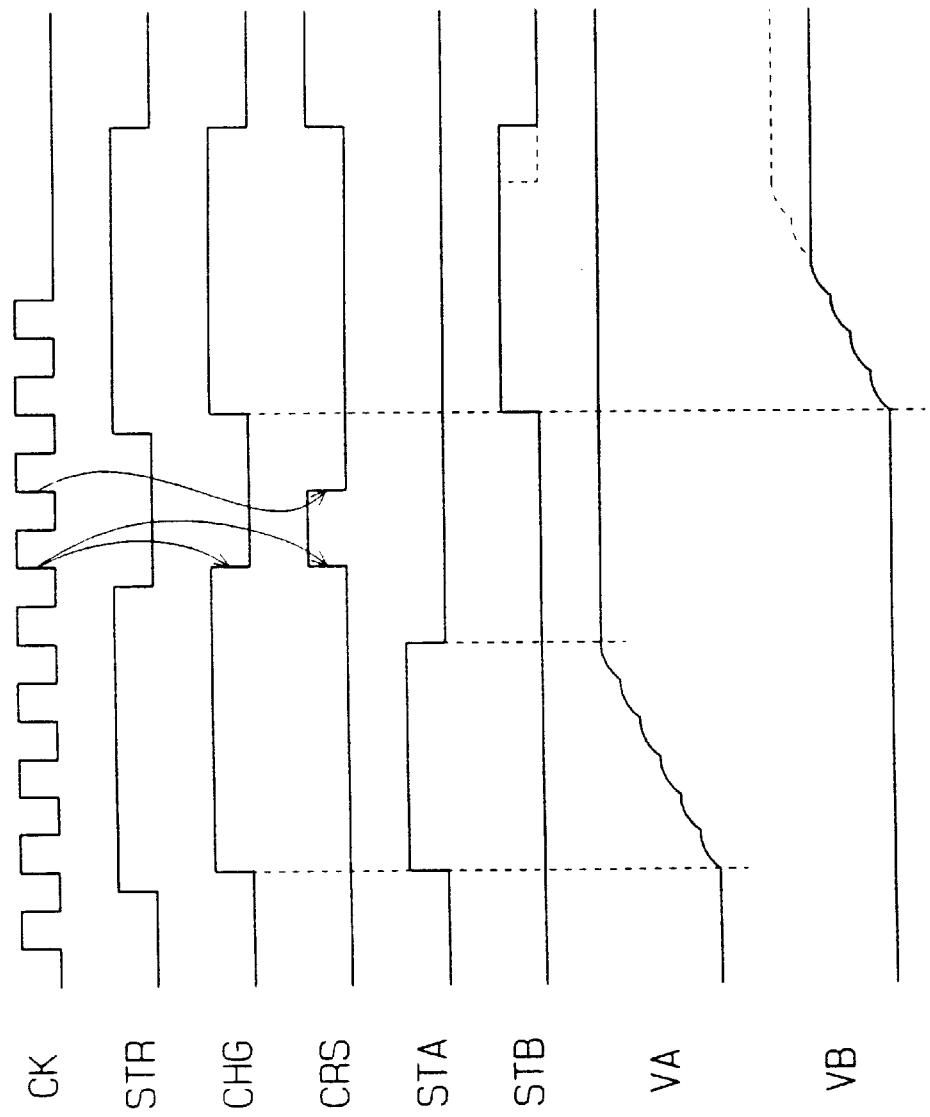
FIG. 24 is a time chart used for explaining the operation of the integration circuit when an abnormality occurs.

A description will now be given of the case where the position data signal associated with at least one of the first through fourth areas 385a–385d has not been read out. Suppose that the second position data signal RDb associated with the second area 385b has not been read out with the high-level second charge control signal STB supplied to the track hold circuit 343 from the counter 335. As shown in FIG. 24, the zero-cross detector 334 cannot produce the clock signal CK in such a way that no clock signal CK is supplied to the counter 335. Therefore, the integration number counter in the counter 335 does not decrement the first count value N and holds the value N of one of "1" to "3".

When the low-level servo strobe signal STR is supplied to the counter 335 from the disk controller 315, the counter 335 checks whether the first count value N is "0" or one of "1" through "3". Because the first count value N is one of "1" through "3", not "0", in this case the counter 335 determines an abnormality has occurred and forcibly supplies the low-level second charge control signal STB to the track hold circuit 343 and the abnormal signal AL to the disk controller 315. As a result, the second charge switch 352 is disabled to inhibit the charging operation. In accordance with the abnormal signal AL, the disk controller 315 stops receiving the charge voltages VA–VD (or the integrated values) associated with the first through fourth areas 385a–385d and supplies the reset signal RST in order to execute the integrating operations associated with the new first through fourth areas 385a–385d. This control prevents the servo control of the disk controller 315 from malfunctioning.

This invention may be adapted to a signal processor which is incorporated in other disk apparatuses than the magnetic disk apparatus, such as an optical disk apparatus.

Fourth Embodiment

FIRST EXAMPLE

Figure 26:
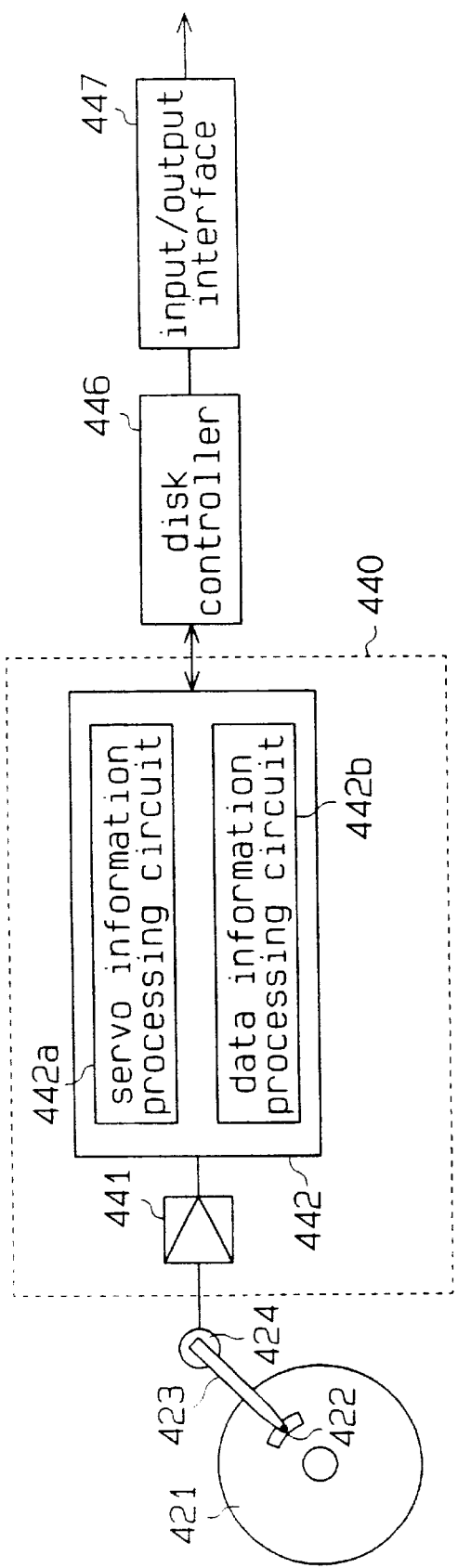
FIG. 26 is a schematic block circuit diagram of a magnetic disk drive according to the fourth embodiment of this invention.

The first example of the fourth embodiment according to the present invention will now be described referring to FIGS. 26 through 29. FIG. 26 presents a block diagram of a magnetic disk drive according to the fourth embodiment. The magnetic disk drive comprises a magnetic disk 421 as a recording medium, which is rotated by an unillustrated motor, a drive head 422, a motor 424, and an arm 423 which is respectively coupled at both ends to the drive head 422 and the motor 424. The arm 423 can turn in the forward and reverse directions in accordance with the rotation of the motor 424. The drive head 422 is movable in the radial direction of the magnetic disk 421 in accordance with the turning action of the arm 423. The drive head 422 includes a magnetic head which reads and writes data from and on the magnetic disk 421.

Figure 27:
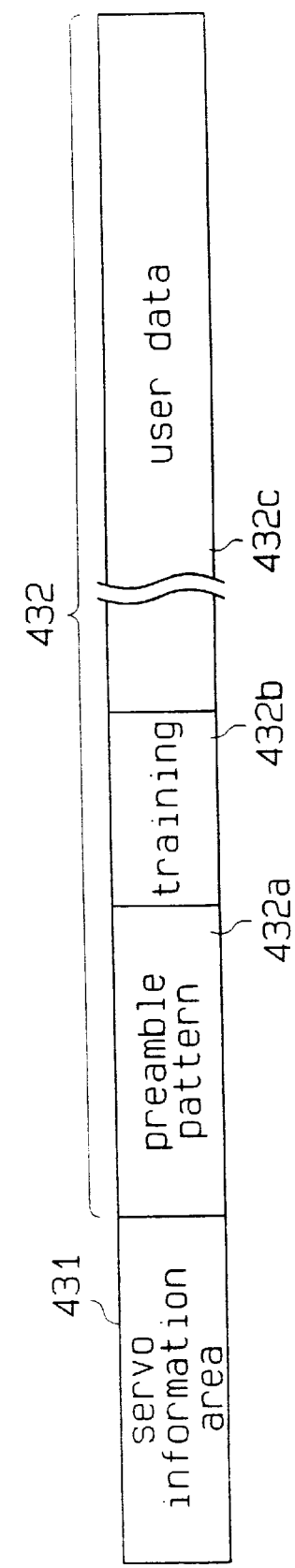
FIG. 27 is a diagram showing the recording format of each sector of a magnetic disk.

The magnetic disk 421 includes a plurality of sectors 430 each consisting of a servo information recording area 431 and a data information recording area 432 as shown in FIG. 27.

The servo information area 431 is the area where servo information associated with each sector 430 is to be recorded. Servo information is used for the servo control to seek a target sector position where the drive head 422 is to be positioned. The data information area 432 includes a preamble section 432a, a training section 432b and a data section 432c where user data is to be recorded. Recorded in the preamble section 432a is a preamble pattern, a part of data information which is used to determine the timing for reading user data. The preamble pattern consists of plural pieces of bit data all having logic 1's, so that the read signal corresponding to the preamble pattern has a sine waveform. Thus, preamble patterns having the same pattern are to be recorded in the preamble sections 432a in the individual sectors 430.

As shown in FIG. 26, the magnetic disk drive further comprises a signal processor 440 which receives the read signal read by the drive head 422, a disk controller 446 and an input/output interface 447. The signal processor 440 includes an amplifier 441 for amplifying the read signal and a signal processing section 442 which receives the amplified read signal. The signal processing section 442 includes a servo information processing circuit 442a and a data information processing circuit 442b. The servo information processing circuit 442a processes the read signal which is associated with servo information read from the servo information area 431. The data information processing circuit 442b processes the read signal which is associated with data information read from the data information area 432.

Figure 28:
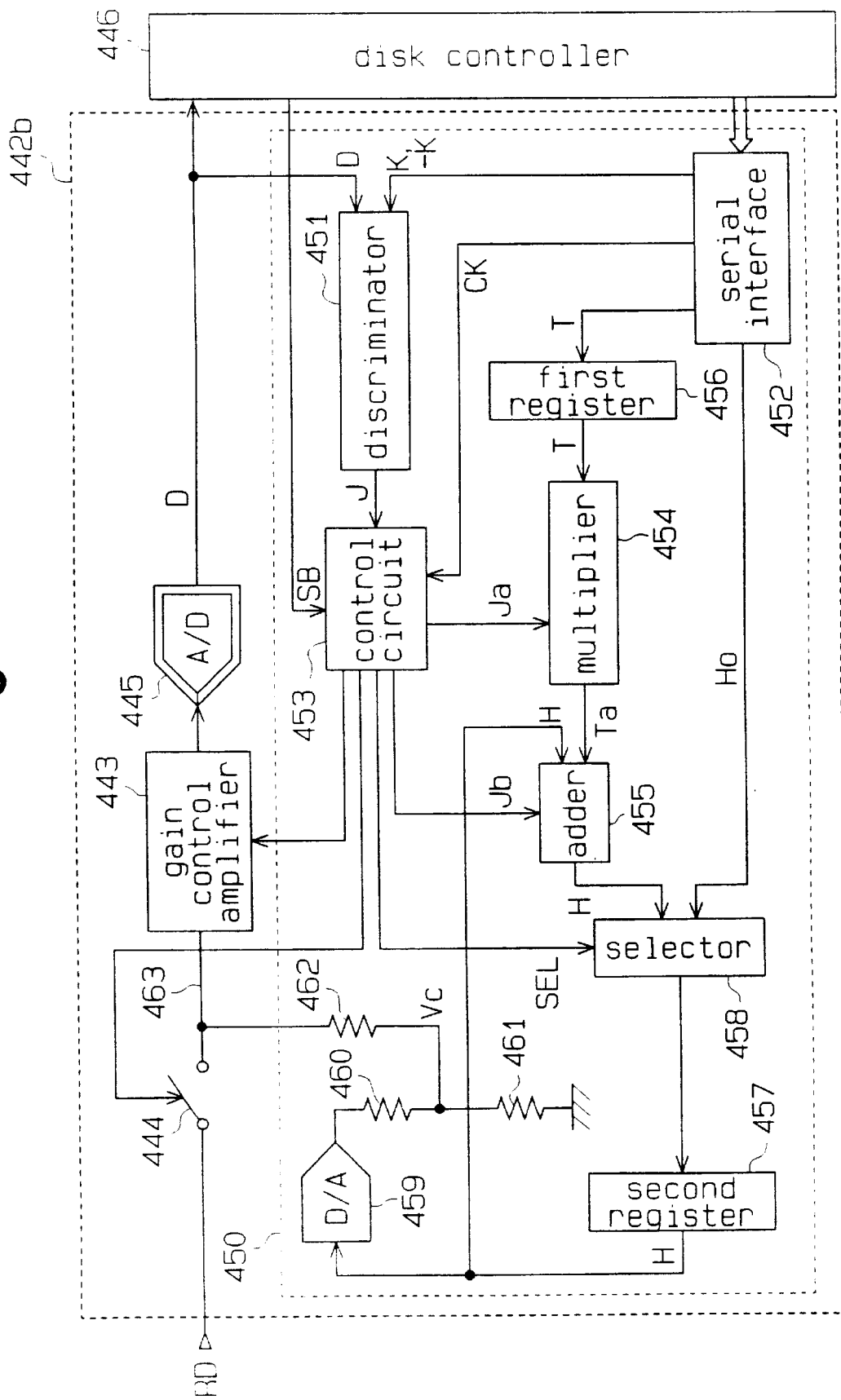
FIG. 28 is a block diagram depicting a data information processor incorporated in the magnetic disk drive according to the first example of the fourth embodiment.

As shown in FIG. 28, the data information processing circuit 442b has a gain control amplifier 443, an A/D converter 445 and an offset cancel circuit 450 for canceling the offset voltage of the A/D converter 445. The gain control amplifier 443 receives the read signal RD via an analog switch 444 and amplifies it. The A/D converter 445 receives the amplified read signal RD as an analog signal from the gain control amplifier 443, and converts the analog read signal to a digital read signal D. According to the first example, the A/D converter 445 converts the analog read signal RD to a 6-bit digital read signal D.

The data information processing circuit 442b has an unillustrated comparator which compares the digital read signal D with a reference signal and produces a binary read signal. This binary read signal is supplied to the disk controller 446. The disk controller extracts user data, recorded in the data section 432c, from the binary read signal, and supplies this user data to an external device (not shown) via the input/output interface 447. The disk controller 446 further extracts the preamble pattern recorded in the preamble section 432a to produce a sampling signal. This sampling signal is supplied to the A/D converter 445, which in turn determines the sampling period in accordance with the sampling signal.

The offset cancel circuit 450 has a discriminator 451, a serial interface 452, a control circuit 453, a multiplier 454, an adder 455, first and second registers 456 and 457, a selector 458, a D/A converter 459, and first through third resistors 460, 461 and 462. The multiplier 454 and adder 455 constitute an arithmetic operation unit. The first and second resistors 460 and 461 constitute a frequency-dividing circuit. The discriminator 451 receives the 6-bit digital read signal supplied from the A/D converter 445, and 6-bit offset allowance signals K and –K supplied via the serial interface 452 from the disk controller 446. According to the first example, the allowance values K and –K are "1" and "–1" in the decimal notation.

When –K<D<K (–1<D<1 in the decimal notation), the discriminator 451 produces a judgment signal J indicative of "0" and supplies this judgment signal J to the control circuit 453. When D≦–K (D≦–1 in the decimal notation), the discriminator 451 produces a judgment signal J indicative of "1" and supplies this judgment signal J to the control circuit 453. When K≦D (1≦D in the decimal notation), the discriminator 451 produces a judgment signal J indicative of "–1" and supplies this judgment signal J to the control circuit 453.

The control circuit 453 is connected to the analog switch 444, the gain control amplifier 443, the serial interface 452, the multiplier 454, the adder 455 and the selector 458, and controls those components. The control circuit 453 sets the offset cancel mode in response to a high-level servo control signal SB from the disk controller 446. In the offset cancel mode, the control circuit 453 switches off the analog switch 444 such that it does not supply the read signal RD to the gain control amplifier 443. In response to a control signal from the control circuit 453, the gain control amplifier 443 selectively switches between a first amplification factor (normal one) and a second amplification factor which is twice as high as the first amplification factor. The second amplification factor may be changed to any desired magnification of the first amplification factor, such as 1.5 times, 3 times, or the like.

In the cancel mode, the control circuit 453 produces first and second arithmetic-operation control data signal Ja and Jb in accordance with the judgment signal J from the discriminator 451, and supplies the first arithmetic-operation control data Ja to the multiplier 454 and the second arithmetic-operation control data Jb to the adder 455. When the judgment signal J indicates "1" or "−1" and a control signal associated with the first amplification factor is output, the control circuit 453 produces the first arithmetic-operation control data Ja indicative of "1". When the judgment signal J indicates "1" or "−1" and a control signal associated with the second amplification factor is output, the control circuit 453 produces the first arithmetic-operation control data Ja indicative of "1/2." When the judgment signal J indicates "0", the control circuit 453 produces the first arithmetic-operation control data Ja indicative of "0". When the judgment signal J indicates "−1" or "0", the control circuit 453 produces the second arithmetic-operation control data Jb indicative of "−1". When the judgment signal J indicates "1", the control circuit 453 produces the second arithmetic-operation control data Jb indicative of "1".

The first register 456 temporarily holds an offset unit change T supplied via the serial interface 452 from the disk controller 446, and supplies this change T to the multiplier 454. The multiplier 454 multiplies the offset unit change T, retained in the first register 456, by the first arithmetic-operation control data Ja, and supplies the multiplication result to the adder 455. When the first arithmetic-operation control data Ja is "1", the multiplier 454 supplies a multiplication result Ta (=1×T) to the adder 455. When the first arithmetic-operation control data Ja is "1/2", the multiplier 454 supplies a multiplication result Ta (=(1/2)×T=T/2) to the adder 455. When the first arithmetic-operation control data Ja is "0", the multiplier 454 supplies a multiplication result Ta (=0×T=0) to the adder 455. The adder 455 adds the multiplication result Ta (T, T/2 or 0) and a cancel accumulation value H, retained in the second register 457, in accordance with the second arithmetic-operation control data Jb, and supplies the addition result to the selector 458. When the second arithmetic-operation control data Jb is "1", the adder 455 supplies the addition result (=H+Ta) as a new cancel accumulation value H to the selector 458. When the second arithmetic-operation control data Jb is "−1", the adder 455 performs the addition after changing the multiplication result Ta to a negative value and supplies the addition result (=H−Ta) as a new cancel accumulation value H to the selector 458.

The selector 458 receives an initial value H0 from the serial interface 452 and the addition result from the adder 455 or a new cancel accumulation value H, and selectively supplies one of them to the second register 457 in response to a select signal SEL from the control circuit 453. The initial value H0 is supplied to the serial interface 454 from the disk controller 446 at the same time as the setting of the cancel mode is initiated. More specifically, the control circuit 453 supplies the select signal SEL for the initial value H0 to the selector 458 at the same time as the setting of the cancel mode is initiated, after which the control circuit 453 supplies the select signal SEL for the new cancel accumulation value H to the selector 458. Therefore, the second register 457 temporarily holds the initial value H0 at the same time as the setting of the cancel mode is started, and then holds the accumulation value H from the adder 455.

The D/A converter 459 receives the cancel accumulation value H from the second register 457 and converts it to an analog voltage. This analog voltage increases in proportion to the cancel accumulation value H. The first and second resistors 460 and 461, which are connected between the output terminal of the D/A converter 459 and the ground, frequency-divide the analog voltage. The node voltage (frequency-divided voltage) between the first and second resistors 460 and 461 is determined by the resistance ratio of the first resistor 460 to the second resistor 461. This node voltage (frequency-divided voltage) is applied as an offset cancel voltage Vc via the third resistor 462 to a signal line 463, which connects the analog switch 444 to the gain control amplifier 443. This allows the potential of the signal line 463 to be altered by the offset cancel voltage Vc.

The operation of the offset cancel circuit 450 will be now described. In the servo control mode, the disk controller 446 supplies the high-level servo control signal SB to the data information processing circuit 442b. The control circuit 453 switches off the analog switch 444 and sets the cancel mode in response to the high-level servo control signal SB. Thus, the read signal RD is not supplied to the gain control amplifier 443 of the data information processing circuit 442b. The servo information processing circuit 442a processes servo information, which is included in the read signal RD and has been read from the servo information area 431 in the accessed sector 430.

In the cancel mode, the second register 457 retains the initial value H0 (e.g., H0=0) supplied via the serial interface 452 and selector 458 from the disk controller 446. The initial value H0 may be previously set to an arbitrary offset cancel voltage. The first register 456 retains the offset unit change T, supplied via the serial interface 452 from the disk controller 446. The discriminator 451 receives the offset allowance values K and −K supplied from the disk controller 446 and the digital value D supplied from the A/D converter 445. At this time, the voltage of the signal line 463 is 0 volts because of no read signal RD supplied. The digital value D is therefore 0 unless the A/D converter 445 has an offset voltage.

First Offset Canceling Operation

Suppose that the A/D converter 445 has a negative offset voltage and has output a digital value D equal to or smaller than the offset allowance value −K. That is, the A/D converter 445 has the input/output characteristic as indicated by a broken line L3 in the graph in FIG. 29 due to the negative offset voltage −Δβ. In that case, the discriminator 451 supplies the judgment signal J of "1" to the control circuit 453. In accordance with the judgment signal J of "1", the control circuit 453 supplies the first arithmetic-operation control data Ja of "1" to the multiplier 454 and the second arithmetic-operation control data Jb of "1" to the adder 455. The multiplier 454 supplies the multiplication result Ta (=T), acquired by multiplying the offset unit change T by the first arithmetic-operation control data Ja of "1", to the adder 455. The adder 455 supplies the addition result, acquired by the addition of the multiplication result Ta (=T) and the cancel accumulation value H (H=the initial value H0=0 in this case), to the second register 457 via the selector 458 as a new cancel accumulation value H (=T) in accordance with the second arithmetic-operation control data Jb of "1".

The D/A converter 459 receives the cancel accumulation value H (=T) retained in the second register 457 and converts it to an analog voltage. This analog voltage is frequency-divided by the first and second resistors 460 and 461, and the frequency-divided voltage is applied as the offset cancel voltage Vc to the signal line 463 via the third resistor 462. The voltage of the signal line 463 rises to the offset cancel voltage Vc from 0 volts. The gain control amplifier 443 amplifies the offset cancel voltage Vc, and supplies the amplified voltage signal to the A/D converter 445. The A/D converter 445 converts the amplified analog voltage signal to a digital signal. At this time, the value D of the digital signal increases toward the positive side by the offset cancel voltage Vc. In other words, the digital value D approaches 0. The discriminator 451 receives the digital value D, which has approached 0, from the A/D converter 445.

Second Offset Canceling Operation

When the increased digital value D is still equal to or smaller than the offset allowance value −K, though the above-described offset canceling operation has been carried out, the discriminator 451 supplies the judgment signal J of "1" to the control circuit 453. As a result, the second offset canceling operation is to be executed. In accordance with the judgment signal J of "1", the control circuit 453 supplies the first arithmetic-operation control data Ja of "1" to the multiplier 454 and the second arithmetic-operation control data Jb of "1" to the adder 455. The multiplier 454 supplies the multiplication result Ta (=T) to the adder 455. The adder 455 supplies the addition result, acquired by the addition (T+T) of the multiplication result Ta (=T) and the cancel accumulation value H (=T), to the second register 457 as a new cancel accumulation value H (=2T) in accordance with the second arithmetic-operation control data Jb of "1". The D/A converter 459 converts the new cancel accumulation value H (=2T) to an analog voltage. This analog voltage is frequency-divided by the first and second resistors 460 and 461, and the frequency-divided voltage is applied as the offset cancel voltage Vc to the signal line 463. The offset cancel voltage Vc associated with the second offset canceling operation rises to twice as high as the offset cancel voltage Vc that is associated with the first offset canceling operation.

The gain control amplifier 443 amplifies the increased offset cancel voltage Vc, and outputs an analog voltage signal. The A/D converter 445 receives the analog voltage signal and converts it to a digital signal. At that time, the value D of the digital signal increases toward the positive side in accordance with the offset cancel voltage Vc. That is, the digital value D further approaches 0. Accordingly, the discriminator 451 receives the digital value D, which has further approached 0, from the A/D converter 445.

When the digital value D becomes −K<D<K through the second offset canceling operation, the discriminator 451 supplies the judgment signal J of "0" to the control circuit 453. In accordance with the judgment signal J of "0", the control circuit 453 supplies the first arithmetic-operation control data Ja of "0" to the multiplier 454 and the second arithmetic-operation control data Jb of "1" to the adder 455. The multiplier 454 supplies the multiplication result Ta (=0×T=0), acquired by the multiplication of the offset unit change T by the arithmetic-operation control data Ja of "1", to the adder 455. In accordance with the second arithmetic-operation control data Jb of "1", the adder 455 supplies the addition result, acquired by the addition (0+2T) of the multiplication result Ta (=0) and the cancel accumulation value H (=2T), to the second register 457 via the selector 458 as a new cancel accumulation value H (=2T). In this manner, the voltage applied to the signal line 463 is kept at the offset cancel voltage vc according to the previous cancel accumulation value H (=2T).

Finer Offset Canceling Operation

To execute a finer offset canceling operation, the control circuit 453 supplies the control signal, associated with the second amplification factor (two times the first amplification factor), to the gain control amplifier 443 in accordance with the judgment signal J of "0". The gain control amplifier 443 switches the normal first amplification factor to the second amplification factor in accordance with this control signal, and amplifies the voltage applied to the signal line 463. The A/D converter 445 converts the analog voltage signal, which has been amplified with the second amplification factor, to a digital signal. At this time, the value D of the digital signal (offset voltage) increases toward the negative side in accordance with the voltage which has been amplified (increased) to twice the normal level. Accordingly, the discriminator 451 receives the increased digital value D.

When the digital value D which has increased toward the negative side becomes equal to or smaller than the offset allowance value −K, the discriminator 451 supplies the judgment signal J of "1" to the control circuit 453. In accordance with the judgment signal J of "1", the control circuit 453 supplies the first arithmetic-operation control data Ja of "1/2" to the multiplier 454 and the second arithmetic-operation control data Jb of "1" to the adder 455. The multiplier 454 supplies the multiplication result Ta (=T/2) to the adder 455. The adder 455 supplies the result (T/2+2T) of the addition of the multiplication result Ta (=T/2) and the cancel accumulation value H (=2T) to the second register 457 as a new cancel accumulation value H (=5T/2). The D/A converter 459 converts the new cancel accumulation value H (=5T/2) from the second register 457 to an analog voltage. The analog voltage is frequency-divided by the first and second resistors 460 and 461, and this frequency-divided voltage is applied to the signal line 463. The voltage of the signal line 463 therefore increases in accordance with the new cancel accumulation value H (=5T/2).

The gain control amplifier 443 amplifies the increased offset cancel voltage Vc, and sends the resultant analog voltage signal to the A/D converter 445. The A/D converter 445 converts the analog voltage signal to a digital signal. At this time, the value D of the digital signal increases toward the positive side in proportion to a voltage, higher than the previous offset cancel voltage Vc, which is associated with the second offset canceling operation. That is, the digital value D further approaches 0. Accordingly, the discriminator 451 receives the digital value D, which has further approached 0, from the A/D converter 445.

When the digital value D becomes −K<D<K through the finer offset canceling operation, the discriminator 451 supplies the judgment signal J of "0" to the control circuit 453. In accordance with the judgment signal J of "0", the control circuit 453 supplies the first arithmetic-operation control data Ja of "0" to the multiplier 454 and the second arithmetic-operation control data Jb of "1" to the adder 455. The multiplier 454 supplies the multiplication result Ta (=0×T) to the adder 455. The adder 455 supplies the result (0+5T/2) of the addition of the multiplication result Ta (=0) and the cancel accumulation value H (=5T/2), as a new cancel accumulation value H (=5T/2) to the second register 457 via the selector 458. In this manner, the voltage applied to the signal line 463 is kept at the offset cancel voltage Vc according to the previous cancel accumulation value H (=5T/2). When this state is reached, the control circuit 453 stops the offset canceling operation according to the first example.

When the drive head 422 reaches the target sector 430 under the servo control, the disk controller 446 outputs a low-level servo control signal SB. In response to the low-level servo control signal SB, the control circuit 453 releases the setting of the offset cancel mode. Further, the control circuit 453 continues applying the offset cancel voltage Vc, corresponding to the cancel accumulation value H (=5T/2) stored in the second register 457, to the signal line 463.

This allows the offset voltage of the A/D converter 445 to be canceled with the offset cancel voltage Vc. The control circuit 453 further supplies the control signal associated with the first amplification factor to the gain control amplifier 443 so that the second amplification factor is changed to the first amplification factor.

The control circuit 453 switches on the analog switch 444 so that the read signal RD is supplied via the gain control amplifier 443 to the A/D converter 445. The A/D converter 445 converts the data signal, which is included in the read signal RD and has been recorded in the data information area 432, to a digital read signal RD having a digital value D. At this time, the offset voltage of the A/D converter 445 is canceled with the offset cancel voltage Vc. In the graph given in FIG. 29, therefore, the A/D converter 445 shows the input/output characteristic indicated by a solid line L1 which passes through the origin and shows the input voltage and the output voltage in 1 to 1 correspondence. Consequently, the A/D converter 445 can convert an analog read signal RD to a digital read signal at a very high precision under any circumstances regardless of a productional variation and/or a variation in ambient temperature. Further, the control circuit 453 sets the offset cancel mode every time the servo control mode is repeated. Before the read operation starts, therefore, the offset voltage of the A/D converter 445 is detected and the offset canceling operation is performed. It is thus unnecessary to perform the offset canceling function before factory shipment.

The finer offset canceling operation permits the detection of a finer offset voltage which is equal to or smaller than one LSB (Least Significant Bit) as the resolution of the A/D converter 445. Accordingly, the offset voltage can be canceled at the level equal to or smaller than one LSB, thus ensuring digital conversion at higher precision. The execution of the offset canceling operation during servo control does not affect the processing of data information signals recorded in the data information area 432.

Figure 29:
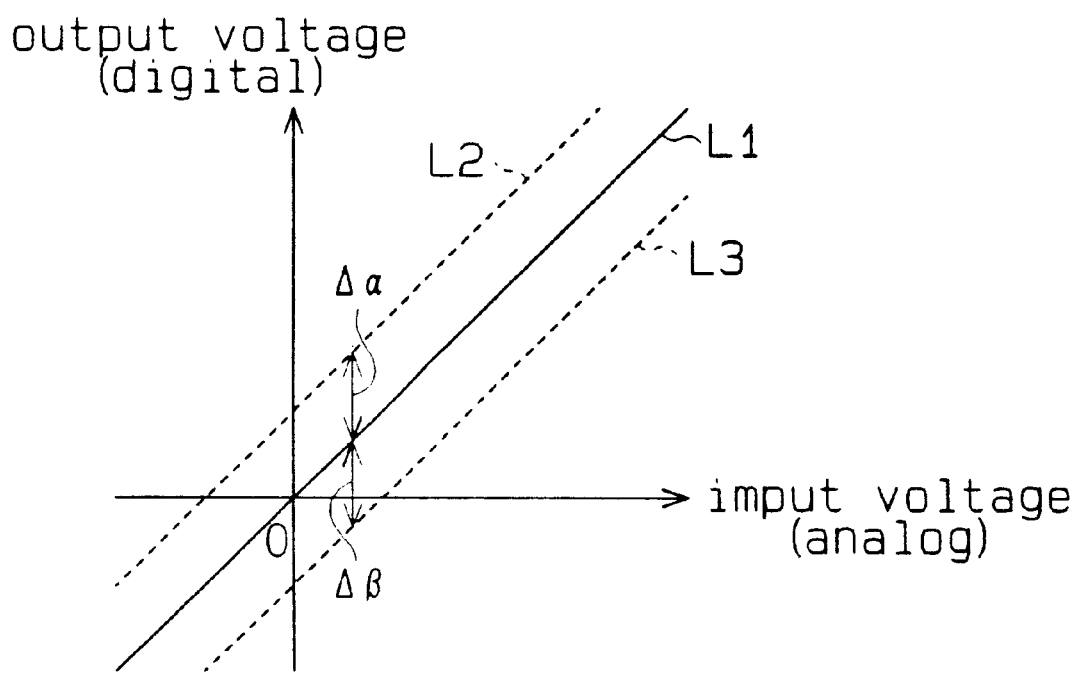
FIG. 29 is a graph illustrating the relationship between the input voltage and output voltage of an A/D converter.

The foregoing description of the offset canceling operation has been given on the premise that the A/D converter 445 has a negative offset voltage indicated by the broken line L3 in FIG. 29. If the A/D converter 445 has the input/output characteristic indicated by a broken line L2 due to a positive offset voltage Δα as shown in FIG. 29, the positive offset voltage can be canceled by producing the negative offset cancel voltage Vc.

SECOND EXAMPLE

The second example of the fourth embodiment of this invention will now be discussed with reference to FIGS. 30 and 31. To avoid redundant description, like or same reference numerals are given to those components which are the same as the corresponding components of the first example.

According to the second example, the preamble pattern recorded in the preamble section 432a located in the data information area 432 is used. The preamble pattern consists of plural pieces of bit data all having logic 1's. Therefore, the read signal RD corresponding to the preamble pattern has a sine waveform, as shown in FIG. 31. This will be discussed below more specifically. The preamble section 432a has a plurality of recording areas for recording multiple pieces of bit data. Each recording area has the center portion magnetized to the strongest magnetism N ("1"), and the boundary portions to the adjoining recording areas magnetized to the weakest magnetism N. Therefore, the waveform of the read signal RD becomes a sine wave which shows the maximum amplitude value at the center portion of each recording area and the minimum amplitude value at the boundary portions of the recording areas. When the A/D converter 445 having no offset voltage converts a read signal to a digital signal, the absolute value of the first digital value corresponding to the maximum amplitude value of the read signal becomes equal to the absolute value of the second digital value corresponding to the minimum amplitude value. When the A/D converter 445 having an offset voltage performs analog-to-digital conversion of a read signal, on the other hand, the absolute value of the first digital value corresponding to the maximum amplitude value does not become equal to the absolute value of the second digital value corresponding to the minimum amplitude value. In that case, half of the sum of the first digital value and the second digital value becomes the offset voltage.

Figure 30:
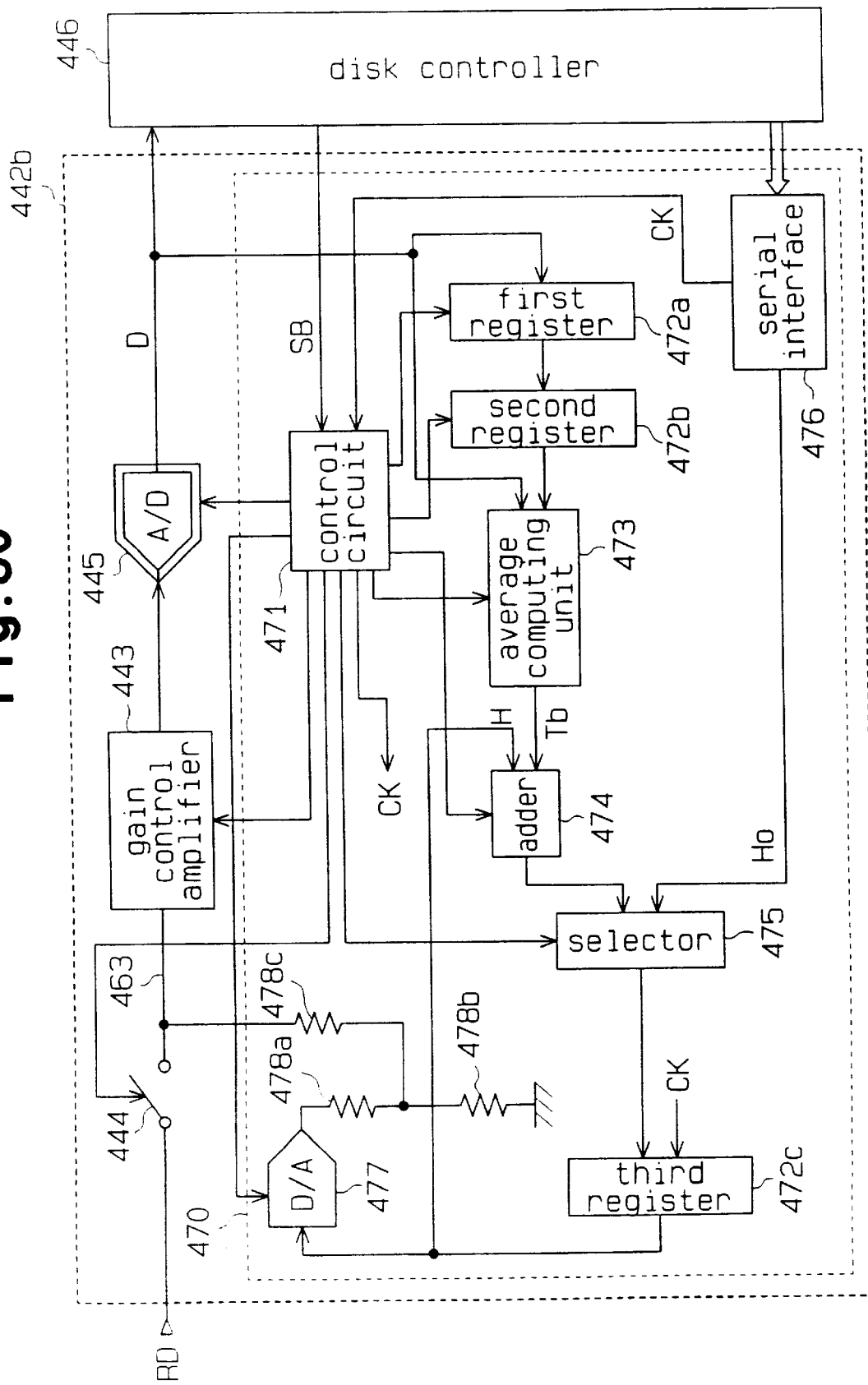
FIG. 30 is a block diagram depicting a data information processor incorporated in the magnetic disk drive according to the second example of the fourth embodiment.

As shown in FIG. 30, an offset cancel circuit 470 according to the second example has a control circuit 471, first through third registers 472a to 472c, an average computing unit 473, an adder 474, a selector 475, a serial interface 476, a D/A converter 477 and first through third resistors 478a to 478c. The first through third registers 472a–472c, the average computing unit 473 and the adder 474 constitute an arithmetic operation unit. The first and second resistors 478a and 478b constitute a frequency-dividing circuit. The control circuit 471, which is connected to the gain control amplifier 443, analog switch 444, average computing unit 473, adder 474 and selector 475, controls those components.

The control circuit 471 serving as a sampling control circuit sets the cancel mode for a given period of time in response to a low-level servo control signal SB from the disk controller 446. During this given period of time, the read signal RD corresponding to the preamble pattern is being output. The control circuit 471 switches off the analog switch 444 in response to the high-level servo control signal SB, while it switches on the analog switch 444 in response to the low-level servo control signal SB. In response to the low-level servo control signal SB, the control circuit 471 further receives a sampling signal CK via the serial interface 476 from the disk controller 446 and supplies the sampling signal CK to the A/D converter 445 and the individual components 472a–472c, 473, 474, 475 and 477 of the offset cancel circuit 470. The A/D converter 445 converts the analog read signal RD to a digital read signal in response to the rising of the sampling signal CK.

Figure 31:
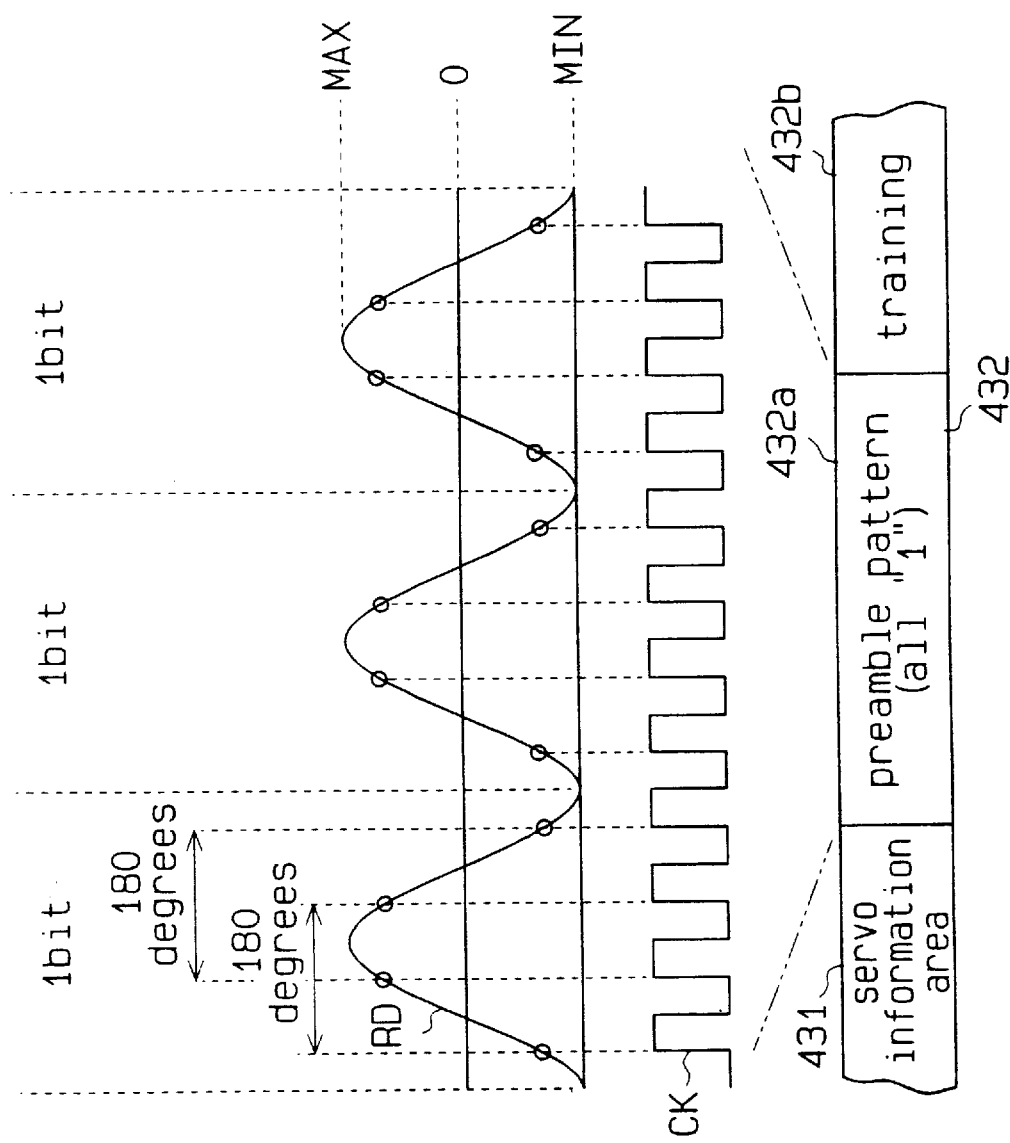
FIG. 31 is a diagram showing a sampling signal and a read signal which is associated with a preamble pattern to be sampled in accordance with this sampling signal.

As shown in FIG. 31, the output timing of the sampling signal CK is previously determined in accordance with the relationship with the read signal corresponding to the preamble pattern. More specifically, the read signal RD in the recording area for 1-bit data is sampled at four points at phase intervals of 90 degrees. Therefore, the sum of an odd-numbered set of the first and third digital values D, sampled at a phase interval of 180 degrees in the A/D converter 445 which has no offset voltage, and the sum of an even-numbered set of the second and fourth digital values D, likewise sampled at a phase interval of 180 degrees, become 0. The sum of an odd-numbered set of the first and third digital values D1 and D3, sampled in the A/D converter 445 which has an offset voltage, and the sum of an even-numbered set of the second and fourth digital values D2 and D4 do not become 0, and a half of each sum becomes the offset voltage.

In response to the sampling signal CK, the first register 472a receives the 6-bit third digital value D3 from the A/D converter 445 and supplies the previously retained second digital value D2 to the second register 472b at the subsequent stage. In response to the sampling signal CK, the second register 472b receives the second digital value D2 from the first register 472a and supplies the previously retained first digital value D1 to the average computing unit 473 at the subsequent stage.

In accordance with the control of the control circuit 471, the average computing unit 473 receives the first digital value D1 from the second register 472b and the third digital value D3 from the A/D converter 445. In other words, the average computing unit 473 receives an odd-numbered set of two digital values D1 and D3, sampled at an interval of 180 degrees. The average computing unit 473 may receive an even-numbered set of two digital values D2 and D4. Those two digital values D are added and the resultant value is then divided by 2, yielding an average value Tb or an offset voltage. This average value Tb becomes 0 for the A/D converter 445 which has no offset voltage, and becomes an offset voltage, not 0, for the A/D converter 445 which has the offset voltage. When the average value Tb is positive, the A/D converter 445 has a positive offset voltage (indicated by the broken line L2 in FIG. 29). When the average value Tb is negative, the A/D converter 445 has a negative offset voltage (indicated by the broken line L3 in FIG. 29). When the first amplification factor of the gain control amplifier 443 is switched to the second amplification factor which is twice as high as the first amplification factor, the average computing unit 473 further halves the average value Tb in accordance with the control signal from the control circuit 471 and supplies the resultant value to the adder 474. The average computing unit 473 inverts the polarity (positive or negative) of the average value Tb or the offset voltage and supplies the result to the adder 474.

The adder 474 adds the average value Tb (offset voltage) and the cancel accumulation value H retained in the third register 472c in response to the sampling signal CK. The adder 474 supplies the addition result (=H±Ta) as a new cancel accumulation value H to the selector 475.

The selector 475 receives the initial value H0 from the serial interface 476 and the addition result from the adder 474 or the new cancel accumulation value H, and supplies one of the received values to the third register 472c in accordance with the select signal SEL from the control circuit 471. The control circuit 471 sends the select signal SEL associated with the selection of the initial value H to the selector 475 at the same time as the setting of the cancel mode is initiated, after which the control circuit 471 supplies the select signal SEL associated with the selection of the new cancel accumulation value H to the selector 475. Therefore, the third register 472c holds the initial value H0 at the same time as the setting of the cancel mode is started, and holds the accumulation value H thereafter. The initial value H0 is output from the disk controller 446 via the serial interface 476 upon the initiation of the setting of the cancel mode.

In response to the sampling signal CK, the third register 472c receives a new cancel accumulation value H and supplies it to the D/A converter 477. The D/A converter 477 converts the cancel accumulation value H to an analog voltage. The first and second resistors 478a and 478b frequency-divide the analog voltage output from the D/A converter 477. The node voltage (frequency-divided voltage) between the first and second resistors 478a and 478b is applied as an offset cancel voltage Vc via the third resistor 478c to the signal line 463, which connects the analog switch 444 to the gain control amplifier 443. This permits the voltage of the signal line 463 to be altered by the offset cancel voltage Vc.

The operation of the data information processing circuit 442b will now be described. At the end of the servo control, the disk controller 446 supplies the low-level servo control signal SB to the data information processing circuit 442b. The control circuit 471 switches the analog switch 444 on in response to this low-level servo control signal SB, and maintains the cancel mode for a given period of time. The A/D converter 445 receives the read signal RD associated with the preamble pattern via the gain control amplifier 443, and converts it to a digital read signal having a digital value D. The disk controller 446 receives the digital read signal associated with the preamble pattern and produces the sampling signal CK. The disk controller 446 sends the sampling signal CK to the control circuit 453 via the serial interface 452 (see FIG. 28), and sends the initial value H0 (e.g., H0=0) to the third register 472c via the serial interface 476 and the selector 475.

In response to the sampling signal CK, the first register 472a receives the first digital value D1 of the digital read signal associated with the preamble pattern from the A/D converter 445. At that time, the control circuit 471 restricts the operations of the average computing unit 473 and the adder 474 until the third digital value D3 is supplied to the first register 472a. When this restriction is released, the average computing unit 473 receives the third digital value D3 and the first digital value D1 already held in the second register 472b, and computes the average value Tb (=(D1+D3)/2). This average value Tb becomes the offset voltage of the A/D converter 445 at that point in time. In this case, it is assumed that the average value Tb is negative because the A/D converter 445 has a negative offset voltage. The average computing unit 473 inverts the polarity of the average value Tb to positive from negative.

The adder 474 sends the value, obtained by the addition (=0+Tb) of the positive average value Tb from the average computing unit 473 and the cancel accumulation value H (H0=0 in this case) already retained in the third register 472c, to the third register 472c via the selector 475.

The D/A converter 477 receives the new cancel accumulation value H (=Tb) retained in the third register 472c and converts it to an analog voltage. The analog voltage is frequency-divided by the first and second resistors 478a and 478b and the frequency-divided voltage is applied as the offset cancel voltage Vc to the signal line 463 via the third resistor 478c. Accordingly, the voltage of the signal line 463 rises to this offset cancel voltage Vc to cancel the offset voltage of the A/D converter 445.

To carry out a finer offset canceling operation, the control circuit 471 then controls the average computing unit 473 and the gain control amplifier 443 in such a manner that the computation of the average value Ta is temporarily stopped and the amplification factor of the gain control amplifier 443 is doubled. The A/D converter 445 converts the read signal RD, which is associated with the preamble pattern and amplified by a factor of two, to a digital signal. The average computing unit 473 acquires the average value Ta (offset voltage) of the first and third digital values of the amplified digital signal output from the A/D converter 445. The average computing unit 473 multiplies the average value Tb by 1/2 and supplies the resultant value to the adder 474. A new offset cancel voltage Vc is obtained based on the half of the average value Tb, and is applied to the signal line 463. It is apparent from the above that the offset cancel voltage Vc acquired based on the read signal which has been amplified by a factor of two is finer than the previous offset cancel voltage. That is, the finer offset canceling operation permits the detection of a fine offset cancel voltage which is equal to or smaller than one LSB, as the resolution of the A/D converter 445. Accordingly, the offset voltage of the A/D converter 445 can be canceled at higher precision.

According to the second example, the control circuit 471 releases the offset canceling operation or the setting of the offset cancel mode when the reading of the preamble pattern ends. Further, the control circuit 471 controls the individual circuits in such a way as to continue applying the offset cancel voltage Vc according to the cancel accumulation value H (=Tb) to the signal line 463. In this manner, the canceling of the offset voltage of the A/D converter 445 with the offset cancel voltage Vc continues. The control circuit 471 outputs the control signal associated with the first amplification factor so that the amplification factor of the gain control amplifier 443 is switched back.

Then, the A/D converter 445 converts the read signals RD associated with the training data and user data which follow the preamble pattern to digital read signals. At this time, the offset voltage is canceled with the offset cancel voltage Vc, and the A/D converter 445 performs the A/D conversion of the read signals in accordance with the input/output characteristic indicated by the solid line L1 in FIG. 29. The A/D converter 445 can therefore convert the analog read signal RD to a digital read signal at a very high accuracy irrespective of a productional variation and/or a variation in ambient temperature.

Thereafter, every time the preamble pattern is read from each sector 430, the control circuit 471 sets the offset cancel mode for a given period of time to execute the offset canceling operation in the above-described manner. This control eliminates the need for checking the offset canceling function before factory shipment of products (magnetic disk drives).

This invention may be adapted to a single signal processor which processes both data information and servo information, instead of the signal processor 440 which includes the data information processing circuit 442a and servo information processing circuit 442b.

The offset cancel voltage Vc may be applied to the signal line between the gain control amplifier 443 and the A/D converter 445, instead of the signal line 463.

This invention may be adapted to an A/D converter incorporated in disk drives other than the magnetic disk drive, such as an optical disk drive, or may be simply adapted to an independent A/D converter.

The offset cancel circuit 450 or 470 may be used to check the offset voltage before factory shipment of the products.

Furthermore, this invention may be adapted to a disk drive of a so-called servo face servo system, which handles disks having no servo information area 431 in each sector.

Fifth Embodiment

Figure 32:
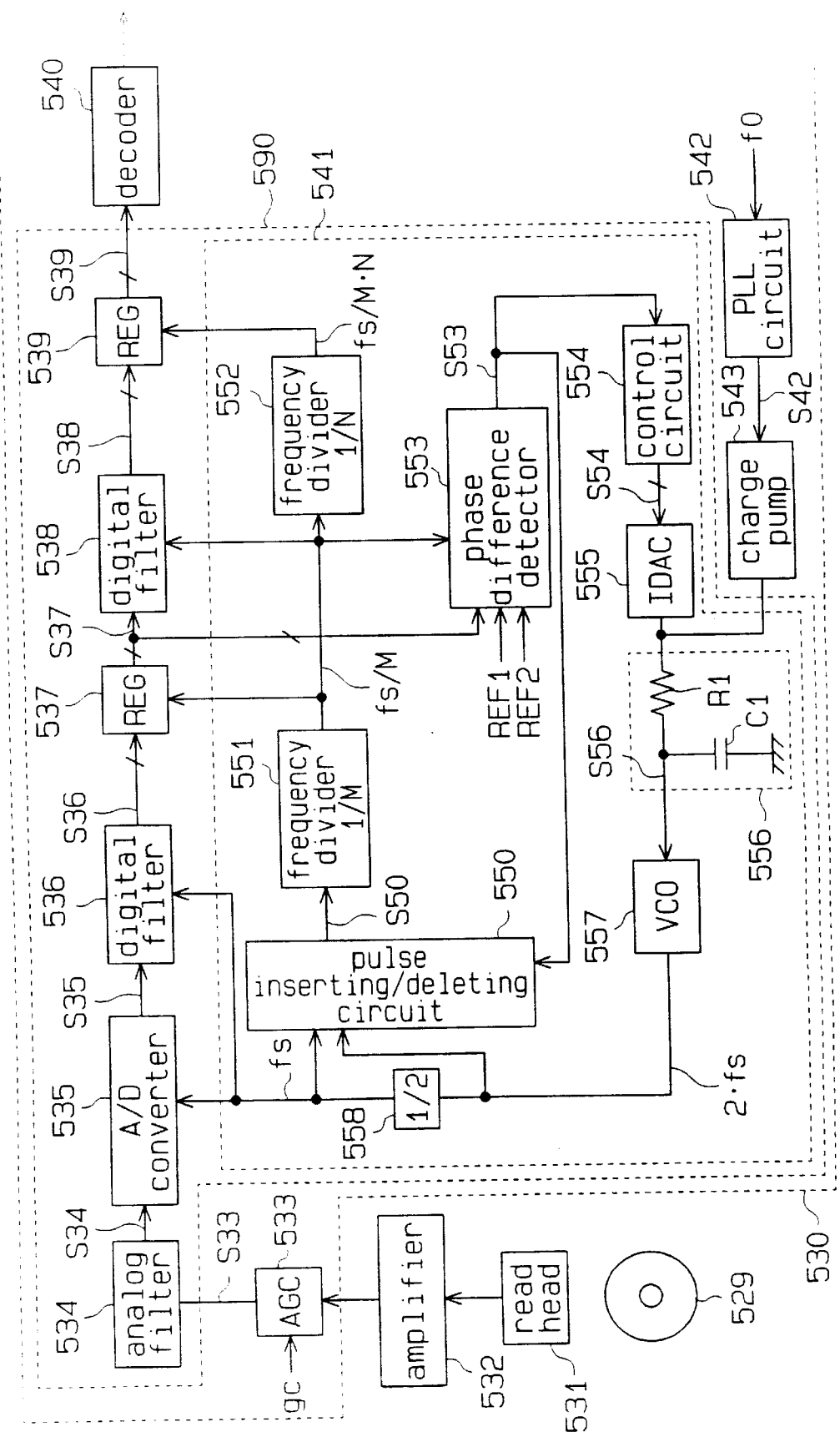
FIG. 32 is a schematic block diagram illustrating a recorded data reproducing apparatus which reads data written on a magnetic disk according to the fifth embodiment of this invention.

The fifth embodiment of this invention will now be described with reference to FIGS. 32 through 40C. As shown in FIG. 32, a recorded data reproducing apparatus comprises a read head 531, an amplifier 532, and a read channel IC 530. The read head 531 reads analog data from a magnetic disk 529 as a recording medium to produce a read analog data signal. The amplifier 532 amplifies the read analog data signal and supplies the amplified signal to the read channel IC 530.

The read channel IC 530 includes an AGC (Auto Gain Control amplifier) 533, which receives the read analog data signal, an over-sampling A/D converter 590, a decoder 540 as a signal processor, a PLL (Phase Locked Loop) circuit 542 and a charge pump 543. The AGC 533 controls the signal gain of the read analog data signal in accordance with a gain compensation signal gc supplied from an external control apparatus (not shown), and supplies the gain-controlled analog data signal S33 having a predetermined level to the over-sampling A/D converter 590.

The over-sampling A/D converter 590 samples the gain-controlled read analog data signal S33 in accordance with a sampling clock signal having a higher frequency than an ordinary clock signal. The over-sampling A/D converter 590 has an analog filter 534, an A/D converter 535, first and second digital filters 536 and 538, first and second down-sampling registers 537 and 539, and a digital phase locked loop (hereinafter called "DPLL") 541. The DPLL 541 produces a first sampling clock signal having a frequency fs, a second sampling clock signal having a frequency fs/M, and a third sampling clock signal (ordinary clock signal) having a frequency fs/(M×N). The first sampling clock signal is supplied to the A/D converter 535 and the first digital filter 536, the second sampling clock signal is supplied to the first sampling register 537 and the second digital filter 538, and the third sampling clock signal is supplied to the second sampling register 539.

The analog filter 534 is a low-order low-pass filter (anti-aliasing filter) and cuts off the unnecessary frequency component (the component with a frequency higher than the frequency band of the read data signal) included in the gain-controlled read analog data signal S33. The analog filter 534 has a cutoff frequency which is half of the sampling frequency of the A/D converter 535. As a result, a filtered read analog data signal S34 is supplied to the A/D converter 535. The A/D converter 535 performs over-sampling of the filtered read analog data signal S34 in accordance with the first sampling clock signal (frequency fs) from the DPLL 541 to produce a 2-bit digital signal having a 2's complement format. In other words, the read analog data signal S34 is converted to a 2-bit digital data signal S35 including a code bit, and this digital data signal S35 is supplied to the first digital filter 536. The production of the 2-bit digital data signal allows the circuit area of the A/D converter 535 to be reduced.

Figure 34A:
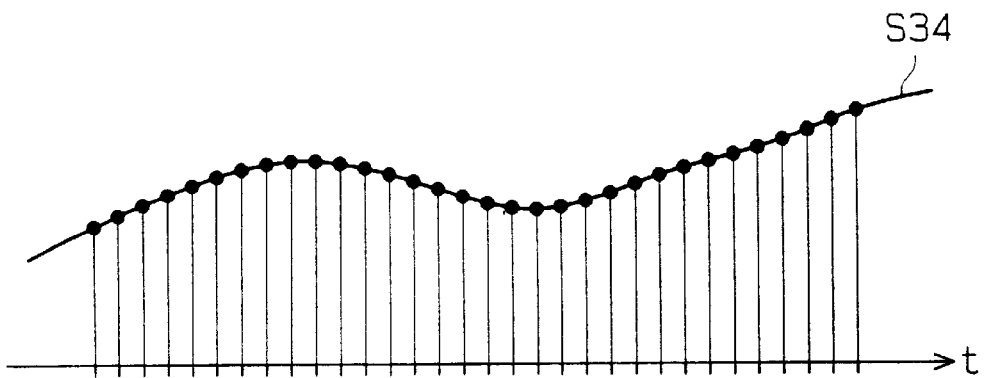
FIG. 34A is a diagram showing over-sampling of a read analog data signal according to a first sampling clock signal.

FIG. 34A illustrates the waveform of the filtered read analog data signal S34 output from the analog filter 534 and the sampling timing of the A/D converter 535. The over-sampling of the A/D converter 535 can permit the use of the low-order analog filter 534 with a simple structure to prevent the circuit area of the A/D converter 535 from increasing. In other words, it is unnecessary to use a high precision (or high-order) analog filter.

The first digital filter 536 is an IIR (Infinite Impulse Response) filter which operates in accordance with a transfer function $\{(1-Z^{-n})/(1-Z^{-1})\}^2$. The coefficient n is a natural number and determined in proportion to an over-sampling ratio. The first digital filter 536 performs digital signal processing on the digital data signal S35 in accordance with the first sampling clock signal (frequency fs) from the DPLL 541 and supplies a first filtered digital data signal S36 to the first sampling register 537. This digital signal processing reduces the quantization noise of the low frequency band in the digital data signal S35 and cuts off the high-frequency component to produce the first filtered digital data signal S36 having multi-bits (4 bits in this fifth embodiment).

Figure 34B:
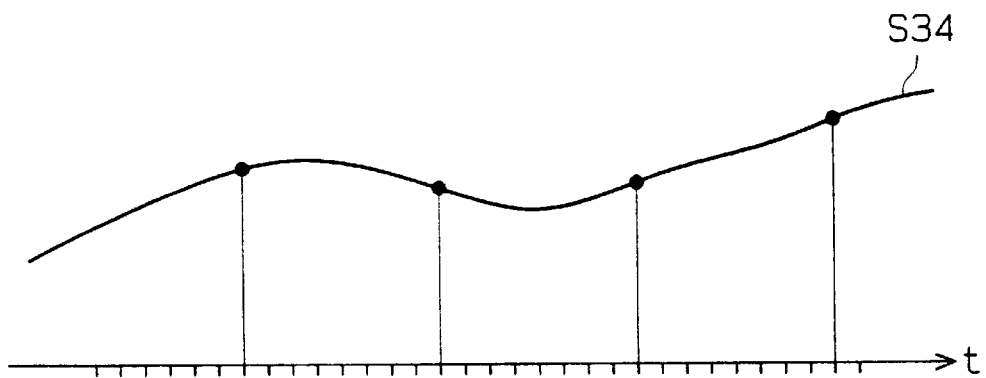
FIG. 34B is a diagram showing intermittent sampling of a first digital data signal associated with the read analog data signal.

The first sampling register 537 intermittently samples the first digital data signal S36 in accordance with the second sampling clock signal (frequency fs/M) from the DPLL 541. FIG. 34B shows the sampling timing of the first sampling register 537. In this fifth embodiment, the first sampling clock signal is frequency-divided by a frequency-dividing ratio M=8, thus yielding the second sampling clock signal. Thus, the first sampling register 537 performs sampling once every time the A/D converter 535 performs sampling eight times. As a result, a thinned first digital data signal S37 is supplied to the second digital filter 538.

The second digital filter 538 is an FIR (Finite Impulse Response) filter. The second digital filter 538 performs digital signal processing (wave equalization and low-pass filtering) on the first digital data signal S37 thinned in accordance with the second sampling clock signal (frequency fs/M) from the DPLL 541, yielding a second filtered digital data signal S38. This digital signal processing removes distortion included in the thinned first digital data signal to shape its waveform and cuts off the high-frequency component of the first digital data signal to produce the second digital data signal S38 having multi-bits (6 bits in this fifth embodiment). As apparent from the above, the first and second digital filters 536 and 538 have simpler structures and smaller circuit areas than an analog filter has. This feature prevents the circuit area of the read channel IC 530 from increasing and ensures the faster operation speed, the higher precision of signal processing and the stable characteristic.

Figure 34C:
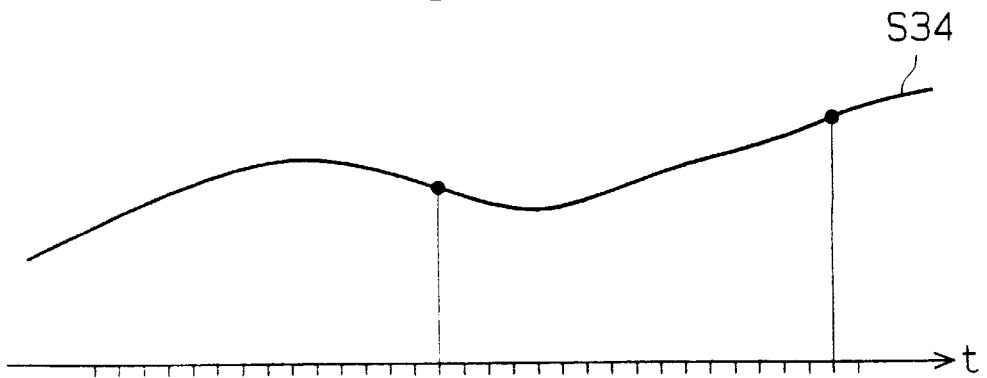
FIG. 34C is a diagram showing intermittent sampling of a second digital data signal associated with the read analog data signal.

The second sampling register 539 intermittently samples the second digital data signal S38 in accordance with the third sampling clock signal (frequency fs/(M×N)) from the DPLL 541. FIG. 34C shows the sampling timing of the second sampling register 539. In this fifth embodiment, the second sampling clock signal is frequency-divided by a frequency-dividing ratio N=2, thus yielding the third sampling clock signal. Thus, the second sampling register 539 performs sampling once every time the first sampling register 537 performs sampling twice (A/D converter 535 executes sampling sixteen times). As a result, a thinned second digital data signal S39 is supplied to the decoder 540. In this manner, the A/D converter 535 samples the read analog data signal S33 at a frequency higher by several tens of times (M·N times) that of the third sampling clock signal.

The decoder 540 receives the second digital data signal S39 and decodes the signal S39 to produce a decoded read data signal. The decoded read data signal is supplied to the signal processor (not shown).

To acquire the optimal sampling point for an analog data signal, the DPLL 541 computes the phase component of the digital data signal after A/D conversion by an arithmetic operation. Based on the computed phase component, approximately the optimal sampling timings of the first and second sampling registers 537 and 539 are set. The DPLL 541 further executes fine adjustment of the frequency fs of the first sampling clock signal to set the optimal sampling timings of the A/D converter 535 and the first and second sampling registers 537 and 539.

The PLL circuit 542 receives a reference signal f0 having a predetermined frequency from an external control device (not shown) and produces a control signal S42 to be supplied to the charge pump 543, in accordance with the reference signal f0. In accordance with the control signal S42, the charge pump 543 produces a control current to be supplied to the DPLL 541.

The DPLL 541 has a pulse inserting/deleting circuit 550 as an adjuster, first and second frequency dividers 551 and 552, a phase difference detector 553, a control circuit 554, an IDAC (Current Output Digital Analog Converter) 555, a loop filter 556 which receives the control current, a VCO (Voltage Controlled Oscillator) 557, and a 1/2 frequency divider 558.

The loop filter 556 has a resistor R1 and a capacitor C1 and produces a voltage signal S56 to be supplied to the VCO 557 as the capacitor C1 charges or discharges in accordance with the control current. In accordance with the voltage signal S56, the VCO 557 produces an oscillation signal having a frequency 2·fs which is to be supplied to the 1/2 frequency divider 558 and the pulse inserting/deleting circuit 550.

The 1/2 frequency divider 558 produces a first sampling signal whose frequency fs is the frequency of the oscillation signal frequency-divided to 1/2, and supplies this sampling signal to the A/D converter 535, the digital filter 536 and the pulse inserting/deleting circuit 550.

Figure 40A:
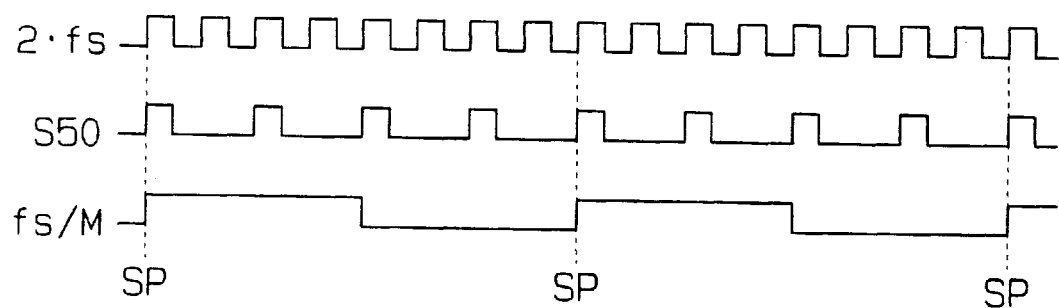
FIG. 40A is a diagram illustrating the generation of a second sampling signal in a normal state.
Figure 40B:
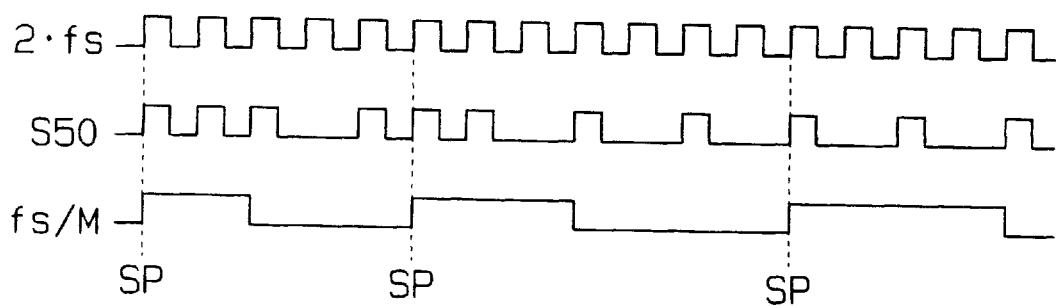
FIG. 40B is a diagram illustrating the generation of a pulse-inserted second sampling signal in a normal state.
Figure 40C:
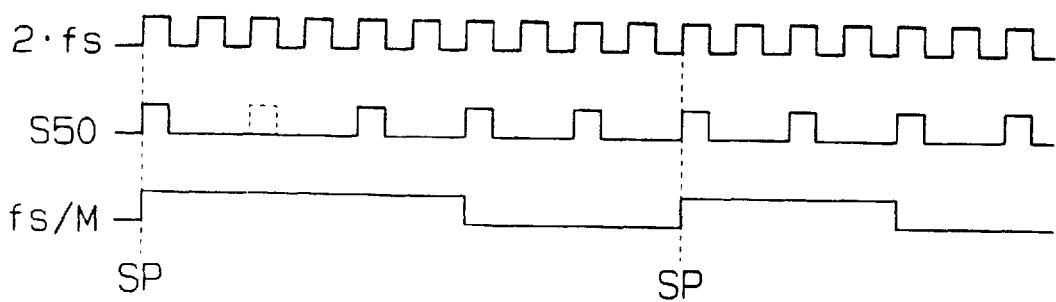
FIG. 40C is a diagram illustrating the generation of a pulse-deleted second sampling signal in a normal state.

The pulse inserting/deleting circuit 550 receives the oscillation signal and the first sampling signal and selectively sends one of three kinds of its output signals to the first frequency divider 551 in accordance with the value (+1, 0 and −1) of a judgment signal S53 which is output from the phase difference detector 553. When the judgment signal S53 has a value of "0", the first sampling signal (frequency fs) is output as a first output signal S50 as shown in FIG. 40A. When the judgment signal S53 has a value of "1", a second output signal S50, which is acquired by inserting (combining) a pulse signal having a frequency 2·fs into the first sampling signal, is produced, as shown in FIG. 40B. When the judgment signal S53 has a value of "−1", a third output signal S50, which is acquired by deleting some pulses from the first sampling signal is produced, as shown in FIG. 40C.

The frequency divider 551 produces a second sampling signal (frequency fs/M) whose frequency is the frequency of one of the first through third output signals S50 divided by M, and supplies this sampling signal to the first sampling register 537, the second digital filter 538, the frequency divider 552 and the phase difference detector 553. The frequency divider 552 produces a third sampling signal (frequency fs/M·N) whose frequency is the frequency of the second sampling signal divided by N, and supplies this sampling signal to the second sampling register 539.

Figure 35:
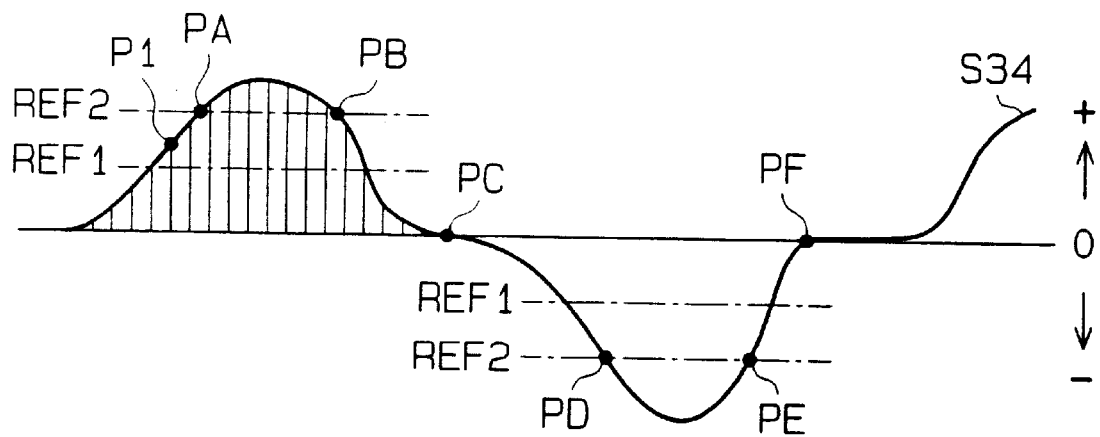
FIG. 35 is a diagram for explaining the estimation of sampling points of a first digital data signal.

The phase difference detector 553 detects a phase difference between an optimal sampling point and a current sampling point of interest. Specifically, the phase difference detector 553 determines whether the phase of the sampling point of interest coincides with, leads or lags from those of predetermined optimal first through sixth sampling points PA, PB, PC, PD, PE and PF, as shown in FIG. 35. The judgment signal S53, indicative of the decision result, is supplied to the pulse inserting/deleting circuit 550 and the control circuit 554.

Figure 33:
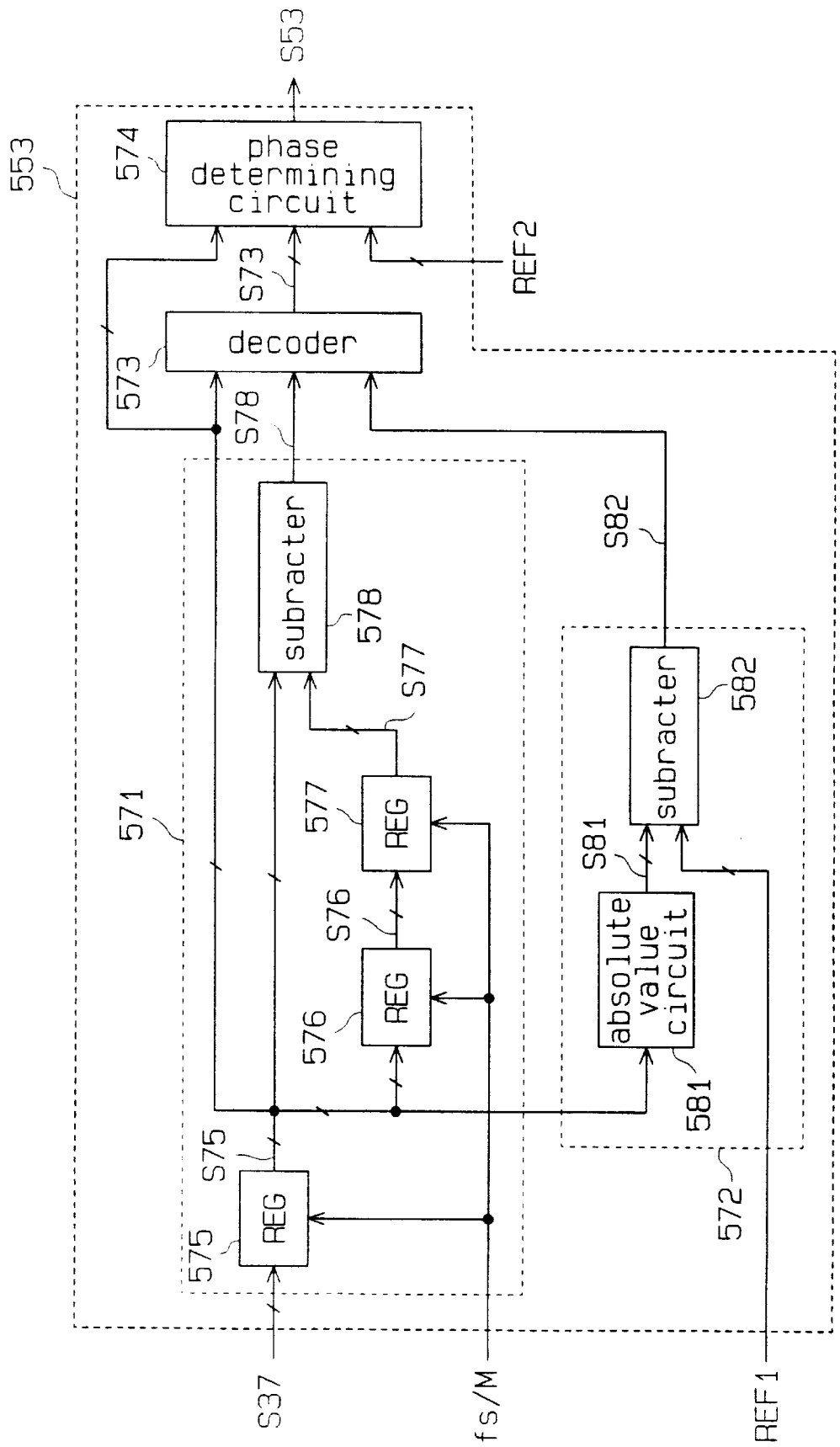
FIG. 33 is a block diagram of a phase difference detector included in a read channel IC which is provided in the recorded data reproducing apparatus.

As shown in FIG. 33, the phase difference detector 553 has an inclination computing circuit 571, a comparator 572, a decoder 573 and a phase determining circuit 574.

Figure 36:
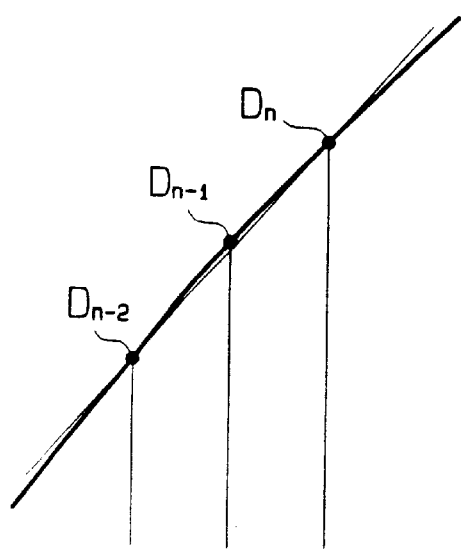
FIG. 36 is a diagram for explaining the computation of the inclination of a wave form of the first digital data signal.

As shown in FIG. 36, the inclination computing circuit 571 computes a difference between the value of the current sampling point of interest $D_n$ and the value of a sampling point, $D_{n-2}$, previous by two to the sampling point $D_n$, to compute the inclination of a wave form of a digital signal at the sampling point of interest. The inclination computing circuit 571 has three registers 575 through 577 and a first subtracter 578. The first register 575 latches the first digital data signal S37 from the first sampling register 537 in accordance with the second sampling signal (frequency fs/M), and supplies a first latched signal S75 to the first subtracter 578, the second register 576, the comparator 572, and the decoder 573. The second register 576 latches the first latched signal S75 from the first register 575, and supplies a second latched signal S76 to the third register 577. The third register 577 latches the second latched signal S76 from the second register 576, and supplies a third latched signal S77 to the first subtracter 578. The first subtracter 578 subtracts the third latched signal S77 from the first latched signal S75 and supplies a first subtraction result signal S78 indicative of the subtraction result $(D_n-D_{n-2})$ to the decoder 573. When the subtraction result is positive (equal to or greater than "0"), the first subtraction result signal S78 indicative of a logic value of "0" is output. When the subtraction result $(D_n-D_{n-2})$ is negative (smaller than "0"), the first subtraction result signal S78 indicative of a logic value of "1" is output.

The comparator 572 has an absolute value circuit 581 and a second subtracter 582. The absolute value circuit 581 acquire s the absolute value of the first latched signal from the first register 575, and supplies an absolute-value signal S81 to the subtracter 582. The subtracter 582 subtracts a first reference value signal REF1 (see FIG. 35) from the absolute-value signal S81 and based on the subtraction result determines if the absolute value is greater than the first reference value. The result of this decision is supplied as a second subtraction result signal S82 to the decoder 573. The first reference value REF1 includes a first value corresponding to the first and second sampling points PA and PB, a second value corresponding to the fourth and fifth sampling points PD and PE, and a third value "0" corresponding to the third and sixth sampling points PC and PF. The first value and the second value have different signs.

When the absolute value is greater than the reference value REF1, the second subtraction result signal S82 indicative of a logic value of "1" is output. When the absolute value is smaller than the reference value REF1, the second subtraction result signal S82 indicative of a logic value of "0" is output.

Based on the sign bits of the first and second subtraction result signals S78 and S82 and the first latched signal (first sampling signal) S75, the decoder 573 estimates the position of the current sampling point of interest (a digital signal value which is sampled by register 539). That is, it is estimated to which one of the predetermined optimal first through sixth sampling points PA, PB, PC, PD, PE and PF the sampling point of interest is closest, as shown in FIG. 35. The estimation result is supplied as an estimation signal S73 to the phase determining circuit 574. The estimation results of the sampling signals will be given below.

| First subtraction result (inclination) | Second subtraction result (decision value) | Sampling point | Estimated point |
|---|---|---|---|
| 0 | 1 | 0 | PA |
| 1 | 1 | 0 | PB |
| 1 | 0 | X (+ or −) | PC |
| 1 | 1 | 1 | PD |
| 0 | 1 | 1 | PE |
| 0 | 0 | X | PF |

Suppose that the digital signal value (point) which is latched by register 539 is P1. As the inclination of the sampling point P1 is positive, the logic value of the first subtraction result signal S78 becomes "0". The absolute value of the sampling point P1 is greater than the first reference value REF1, the logic value of the second subtraction result signal S82 becomes "1". Further, the value of the sampling point P1 is positive, so that its sign is "0". Therefore, the sampling point P1 is predicted to be closest to the first sampling point PA.

The phase determining circuit 574 determines if the digital signal value (point), which is latched by register 539, is sampled by the optimal sampling point corresponding to the second reference value REF2 based on the first latched signal S75, the estimated signal S73 and a second reference value signal REF2. The phase determining circuit 574 further determines if the phase of clock signal (an output of frequency divider 552), which is reproduced from input signal, is coincides with, leads or lags from those of the optimal sampling points. The decision result is output as the judgment signal S53. The second reference value REF2 includes a fourth value corresponding to the first and second sampling points PA and PB, a fifth value corresponding to the fourth and fifth sampling points PD and PE, and a sixth value "0" corresponding to the third and sixth sampling points PC and PF. The fourth value and the fifth value have different signs.

The phase determining circuit 574 selects the value corresponding to the estimated sampling point (the sampling point of interest) from the fourth through sixth values of the second reference value REF2 in accordance with the estimated signal S73. The phase determining circuit 574 subtracts the selected value (the second reference value REF2) from the value of the first latched signal S75. Based on the subtraction result, the circuit 574 determines if the phase of the sampling clock (the phase of the output clock of the frequency divider 552) coincides with, leads or lags those of the optimal sampling points. The following table shows the results of the phase discrimination.

| Phase determination | | PA | PB | PC | PD | PE | PF |
|---|---|---|---|---|---|---|---|
| S75 − REF2 | + | lag | lead | lead | lead | lag | lag |
| | 0 | match | match | match | match | match | match |
| | − | lead | lag | lag | lag | lead | lead |

Referring to FIG. 35, for example, the fourth value (second reference value REF2) selected in association with the first optimal sampling point PA is subtracted from the sampling point P1. In this case, the subtraction result becomes negative and the phase of the sampling point P1 is determined to be leading the first sampling point PA. When the phase of the estimated sampling point is sampled with optimal timing, the value of the judgment signal S53 becomes "0". When the phase of the estimated sampling point leads that of the optimal sampling point, the value of the judgment signal S53 becomes "−1". When the phase of the estimated sampling point lags from that of the optimal sampling point, the value of the judgment signal S53 becomes "+1".

The control circuit 554 produces a control signal S54 to be supplied to the IDAC 555 in accordance with the judgment signal S53. The IDAC 555 discharges the control current to the loop filter 556 or charges the control current from the loop filter 556 in accordance with the control signal S54.

The operation of the read channel IC 530 will now be described. The read head 531 reads out analog data recorded on the magnetic disk 529, and the amplifier 532 amplifies the analog data. The AGC 533 supplies the analog data signal S33 having a predetermined level to the analog filter 534, which supplies the filtered read analog signal S34 to the A/D converter 535.

The A/D converter 535 samples the analog data signal S34 in accordance with the first sampling clock signal (frequency fs) to convert the signal S34 to the digital data signal S35. The first digital filter 536 executes digital signal processing on the digital data signal S35 according to the first sampling clock signal and outputs the first filtered digital data signal S36 having a plurality of bits. The first sampling register 537 intermittently samples the first filtered digital data signal S36 according to the second sampling clock signal (frequency fs/M), and outputs the thinned first digital data signal S37.

The second digital filter 538 performs digital signal processing on the thinned first digital data signal S37 in accordance with the second sampling clock signal, and outputs the multi-bit second filtered digital data signal S38 whose high frequency component has been removed. The second sampling register 539 intermittently samples the second filtered digital data signal S38 according to the third sampling clock signal (frequency fs/M·N), and outputs the thinned second digital data signal. The decoder 540 decodes the second digital data signal and supplies the decoded read data signal to the signal processor (not shown) at the subsequent stage.

Figure 37:
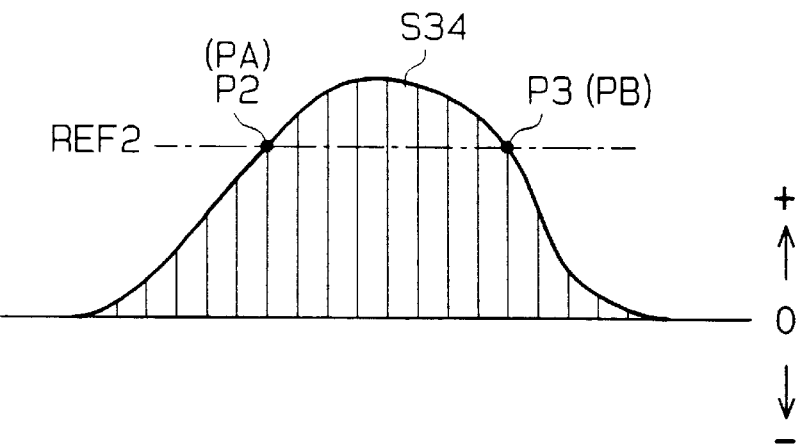
FIG. 37 is a diagram showing sampling when there is no phase difference between a sampling point of interest and the optimal sampling point.

A description will be now given of the operation of adjusting the sampling point of the first filtered digital data signal S36 to be sampled by the first sampling register 537. As shown in FIG. 37, P2 is the current sampling point of interest and this sampling point P2 is estimated to match with the first optimal sampling point PA. In this case, the difference between the value of the sampling point P2 and the second reference value REF2 is "0", so that as seen from the aforementioned table, it is determined that the phase of the sampling point P2 matches with that of the first sampling point PA. Accordingly, the phase difference detector 553 outputs the judgment signal S53 of "0". In accordance with this judgment signal S53, the pulse inserting/deleting circuit 550 outputs the first output signal S50 having the frequency fs as shown in FIG. 40A. The first frequency divider 551 outputs the second sampling clock signal having the frequency fs/M in accordance with the first output signal S50. In FIG. 40A, SP indicates the sampling point for the second sampling clock signal. As shown in FIG. 37, therefore, the sampling point is kept at the normal state and the next sampling point P3 of interest matches with the second optimal sampling point PB.

Figure 38:
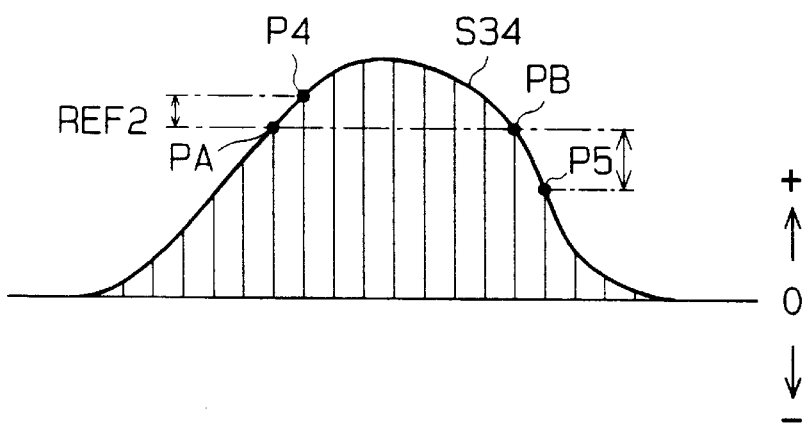
FIG. 38 is a diagram showing sampling when the phase of a sampling point of interest lags from that of the optimal sampling point.

It is assumed now that P4 is the current sampling point of interest, which is estimated to be close to the first sampling point PA as shown in FIG. 38. In this case, the difference between the value of the sampling point P4 and the reference value REF2 is "+" so that the phase of the sampling point P4 is determined to be lagging from the phase of the first sampling point PA. Accordingly, the phase difference detector 553 outputs the judgment signal S53 of "+1". While the judgment signal S53 is being output, the pulse inserting/deleting circuit 550 outputs the second output signal which is acquired by inserting the frequency signal 2fs into the frequency signal fs as shown in FIG. 40B. The sampling point SP for the second sampling clock signal according to this second output signal leads the sampling point SP in the normal state (FIG. 40A). Consequently, as shown in FIG. 38, the next sampling point P5 of interest is changed to the second optimal sampling point PB.

Figure 39:
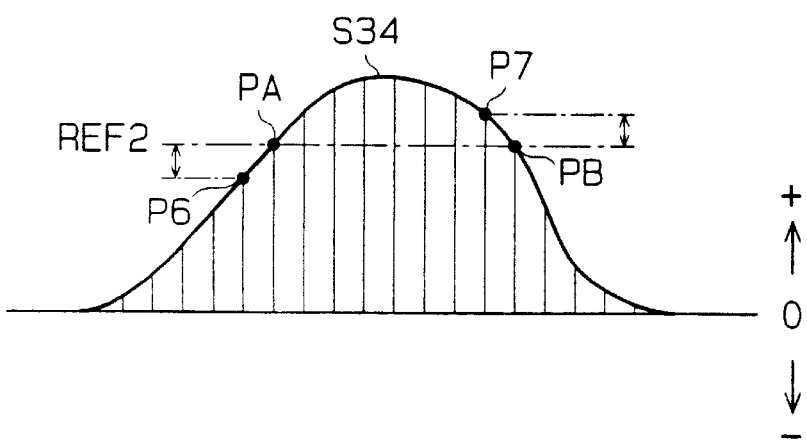
FIG. 39 is a diagram showing sampling when the phase of a sampling point of interest leads that of the optimal sampling point.

Further, it is assumed that P6 is the current sampling point of interest, which is estimated to be close to the first sampling point PA as shown in FIG. 39. In this case, the difference between the value of the sampling point P6 and the reference value REF2 is "−" so that the phase of the sampling point P6 is determined to be leading the phase of the first sampling point PA. Accordingly, the phase difference detector 553 outputs the judgment signal S53 of "−1". While the judgment signal S53 is being output, the pulse inserting/deleting circuit 550 outputs the third output signal which is acquired by deleting some pulse from the frequency signal fs as indicated by the broken line in FIG. 40C. The sampling point SP for the second sampling clock signal, according to this third output signal, lags from the sampling point SP in the normal state. Consequently, as shown in FIG. 39, the next sampling point P7 of interest is changed to the second optimal sampling point PB. The generation of the pulse-inserted or pulse-deleted second sampling clock signal according to the phase determination allows the first sampling register 537 to adjust the sampling point.

After the sampling point of interest is changed to the optimal sampling point, the control circuit 554 outputs the control signal S54 in accordance with the judgment signal S53 from the phase difference detector 553. The IDAC 555 push-pulls the control current to the loop filter 556 and controls a control voltage of VCO 557 to finely adjust the voltage signal S56. The VCO 557 finely adjusts the frequency 2·fs of the oscillation signal (i.e., the frequency fs of the first sampling signal) in accordance with the finely-adjusted voltage signal S56. This fine adjustment permits the VCO 557 to produce the oscillation signal having a narrow frequency band, with the result that the fast and stable VCO 557 can be easily obtained.

Although only five embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. A signal processor suitable for processing a user data signal, associated with data information read from a recording medium, and a servo data signal associated with servo information read from said recording medium, said signal processor comprising:

A) a user data signal processing circuit for processing said user data signal, said user data signal processing circuit includes, A1) a first amplifier for amplifying said user data signal to produce an amplified user data signal, and A2) a first filter, connected to said first amplifier, for cutting off an unnecessary frequency component included in said amplified user data signal to produce a filtered amplified user data signal; and B) a servo data signal processing circuit for processing said servo data signal, said servo data signal processing circuit includes, B1) a second amplifier for amplifying said servo data signal to produce an amplified servo data signal, and B2) a second filter, connected to said second amplifier, for cutting off an unnecessary frequency component included in said amplified servo data signal to produce a filtered amplified servo data signal.

2. The signal processor according to claim 1, wherein said user data signal has a high frequency characteristic, said first amplifier amplifies said user data signal in such a way as to emphasize the high frequency characteristic of said user data signal, said servo data signal has a low frequency characteristic, and said second amplifier amplifies said servo data signal in such a way as to emphasize the low frequency characteristic of said servo data signal.

3. The signal processor according to claim 2, wherein said first filter cuts off a frequency component higher than the high frequency characteristic of said amplified user data signal, and said second filter cuts off a frequency component higher than said low frequency characteristic of the amplified servo data signal.

4. An integrating circuit for acquiring plural pieces of position data in order to obtain relative positions between tracks to which servo areas provided on a recording medium belong and a drive head moving over said recording medium, each servo area including a plurality of position areas where said position data are respectively recorded, said integrating circuit comprising:

a rectifier for rectifying position data signals read from said position areas to produce rectified position data signals;

a voltage-current converter, connected to said rectifier, for producing charge currents having current values proportional to voltage levels of said respective rectified position data signals;

a main capacitor, connected to said voltage-current converter, for performing charging with said charge currents;

a main charge switch connected between said voltage-current converter and said main capacitor, and operable in such a way as to permit each of said charge currents to be supplied to said main capacitor when each charge current is generated;

a main discharge switch, connected to said main capacitor, for permitting charges, stored in said main capacitor, to be discharged after said main capacitor has performed a charging operation;

a plurality of detection capacitors, connected to said voltage-current converter, for performing charging with charge voltages respectively associated with said position areas, in cooperation with said main capacitor, said charge voltages of said detection capacitors respectively indicating said plural pieces of position data;

a plurality of subcharge switches respectively connected between said voltage-current converter and said detection capacitors and operable in such a way as to permit supply of said associated charge currents to said main capacitor when said charge currents are produced; and a plurality of subdischarge switches, respectively connected to said plurality of subcharge switches, for permitting charges stored in said detection capacitors to be discharged after execution of charging operations of said associated detection capacitors.

5. A signal processor suitable for processing a user data signal associated with data information read from a plurality of data areas provided on a recording medium and a servo data signal associated with servo information read from a plurality of servo areas provided on said recording medium, each of said data areas and each of said servo areas forming a sector, each servo area having a plurality of position areas where plural pieces of position data included in said servo information are recorded, and a servo mark area where a servo mark included in said servo information is recorded, each position data being used to acquire a relative position between a track including a sector to which an associated servo area belongs and a drive head moving over said recording medium, said servo mark indicating a start of each sector, said servo data signal including a plurality of position data signals respectively associated with said plural pieces of position data and a servo mark signal associated with said servo mark, said signal processor comprising:

A) a user data signal processing circuit for processing said user data signal, said user data signal processing circuit including, A1) a first amplifier for amplifying said user data signal to produce an amplified user data signal, and A2) a first filter, connected to said first amplifier, for cutting off an unnecessary frequency component included in said amplified user data signal to produce a filtered amplified user data signal; and B) a servo data signal processing circuit for processing said servo data signal, said servo data signal processing circuit including, B1) a second amplifier for amplifying said servo data signal to produce an amplified servo data signal, B2) a second filter, connected to said second amplifier, for cutting off an unnecessary frequency component included in said amplified servo data signal to produce a filtered amplified servo data signal, B3) a peak detector, connected to said second filter, for detecting a peak value of said servo mark signal included in said servo data signal to generate a peak signal, wherein an external device generates strobe signals indicative of read timings of said individual position data in accordance with said peak signal, B4) a zero-cross detector, connected to said second filter, for receiving each position data signal included in said servo data signal and producing a clock signal, B5) a rectifier, connected to said second filter, for rectifying said position data signals to produce rectified position data signals;

B6) a voltage-current converter, connected to said rectifier, for producing charge currents having current values proportional to voltage levels of said respective rectified position data signals;

B7) a main capacitor, connected to said voltage-current converter, for performing charging with said charge currents;

B8) a main charge switch connected between said voltage-current converter and said main capacitor, B9) a main discharge switch connected to said main capacitor, B10) a plurality of detection capacitors, connected to said voltage-current converter, for performing charging with charge currents respectively associated with said position areas, in cooperation with said main capacitor, charge voltages of said detection capacitors being equivalent to integral values respectively indicating said plural pieces of position data;

B11) a plurality of subcharge switches respectively connected between said voltage-current converter and said detection capacitors, B12) a plurality of subdischarge switches, respectively connected to said detection capacitors, and B13) a control circuit, connected to said main charge switch, said main discharge switch, said subcharge switches and said subdischarge switches, and responsive to said strobe signals and said clock signal, wherein said control circuit controls said main charge switch in response to said strobe signals in such a way as to permit supply of said charge currents to said main capacitor, controls said main discharge switch in such a way as to permit discharging of charges stored in said main capacitor after charging of said main capacitor has been performed, controls said subcharge switches in response to said strobe signals and said clock signal in such a way as to permit supply of said associated charge currents to said detection capacitors respectively, and controls said subdischarge switches in such a way as to permit discharging of charges stored in said detection capacitors after execution of charging of said detection capacitors.

6. The signal processor according to claim 5, wherein said detection capacitors are connected in parallel to said main capacitor and have capacitances smaller than that of said main capacitor.

7. The signal processor according to claim 5, wherein said control circuit switches on said subcharge switches upon each reception of said strobe signals, in such a way as to permit supply of said associated charge currents to said detection capacitors within a half period of said clock signal, counts a charge time of each of said detection capacitor in accordance with said clock signal, and switches off an associated one of said subcharge switches when a count value reaches a predetermined value.

8. The signal processor according to claim 7, wherein when said count value does not reach said predetermined value due to a failure of generation of a clock signal by said zero-cross detector, said control circuit outputs an abnormal signal and switches off an associated one of said subcharge switches.

9. An apparatus comprising:

an intergrated circuit device having a signal processor processing a user data signal and a servo data signal, said signal processor comprising:

a user data signal processing circuit processing the user data signal, said user data signal processing circuit including an amplifier to produce an amplified user data signal, and a filter connected to the amplifier, cutting off an unnecessary frequency component included in the amplified user data signal to produce a filtered amplified user data signal; and a servo data signal processing circuit processing the servo data signal, said servo data signal processing circuit including an amplifier to produce an amplified servo data signal, and a filter connected to the amplifier, cutting off an unnecessary frequency component included in the amplified servo data signal to produce a filtered amplified servo data signal.

10. An apparatus according to claim 9, wherein said user data signal has a high frequency characteristic, the amplifier in the user data signal processing circuit amplifies said user data signal to emphasize the high frequency characteristic of said user data signal, said servo data signal has a low frequency characteristic, and the amplifier in the servo data signal processing circuit amplifies said servo data signal to emphasize the low frequency characteristic of said servo data signal.

11. An apparatus according to claim 10, wherein the filter in the user data signal processing circuit cuts off a frequency component higher than the high frequency characteristic of said amplified user data signal, and the filter in the servo data signal processing circuit cuts off a frequency component higher than said low frequency characteristic of the amplified servo data signal.

* * * * *

UNITED STATES PATENT AND TRADEMARK OFFICE
CERTIFICATE OF CORRECTION

PATENT NO.     : 6,377,416 B1
DATED          : April 23, 2002
INVENTOR(S)    : Kazuyoshi Kikuta It is certified that error appears in the above-identified patent and that said Letters Patent is hereby corrected as shown below:

<u>Title page,</u>
Item [30], Foreign Application Priority Data, please insert the following foreign applications which were omitted from the front of the patent:
-- September 29, 1995   (JP)   7-254169
September 29, 1995      (JP)   7-254172
June 11, 1996           (JP)   8-149580 --

Signed and Sealed this

Twelfth Day of November, 2002

*Attest:*

JAMES E. ROGAN
*Attesting Officer*   *Director of the United States Patent and Trademark Office*